(12) United States Patent
Miyake et al.

(10) Patent No.: US 10,423,254 B2
(45) Date of Patent: Sep. 24, 2019

(54) SEMICONDUCTOR DEVICE AND DISPLAY DEVICE HAVING SEMICONDUCTOR DEVICE

(71) Applicant: SEMICONDUCTOR ENERGY LABORATORY CO., LTD., Atsugi-shi, Kanagawa-ken (JP)

(72) Inventors: Hiroyuki Miyake, Tochigi (JP);
Hideaki Shishido, Kanagawa (JP);
Susumu Kawashima, Kanagawa (JP);
Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 456 days.

(21) Appl. No.: 15/159,020

(22) Filed: May 19, 2016

(65) Prior Publication Data
US 2016/0349904 A1    Dec. 1, 2016

(30) Foreign Application Priority Data

May 29, 2015    (JP) .................. 2015-110423

(51) Int. Cl.
*G09G 3/30*    (2006.01)
*G06F 3/041*   (2006.01)
*H01L 27/12*   (2006.01)
*G06F 3/044*   (2006.01)

(52) U.S. Cl.
CPC .......... *G06F 3/0412* (2013.01); *G06F 3/044* (2013.01); *H01L 27/1225* (2013.01); *G06F 2203/04102* (2013.01); *G06F 2203/04103* (2013.01)

(58) Field of Classification Search
None
See application file for complete search history.

(56) References Cited

U.S. PATENT DOCUMENTS

| | | | |
|---|---|---|---|
| 6,528,951 B2 | 3/2003 | Yamazaki et al. | |
| 6,580,657 B2 | 6/2003 | Sanford et al. | |
| 6,777,712 B2 | 8/2004 | Sanford et al. | |
| 7,221,338 B2 | 5/2007 | Yamazaki et al. | |
| 7,245,297 B2 | 7/2007 | Kimura et al. | |
| 7,601,984 B2 | 10/2009 | Sano et al. | |
| 8,487,844 B2 | 7/2013 | Koyama | |
| 2004/0164819 A1* | 8/2004 | Mishima ............... | H01G 4/33 333/174 |

(Continued)

FOREIGN PATENT DOCUMENTS

| | | |
|---|---|---|
| CN | 001543637 A | 11/2004 |
| EP | 1732058 A | 12/2006 |

(Continued)

*Primary Examiner* — Carl Adams
(74) *Attorney, Agent, or Firm* — Nixon Peabody LLP; Jeffrey L. Costellia

(57) ABSTRACT

A semiconductor device including a transistor includes a pixel circuit, a monitor circuit, and a correction circuit. The pixel circuit includes a selection transistor, a driving transistor, and a light-emitting element. The monitor circuit includes a monitor light-emitting element and a monitor transistor. The semiconductor device obtains the value of current flowing to the monitor light-emitting element and the monitor transistor and controls the value of current flowing to the light-emitting element and the driving transistor by the correction circuit.

11 Claims, 57 Drawing Sheets

(56) References Cited

U.S. PATENT DOCUMENTS

| | | | | |
|---|---|---|---|---|
| 2007/0080908 A1* | 4/2007 | Nathan | ............... | G09G 3/3241 |
| | | | | 345/77 |
| 2007/0085093 A1* | 4/2007 | Ohmae | .................. | C30B 23/04 |
| | | | | 257/89 |
| 2013/0093706 A1* | 4/2013 | Kurasawa | ............. | G06F 3/0412 |
| | | | | 345/173 |
| 2014/0111444 A1* | 4/2014 | Lindfors | ................. | G06F 3/041 |
| | | | | 345/173 |
| 2015/0255518 A1* | 9/2015 | Watanabe | .......... | H01L 27/1225 |
| | | | | 257/40 |
| 2016/0190331 A1 | 6/2016 | Miyake et al. | | |
| 2016/0349904 A1* | 12/2016 | Miyake | .............. | H01L 27/1225 |
| 2017/0346005 A1* | 11/2017 | Goux | ................... | H01L 45/146 |

FOREIGN PATENT DOCUMENTS

| | | |
|---|---|---|
| JP | 2006-165529 | 6/2006 |
| JP | 2012-078798 | 4/2012 |
| WO | WO-2002/054373 | 7/2002 |

\* cited by examiner

FIG. 28A
FIG. 28B
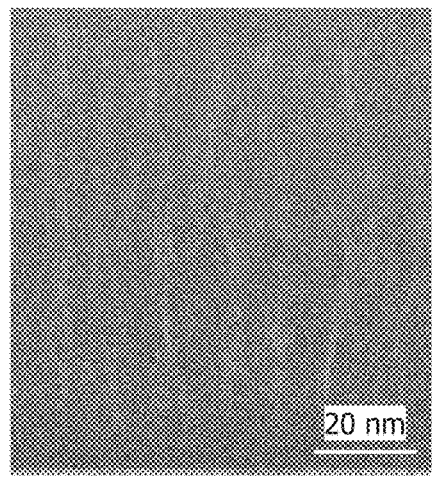
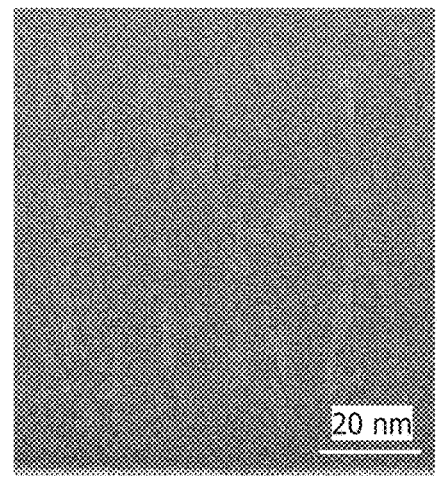

SEMICONDUCTOR DEVICE AND DISPLAY DEVICE HAVING SEMICONDUCTOR DEVICE

BACKGROUND OF THE INVENTION

1. Field of the Invention

One embodiment of the present invention relates to a semiconductor device including an oxide semiconductor film and a display device including the semiconductor device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. In particular, one embodiment of the present invention relates to a semiconductor device, a display device including an electroluminescence element (hereinafter also referred to as an EL display device), a liquid crystal display device, a light-emitting device, a power storage device, a memory device, an imaging device, a method for driving them, or a method for manufacturing them.

2. Description of the Related Art

Attention has been focused on a technique for forming a transistor using a semiconductor thin film formed over a substrate having an insulating surface (also referred to as a field-effect transistor (FET) or a thin film transistor (TFT)). Such transistors are used in a wide range of electronic devices such as an integrated circuit (IC) and an image display device (display device). A semiconductor material typified by silicon is widely known as a material for a semiconductor thin film that can be used for a transistor. As another material, an oxide semiconductor has been attracting attention (e.g., Patent Document 1).

In addition, a configuration in which a monitor circuit is provided to correct a characteristic change due to ambient temperature of a transistor including an oxide semiconductor and a light-emitting element provided in each pixel of an EL display device (hereinafter the ambient temperature is referred to as environmental temperature) is disclosed. The monitor circuit is provided outside a pixel portion and corrects the potential of a cathode of the light-emitting element in accordance with the environment temperature (e.g., Patent Document 2).

REFERENCE

Patent Document

[Patent Document 1] Japanese Published Patent Application No. 2006-165529
[Patent Document 2] Japanese Published Patent Application No. 2012-078798

SUMMARY OF THE INVENTION

As shown in Patent Document 2, a light-emitting element has properties in which its resistance value (internal resistance value) is changed in accordance with an environmental temperature. Specifically, when the room temperature is regarded as a normal temperature and the temperature is higher than normal, the resistance decreases, while when the temperature is lower than normal, the resistance increases. Therefore, current-voltage characteristics of the light-emitting element are changed in accordance with environmental temperature. Specifically, when the temperature rises, the value of current of the light-emitting element is increased and the luminance becomes higher than desired. When the temperature decreases and the same voltage is applied, the value of current of the light-emitting element is reduced and the luminance of the light-emitting element becomes lower than desired. Thus, the luminance of the light-emitting element might vary because of change in the value of current flowing to the light-emitting element, which is caused by change in environmental temperature.

In view of the above problem, an object of one embodiment of the present invention is to suppress luminance variation due to change in the value of current flowing to a light-emitting element, which is caused by change in environmental temperature. Another object of one embodiment of the present invention is to provide a novel semiconductor device. Another object of one embodiment of the present invention is to provide a novel display device.

Note that the description of the above object does not disturb the existence of other objects. In one embodiment of the present invention, there is no need to achieve all the objects. Other objects are apparent from and can be derived from the description of the specification and the like.

One embodiment of the present invention is a semiconductor device including a transistor. The semiconductor device includes a pixel circuit, a monitor circuit, and a correction circuit. The pixel circuit includes a selection transistor, a driving transistor, and a light-emitting element. The monitor circuit includes a monitor light-emitting element and a monitor transistor. The semiconductor device obtains the value of current flowing to the monitor light-emitting element and the monitor transistor and controls the value of current flowing to the light-emitting element and the driving transistor by the correction circuit. Specifics are described below.

One embodiment of the present invention is a semiconductor device including a transistor. The semiconductor device includes a pixel circuit, a monitor circuit, a correction circuit, a first electrode, a second electrode, and a third electrode. The pixel circuit includes a selection transistor, a driving transistor, and a light-emitting element. The monitor circuit includes a monitor light-emitting element and a monitor transistor. The correction circuit includes an amplifier circuit and a switching element. One of a pair of electrodes of the monitor light-emitting element is electrically connected to the first electrode. The other of the pair of electrodes of the monitor light-emitting element is electrically connected to one of source and drain electrodes of the monitor transistor. The other of the source and drain electrodes of the monitor transistor is electrically connected to a first input terminal of the amplifier circuit. A gate electrode of the monitor transistor is electrically connected to an output terminal of the amplifier circuit. The second electrode is electrically connected to a second input terminal of the amplifier circuit. The third electrode is electrically connected to the other of the source and drain electrodes of the monitor transistor through the switching element. A resistor is connected between the third electrode and the other of the source and drain electrodes of the monitor transistor. Current flowing to the light-emitting element is controlled by the correction circuit.

In the above embodiment, it is preferable that the resistor be provided outside a wiring through which the other of the source and drain electrodes of the monitor transistor and the first input terminal of the amplifier circuit are connected to each other. Moreover, in the above embodiment, it is preferable that the resistor include an oxide conductor.

In the above embodiment, it is preferable that the selection transistor, the driving transistor, and the monitor transistor each include an oxide semiconductor in a channel region.

In the above embodiment, it is preferable that the oxide conductor and the oxide semiconductor contain at least one common metal element. In any one of the above embodiments, it is preferable that one or both of the oxide conductor and the oxide semiconductor contain In, Zn, and M (M is Ti, Ga, Y, Zr, La, Ce, Nd, Sn, or Hf). Moreover, in any one of the above embodiments, it is preferable that one or both of the oxide conductor and the oxide semiconductor include a crystal part and that the crystal part have c-axis alignment.

Another embodiment of the present invention is a display device including the semiconductor device according to any one of the above embodiments, and a color filter. Another embodiment of the present invention is a display module including the display device and a touch sensor. Another embodiment of the present invention is an electronic device including the semiconductor device according to any one of the above embodiments, the display device, or the display module; and an operation key or a battery.

According to one embodiment of the present invention, luminance variation due to change in the value of current flowing to a light-emitting element, which is caused by change in environmental temperature, can be suppressed. According to one embodiment of the present invention, a novel semiconductor device can be provided. According to one embodiment of the present invention, a novel display device can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 28A and 28B show cross-sectional TEM images of an a-like OS.

DETAILED DESCRIPTION OF THE INVENTION

Figure 1:
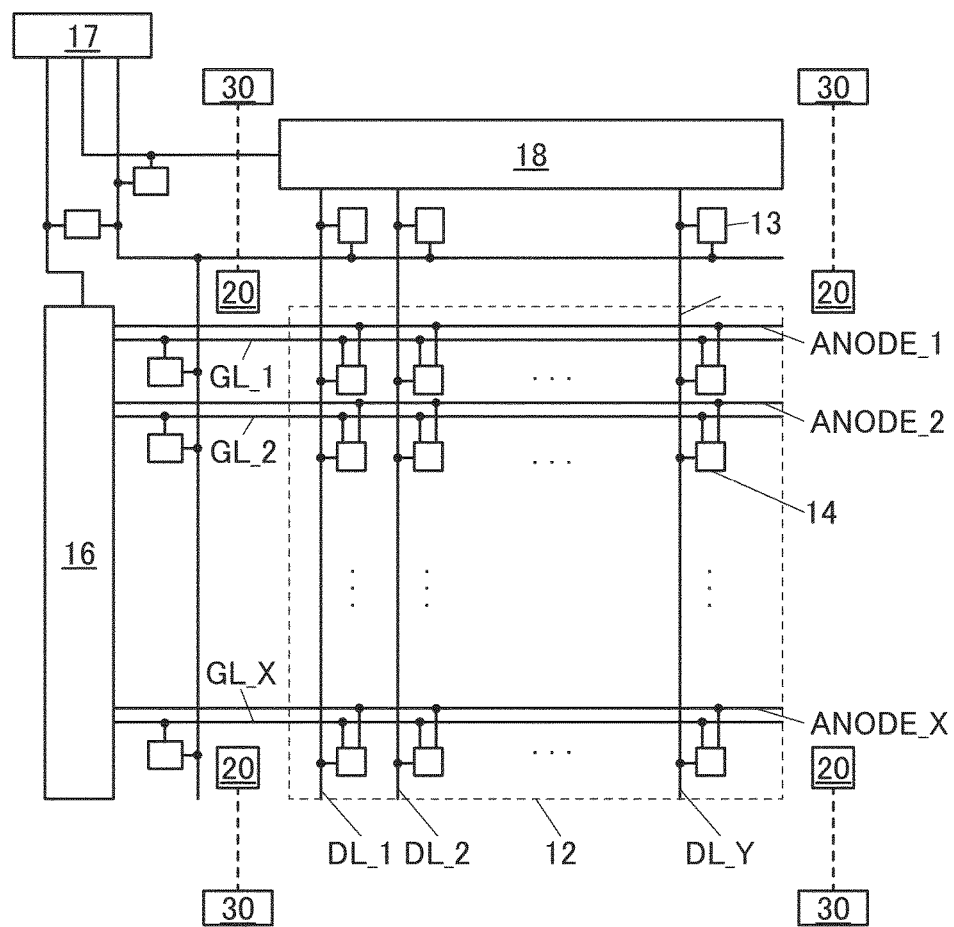
FIG. 1 is a block diagram illustrating one embodiment of a semiconductor device.

Embodiments and examples will be described below with reference to drawings. However, the embodiments and examples can be implemented with various modes. It will be readily appreciated by those skilled in the art that modes and details can be changed in various ways without departing from the spirit and scope of the present invention. Thus, the present invention should not be interpreted as being limited to the following description of the embodiments and examples.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to the shapes or values shown in the drawings. In the drawings, the same portions or portions having similar functions are denoted by the same reference numerals in different drawings, and explanation thereof will not be repeated. Furthermore, the same hatching pattern is used for portions having similar functions, and the portions are not especially denoted by reference numerals in some cases.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

Note that in this specification, terms for describing arrangement, such as "over", "above", "under", and "below", are used for convenience in describing a positional relation between components with reference to drawings. Further, the positional relation between components is changed as appropriate in accordance with a direction in which each component is described. Thus, the positional relation is not limited to that described with a term used in this specification and can be explained with another term as appropriate depending on the situation.

The "semiconductor device" in this specification and the like means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that in this specification and the like, a silicon oxynitride film refers to a film in which the proportion of oxygen is higher than that of nitrogen. The silicon oxynitride film preferably contains oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen at concentration ranging from 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. The term "substantially parallel" indicates that the angle formed between two straight lines is greater than or equal to $-30°$ and less than or equal to $30°$. The term "perpendicular" indicates that the angle formed between two straight lines is greater than or equal to $80°$ and less than or equal to $100°$, and accordingly also includes the case where the angle is greater than or equal to $85°$ and less than or equal to $95°$. The term "substantially perpendicular" indicates that the angle formed between two straight lines is greater than or equal to $60°$ and less than or equal to $120°$.

Note that in this specification and the like, when it is explicitly described that X and Y are connected, the case where X and Y are electrically connected, the case where X and Y are functionally connected, and the case where X and Y are directly connected are included therein. Accordingly, a connection relation other than the predetermined connection relation, for example, a connection relation other than that shown in drawings and texts, is also allowed.

Here, X and Y are each assumed to be an object (e.g., a device, an element, a circuit, a wiring, an electrode, a terminal, a conductive film, or the like).

For example, in the case where X and Y are electrically connected, one or more elements that enable electrical connection between X and Y (e.g., a switch, a transistor, a capacitor, an inductor, a resistor, a diode, a display element, a light-emitting element, and/or a load) can be connected between X and Y. A switch has a function of being controlled to be on or off. That is, a switch is conducting (on state) or not conducting (off state) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up converter, or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. When a signal output from X is transmitted to Y, it can be said that X and Y are functionally connected even if another circuit is provided between X and Y.

Note that when it is explicitly described that X and Y are connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that "X and Y are electrically connected", the description is the same as the case where it is explicitly only described that "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, or the like).

Embodiment 1

In this embodiment, an example of a semiconductor device of one embodiment of the present invention will be described with reference to FIG. 1, FIG. 2, FIG. 3, FIG. 4, FIG. 5, FIG. 6, FIGS. 7A and 7B, FIG. 8, FIG. 9, FIGS. 10A and 10B, FIGS. 11A and 11B, FIG. 12, and FIG. 13.

<1-1. Semiconductor Device>

FIG. 1 is a block diagram showing an example of a semiconductor device of one embodiment of the present invention.

A semiconductor device illustrated in FIG. 1 includes a pixel portion 12, a gate line driver circuit 16 provided outside the pixel portion 12, a signal line driver circuit 18 provided outside the pixel portion 12, a monitor circuit 20 provided outside the pixel portion 12, and a correction circuit 30 electrically connected to the monitor circuit 20. Note that the pixel portion 12 includes a plurality of pixel circuits 14.

A semiconductor device illustrated in FIG. 1 includes a terminal portion 17 and a protection circuit 13. Note that the terminal portion 17 and the protection circuit 13 are not necessarily provided.

[Pixel Portion and Pixel Circuit]

The pixel portion 12 includes a plurality of circuits (pixel circuits 14) for driving display elements arranged in X rows (X is a natural number of 2 or more) and Y columns (Y is a natural number of 2 or more). The gate line driver circuit 16 has a function of outputting a signal (a scan signal) for selecting the pixel circuit 14. The signal line driver circuit 18 has a function of supplying a signal (a data signal) for driving a display element in the pixel circuit 14.

Note that the configuration is not limited to the example in FIG. 1, in which the plurality of pixel circuits 14 are arranged in a matrix (a stripe arrangement); for example, delta arrangement or pentile arrangement may be employed for the pixel circuits 14. Further, as color elements controlled in the pixel circuits 14 at the time of color display, three colors of R (red), G (green), and B (blue) can be given. Note that color elements controlled in the pixel circuits 14 at the time of color display are not limited to such colors, and color elements of more than three colors may be employed, for example, R, G, B, and W (white); or R, G, B, and one or more of Y (yellow), C (cyan), M (magenta), and the like. Further, the size of a display region may be different depending on respective dots of the color elements.

The plurality of pixel circuits 14 each include a light-emitting element and a driving transistor for controlling the amount of current flowing to the light-emitting element. In the light-emitting element, by application of voltage to the light-emitting element, electrons are injected from one of a pair of electrodes included in the light-emitting element and holes are injected from the other of the pair of electrodes, into a layer containing a light-emitting organic compound; thus, current flows. The electrons and holes are recombined; thus, the light-emitting organic compound is excited. The light-emitting organic compound returns to a ground state from the excited state, thereby emitting light. Based on such a mechanism, such a light-emitting element is referred to as a current-excitation type light-emitting element.

[Gate Line Driver Circuit and Signal Line Driver Circuit]

One or both of the gate line driver circuit 16 and the signal line driver circuit 18 are preferably formed over the substrate over which the pixel portion 12 is formed. Thus, the number of components and the number of terminals can be reduced. When one or both of the gate line driver circuit 16 and the signal line driver circuit 18 are not formed over the substrate over which the pixel portion 12 is formed, one or both of the gate line driver circuit 16 and the signal line driver circuit 18 can be mounted by chip-on glass (COG) or tape automated bonding (TAB).

A pulse signal and a data signal are input to each of the plurality of pixel circuits 14 through one of the plurality of scan lines GL supplied with scan signals and one of the plurality of data lines DL supplied with data signals, respectively. Writing and holding of the data signal to and in each of the plurality of pixel circuits 14 are controlled by the gate line driver circuit 16. For example, to the pixel circuit 14 in the m-th row and the n-th column (m is a natural number of less than or equal to X, and n is a natural number of less than or equal to Y), a pulse signal is input from the gate line driver circuit 16 through the scan line GL_m, and a data signal is input from the signal line driver circuit 18 through the data line DL_n in accordance with the potential of the scan line GL_m.

The gate line driver circuit 16 includes a shift register or the like. The gate line driver circuit 16 receives a signal for driving the shift register through the terminal portion 17 and outputs a signal. For example, the gate line driver circuit 16 receives a start pulse signal, a clock signal, or the like and outputs a pulse signal. The gate line driver circuit 16 has a function of controlling the potentials of wirings supplied with scan signals (hereinafter such wirings are referred to as scan lines GL_1 to GL_X). Note that a plurality of gate line driver circuits 16 may be provided to control the scan lines GL_1 to GL_X separately. Alternatively, the gate line driver circuit 16 has a function of supplying an initialization signal. Without being limited thereto, the gate line driver circuit 16 can supply another signal. For example, as illustrated in FIG. 1, the gate line driver circuit 16 is electrically connected to wirings for controlling the potential of the light-emitting element (hereinafter such wirings are referred to as ANODE_1 to ANODE_X).

The signal line driver circuit 18 includes a shift register or the like. The signal line driver circuit 18 receives a signal (image signal) from which a data signal is derived, as well as a signal for driving the shift register, through the terminal portion 17. The signal line driver circuit 18 has a function of generating a data signal to be written to the pixel circuit 14 which is based on the image signal. In addition, the signal line driver circuit 18 has a function of controlling output of a data signal in response to a pulse signal produced by input of a start pulse signal, a clock signal, or the like. Furthermore, the signal line driver circuit 18 has a function of controlling the potentials of wirings supplied with data signals (hereinafter such wirings are referred to as data lines DL_1 to DL_Y). Alternatively, the signal line driver circuit 18 has a function of supplying an initialization signal. Without being limited thereto, the signal line driver circuit 18 can supply another signal. The signal line driver circuit 18 includes a plurality of analog switches or the like, for example. The signal line driver circuit 18 can output, as the data signals, signals obtained by time-dividing the image signal by sequentially turning on the plurality of analog switches.

[Protection Circuit]

The protection circuit 13 is connected to, for example, the scan line GL between the gate line driver circuit 16 and the pixel circuit 14. Alternatively, the protection circuit 13 is connected to the data line DL between the signal line driver circuit 18 and the pixel circuit 14. Alternatively, the protection circuit 13 can be connected to a wiring between the gate line driver circuit 16 and the terminal portion 17. Alternatively, the protection circuit 13 can be connected to a wiring between the signal line driver circuit 18 and the terminal portion 17. Note that the terminal portion 17 includes terminals for inputting power, control signals, and image signals to the display device from external circuits.

The protection circuit 13 has a function of electrically connecting a wiring connected to the protection circuit 13 to another wiring when a potential out of a certain range is applied to the wiring connected to the protection circuit 13. The protection circuits 13 are provided, so that the resistance of the display device to overcurrent generated by electrostatic discharge (ESD) or the like can be improved. A configuration in which the protection circuits 13 are connected to the gate line driver circuit 16 or a configuration in which the protection circuits 13 are connected to the signal line driver circuit 18 may be employed. Alternatively, the protection circuits 13 may be connected to the terminal portion 17.

[Monitor Circuit and Correction Circuit]

The monitor circuit 20 and the correction circuit 30 each have a function of controlling the amount of current flowing to the light-emitting element and the driving transistor of the pixel circuit 14.

The configuration is not limited to the example in FIG. 1, in which a plurality of monitor circuits 20 and a plurality of correction circuits 30 are provided outside the pixel portion 12; for example, only one monitor circuit 20 and one correction circuit 30 may be provided. Note that as illustrated in FIG. 1, the configuration in which the plurality of monitor circuits 20 and the plurality of correction circuits 30 are provided outside the pixel portion 12 is preferable because various corrections can be performed in the pixel portion 12. For example, the pixel portion 12 may be equally divided into four areas (upper, lower, left, and right areas), and the light-emitting element and the driving transistor in each area may be controlled individually with the monitor circuit 20 and the correction circuit 30 which are positioned near each area.

<1-2. Characteristics of Light-Emitting Element>

Next, characteristics of a light-emitting element included in the pixel circuit 14 are described below. First, luminance-current density (L-J) characteristics and current-voltage (I-V) characteristics which are one of the characteristics of the light-emitting element are described with reference to FIGS. 11A and 11B.

Figure 11A:
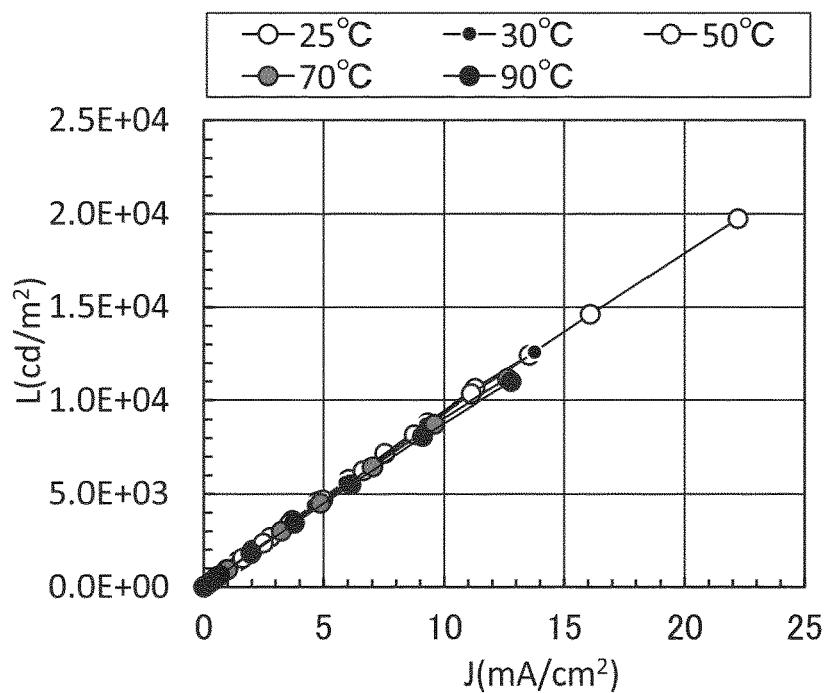
FIGS. 11A and 11B show L-J characteristics of a light-emitting element and I-V characteristics of the light-emitting element, respectively.

FIG. 11A shows L-J characteristics of the light-emitting element. As shown in FIG. 11A, the luminance of the light-emitting element gets higher in proportion to a current density. That is, there is no change or an extremely small change due to environmental temperature (hereinafter referred to as temperature dependence in some cases) in the L-J characteristics of the light-emitting element.

Figure 11B:
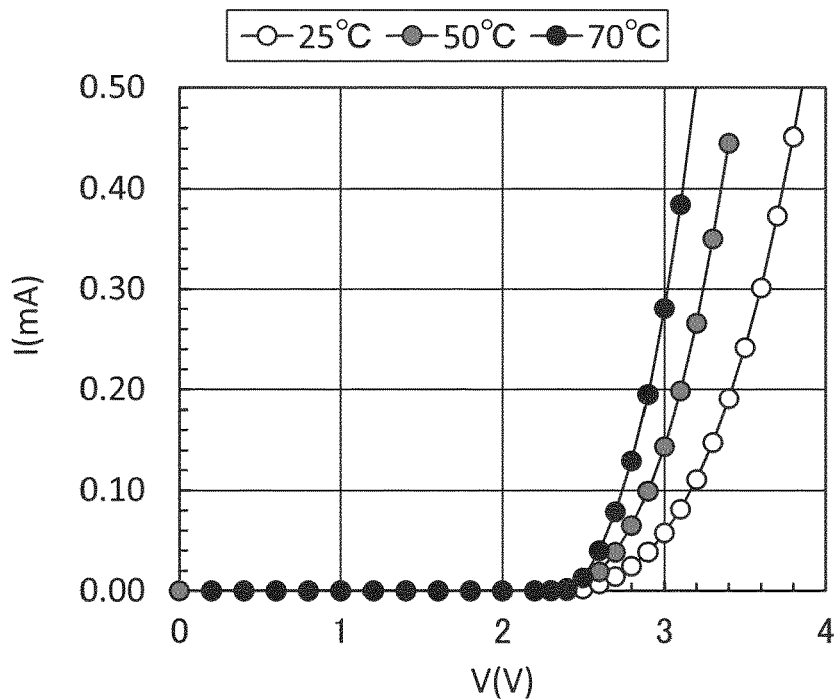

FIG. 11B shows I-V characteristics of the light-emitting element. Since the resistance of the light-emitting element changes in accordance with temperature, the luminance also changes with change in the temperature. For example, as shown in FIG. 11B, in the case where the same voltage is applied, when the temperature of the light-emitting element becomes higher than 25° C., the current which flows to the light-emitting element is increased.

Thus, the semiconductor device of one embodiment of the present invention includes the monitor circuit 20 and the correction circuit 30 in order to reduce temperature dependence of the light-emitting element. The monitor circuit 20 includes a light-emitting element and a transistor whose functions are the same as those of the light-emitting element and the transistor included in the pixel circuit 14. Specifically, the monitor circuit 20 includes a monitor light-emitting element and a monitor transistor. The correction circuit 30 has a function of controlling the amount of current flowing to the pixel circuit 14 on the basis of current values of one or both of the monitor light-emitting element and the monitor transistor of the monitor circuit 20. For example, the correction circuit 30 can control the value of current flowing to the light-emitting element or the driving transistor of the pixel circuit 14.

<1-3. Configuration Example 1 of Monitor Circuit and Correction Circuit>

Figure 2:
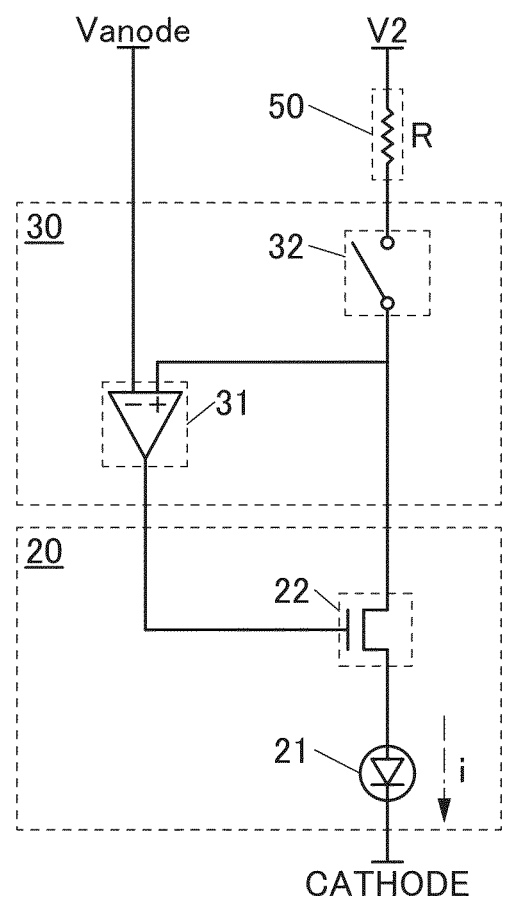
FIG. 2 illustrates a circuit of one embodiment of a semiconductor device.

Next, an example of the monitor circuit 20 and the correction circuit 30 are described with reference to FIG. 2. FIG. 2 is a circuit diagram showing an example of the monitor circuit 20 and the correction circuit 30 included in the semiconductor device of one embodiment of the present invention.

The monitor circuit 20 includes a monitor light-emitting element 21 and a monitor transistor 22. The correction circuit 30 includes an amplifier circuit 31 and a switching element 32.

One of a pair of electrodes of the monitor light-emitting element 21 is electrically connected to a first electrode (CATHODE), and the other of the pair of electrodes of the monitor light-emitting element 21 is electrically connected to one of source and drain electrodes of the monitor transistor 22. Note that a potential CATHODE is supplied to the first electrode.

The other of the source and drain electrodes of the monitor transistor 22 is electrically connected to a first input terminal of the amplifier circuit 31, and a gate electrode of the monitor transistor 22 is electrically connected to an output terminal of the amplifier circuit 31. A second electrode ($V_{anode}$) is supplied with a potential ANODE and is electrically connected to a second input terminal of the amplifier circuit 31. A third electrode ($V_2$) is supplied with a high power supply potential and is electrically connected to the other of the source and drain electrodes of the monitor transistor 22 through the switching element 32. Note that a resistor 50 is connected between the third electrode ($V_2$) and the other of the source and drain electrodes of the monitor transistor 22.

In the configuration in FIG. 2 including the monitor circuit 20 and the correction circuit 30, the value i of current flowing from the second electrode ($V_{anode}$) to the first electrode (CATHODE) is represented by Formula 1.

$$(V_2-V_{anode})/R \qquad (1)$$

Note that in Formula 1, $V_2-V_{anode}$ represents a potential ($V_{gs}$) between the gate electrode and the source electrode of the monitor transistor 22, which is necessary to feed current of the value i, and R represents resistance of the resistor 50.

Thus, it is preferable that the resistor 50 have no temperature dependence and constant resistance. For example, an oxide conductor (OC) is preferably used for the resistor 50. For example, an oxide conductor (OC) can be obtained in such a manner that the conductivity of an oxide semiconductor (OS) is changed to an n-type by increasing its carrier density.

The oxide conductor (OC) has no resistance change or a small resistance change due to environmental temperature. That is, the oxide conductor (OC) can be used as a resistant material having low temperature dependence. However, the resistor 50 is not necessarily formed using the oxide conductor (OC) and another material having low temperature dependence may be used.

The monitor transistor 22 preferably includes an oxide semiconductor (OS) in an active layer. The oxide semiconductor (OS) can be formed in the same manufacturing steps as the above-described oxide conductor (OC). Note that in the case of using an oxide semiconductor (OS) for the monitor transistor 22, characteristics of the oxide semiconductor (OS) might change in accordance with environmental temperature, as in the monitor light-emitting element 21. For example, a potential difference ($V_{ds}$) between the drain and source electrodes of the monitor transistor 22 including an oxide semiconductor (OS) might be increased when the environmental temperature rises.

Figure 3:
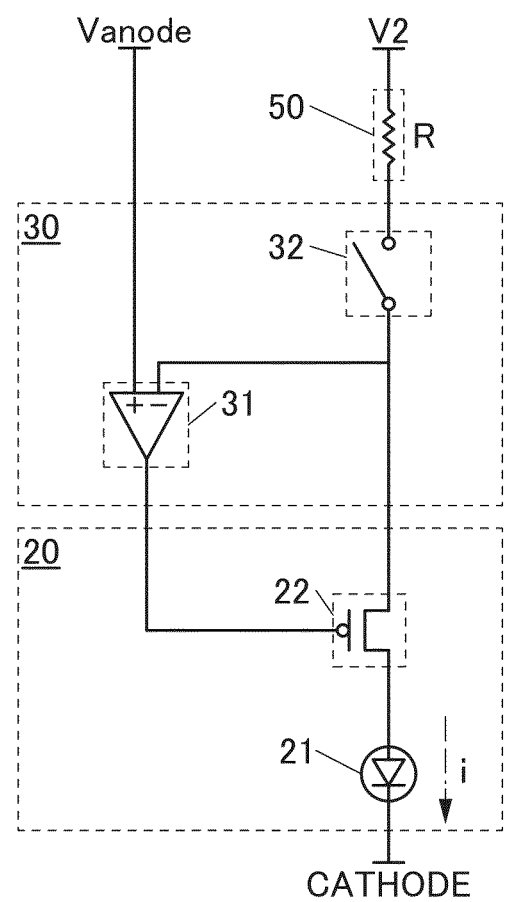
FIG. 3 illustrates a circuit of one embodiment of a semiconductor device.

Note that the configuration is not limited to the example in FIG. 2, in which an n-channel transistor is used as the monitor transistor 22 in the monitor circuit 20; for example, a configuration illustrated in FIG. 3 may be employed. FIG. 3 is a circuit diagram showing an example of the monitor circuit and the correction circuit. The circuit in FIG. 3 is a modified example of the circuit in FIG. 2, in which a p-channel transistor is used as the monitor transistor 22 and the polarities of the amplifier circuit 31 are switched.

Figure 4:
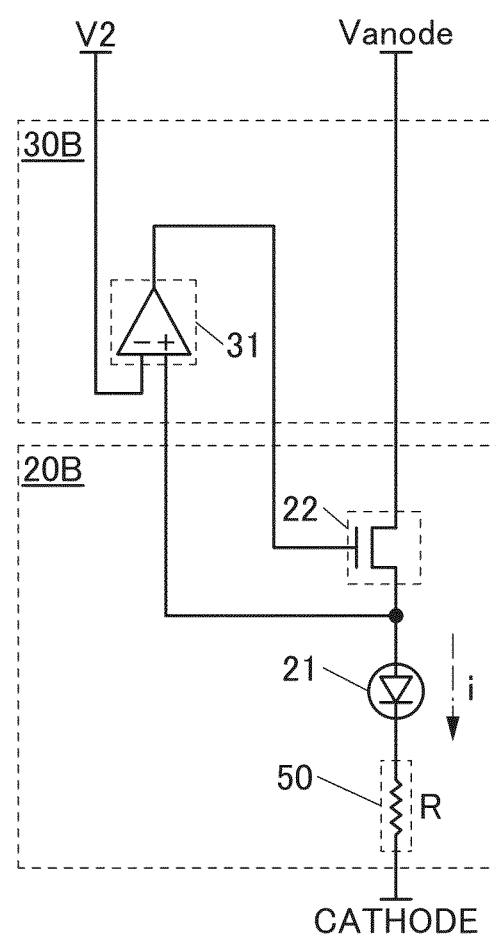
FIG. 4 illustrates a circuit of one embodiment of a semiconductor device.

The resistor 50 may be provided on the first electrode (CATHODE) side of the monitor light-emitting element 21. FIG. 4 shows an example of such a configuration. A circuit illustrated in FIG. 4 includes a monitor circuit 20B and a correction circuit 30B. Note that in the configuration in FIG. 4, the value i of current flowing to the monitor light-emitting element 21 is represented by Formula 2.

$$(V_2-CATHODE)/R \qquad (2)$$

Figure 5:
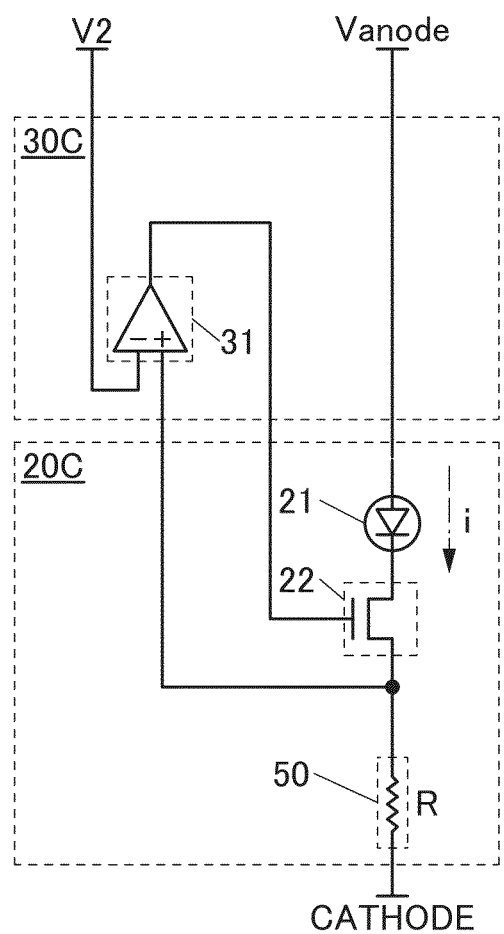
FIG. 5 illustrates a circuit of one embodiment of a semiconductor device.

An inversely stacked structure in which the stack order of components of the monitor light-emitting element 21 is changed may be employed. FIG. 5 shows an example of such a configuration. A circuit illustrated in FIG. 5 includes a monitor circuit 20C and a correction circuit 30C.

The configurations in which the temperature correction is performed on the light-emitting element using the monitor circuit are shown as examples. However, the configuration is not limited thereto; for example, only the correction circuit may be used, in which the value of current flowing to the light-emitting element and the driving transistor of the pixel circuit is monitored and the temperature correction is performed on the light-emitting element.

<1-4. Temperature Characteristics of Transistor Including Oxide Semiconductor>

Here, the temperature dependence of a transistor including an oxide semiconductor (OS) is described below with reference to FIG. 12.

Figure 12:
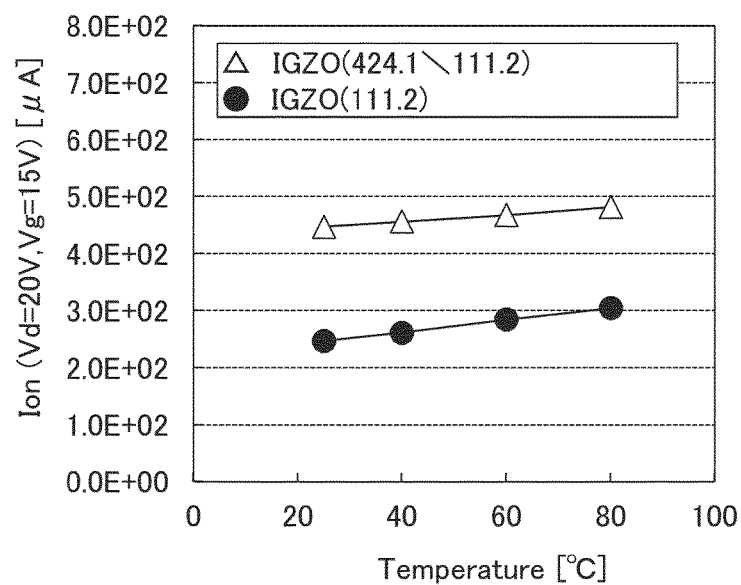
FIG. 12 shows temperature characteristics of transistors.

FIG. 12 shows evaluation results of temperature dependence of bottom-gate top-contact (BGTC) transistors, i.e., channel-etched transistors. An oxide semiconductor was used for an active layer of each transistor. Note that the oxide semiconductor was formed under the following two conditions: a stacked-layer structure of an IGZO film (In:Ga:Zn=4:2:4.1 [atomic ratio]) and an IGZO film (In:Ga:Zn=1:1:1.2 [atomic ratio]) as a first condition; and a single-layer structure of an IGZO film (In:Ga:Zn=1:1:1.2 [atomic ratio]) as a second condition. The transistors each had a channel length L of 3 µm and a channel width W of 5 µm.

To evaluate the temperature dependence of the transistors, the on-state currents ($I_{on}$) of the transistors were measured under the conditions where substrate temperatures were 25° C., 40° C., 60° C., and 80° C. Note that a drain voltage ($V_d$) was set to 20 V, and a gate voltage ($V_g$) was set to 15 V.

As shown in FIG. 12, the amount of $I_{on}$ of the transistors increases as the substrate temperature rises regardless of the conditions of the oxide semiconductor. That is, the transistor including the oxide semiconductor has the temperature dependence.

<1-5. Temperature Dependence of Oxide Conductor>

Next, the temperature dependence of the oxide conductor (OC) is described with reference to FIG. 13.

Figure 13:
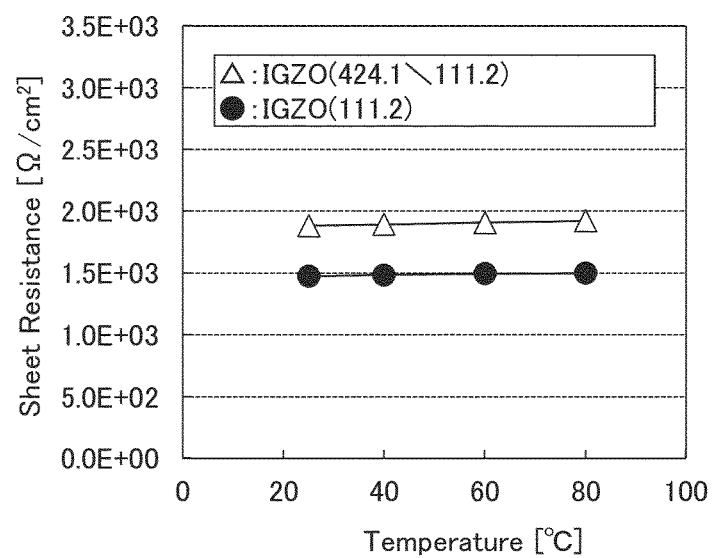
FIG. 13 shows temperature characteristics of resistance of an oxide conductor (OC).

FIG. 13 shows temperature dependence of oxide conductor (OC). Note that the oxide conductor (OC) was formed in such a manner that an oxide semiconductor film was formed, a silicon nitride film containing hydrogen was formed over the oxide semiconductor film, and then hydrogen was supplied from the silicon nitride film to the oxide semiconductor film. The oxide semiconductor film was formed under the following two conditions: a stacked-layer structure of an IGZO film (In:Ga:Zn=4:2:4.1 [atomic ratio]) and an IGZO film (In:Ga:Zn=1:1:1.2 [atomic ratio]) as a first condition; and a single-layer structure of an IGZO film (In:Ga:Zn=1:1:1.2 [atomic ratio]) as a second condition.

To evaluate the temperature dependence of the oxide conductor (OC), the sheet resistance of the oxide conductor (OC) was measured under the conditions where substrate temperatures were 25° C., 40° C., 60° C., and 80° C. Note that the size (W/L) of the oxide conductor (OC) was 10 µm/1500 µm.

As shown in FIG. 13, sheet resistance of the oxide conductor (OC) is not or hardly changed even with a change in the substrate temperature regardless of the conditions of the oxide semiconductor. As described above, the oxide conductor (OC) has no temperature dependence of resistance or extremely low temperature dependence of resistance. In other words, the oxide conductor is a degenerate semiconductor and it is suggested that the conduction band minimum agrees with or substantially agrees with the Fermi level.

Thus, the oxide conductor can be preferably used as the resistor of the correction circuit 30.

<1-6. Configuration Example 2 of Monitor Circuit and Correction Circuit>

Next, a configuration example different from that of the monitor circuit 20 and the correction circuit 30 in FIG. 2 is described with reference to FIG. 6.

Figure 6:
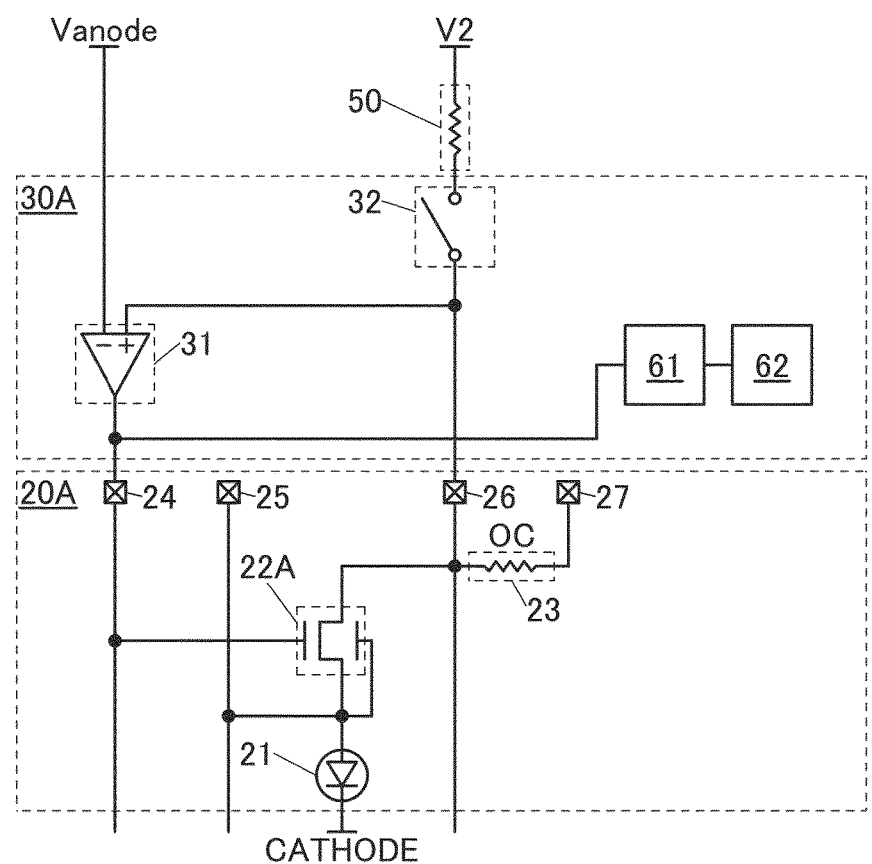
FIG. 6 illustrates a circuit of one embodiment of a semiconductor device.

FIG. 6 is a circuit diagram showing an example of a semiconductor device of one embodiment of the present invention. A semiconductor device illustrated in FIG. 6 includes a monitor circuit 20A and a correction circuit 30A.

[Monitor Circuit]

The monitor circuit 20A includes the monitor light-emitting element 21, a monitor transistor 22A, a resistor 23, and terminals 24, 25, 26, and 27.

As shown in monitor circuit 20A, element characteristics of the monitor light-emitting element 21, the monitor transistor 22A, and the resistor 23 can be measured by providing a plurality of terminals and changing portions to which the terminals are connected.

Note that the resistor 23 can be formed using the above-described oxide conductor (OC). Therefore, in FIG. 6, a symbol "OC" is written beside the resistor 23. The same applies to other drawings referred to below.

The terminal 24 is electrically connected to a gate electrode of the monitor transistor 22A, and the potential of the gate electrode of the monitor transistor 22A can be extracted outside. The terminal 25 is electrically connected to a source electrode of the monitor transistor 22A, and the potential of the source electrode of the monitor transistor 22A can be extracted outside. The terminal 26 is electrically connected to a drain electrode of the monitor transistor 22A, and the potential of the drain electrode of the monitor transistor 22A can be extracted outside. The terminal 27 is electrically connected to the other of the pair of electrodes of the monitor light-emitting element 21 through the resistor 23 and the monitor transistor 22A, and the potential of the other of the pair of electrodes (e.g., an anode) of the monitor light-emitting element 21 can be extracted outside. Note that the first electrode (CATHODE) is electrically connected to the one of the pair of electrodes of the monitor light-emitting element 21.

Note that the monitor transistor 22A, which has a plurality of gate electrodes, is different from the above-described monitor transistor 22. Specifically, the monitor transistor 22A includes a first gate electrode and a second gate electrode facing the first gate electrode. The second gate electrode is electrically connected to the source electrode of the monitor transistor 22A. Note that a portion to which the second gate electrode is connected is not limited thereto. For example, the second gate electrode may be electrically connected to the first gate electrode of the monitor transistor 22A or another electrode, such as an electrode supplied with a ground (GND) potential or an electrode supplied with another potential. Alternatively, the second gate electrode of the monitor transistor 22A may be in a floating state.

The monitor transistor 22A having a plurality of gate electrodes can have high driving capability or controlled threshold voltage ($V_{th}$), for example.

Figure 7A:
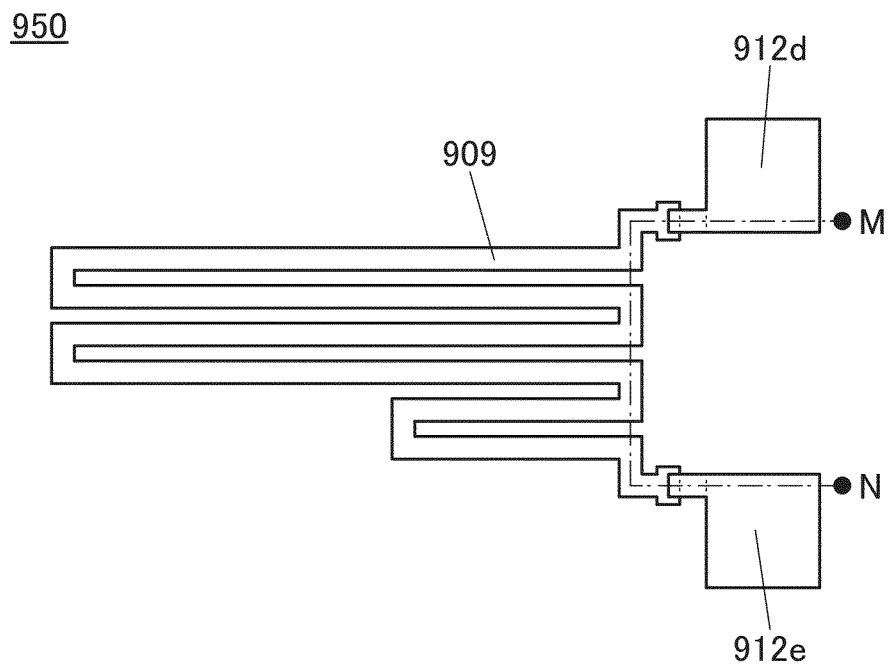
FIGS. 7A and 7B are a top view and a cross-sectional view illustrating one embodiment of a semiconductor device.
Figure 7B:
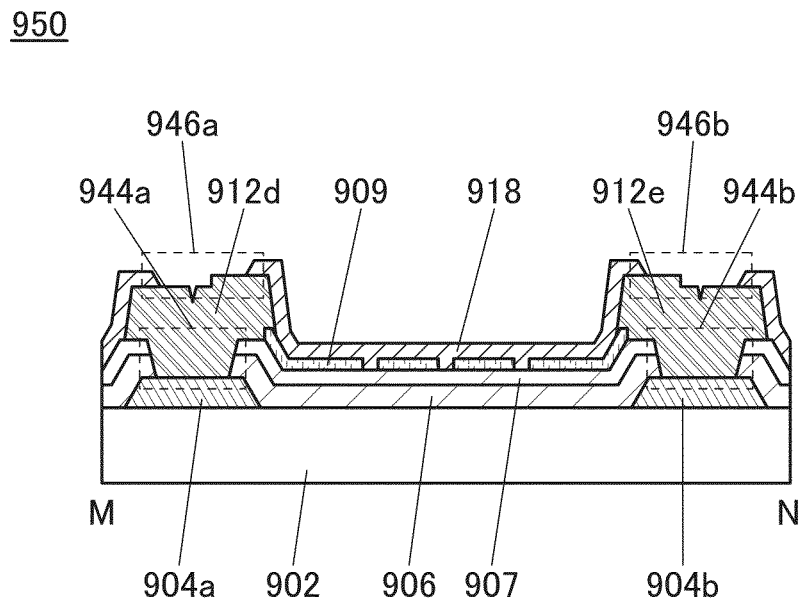

As the resistor 23, a structure illustrated in FIGS. 7A and 7B can be employed, for example.

FIG. 7A is a top view of a semiconductor device 950, and FIG. 7B is a cross-sectional view taken along the dashed dotted line M-N in FIG. 7A.

The semiconductor device 950 includes a conductive film 904a over a substrate 902, a conductive film 904b over the substrate 902, an insulating film 906 covering the substrate 902 and the conductive films 904a and 904b, an insulating film 907 over the insulating film 906, an oxide conductor film 909 over the insulating film 907, a conductive film 912d connected to the conductive film 904a through an opening 944a provided in the insulating films 906 and 907, a conductive film 912e connected to the conductive film 904b through an opening 944b provided in the insulating films 906 and 907, and an insulating film 918 covering the insulating film 907, the oxide conductor film 909, and the conductive films 912d and 912e.

For example, an oxide semiconductor is used for the oxide conductor film 909, and an insulating film containing hydrogen is used as the insulating film 918. With such a structure, hydrogen contained in the insulating film 918 enters the oxide semiconductor film, the carrier density of the oxide semiconductor film is increased, and the oxide semiconductor film can function as an oxide conductor film.

[Correction Circuit]

The correction circuit 30A includes the amplifier circuit 31, the switching element 32, a converter circuit 61, and a memory circuit 62.

Note that memory circuit 62 is electrically connected to the output terminal of the amplifier circuit 31 through the converter circuit 61. For example, an output signal which is an analog signal of the amplifier circuit 31 is converted to a digital signal with the converter circuit 61 and stored in the memory circuit 62.

As illustrated in FIG. 6, circuits having different functions from the amplifier circuit 31 and the switching element 32 (here, the converter circuit 61 and the memory circuit 62) may be provided in the correction circuit 30A.

The monitor circuit 20A and the correction circuit 30A in FIG. 6 are connected to each other as follows: the terminal 24 and the output terminal of the amplifier circuit 31 are electrically connected to each other; and the terminal 26, one electrode of the switching element 32, and the first input terminal of the amplifier circuit 31 are electrically connected to each other.

In the configuration in FIG. 6, the terminals 25 and 27 are not electrically connected to the correction circuit 30A. As described above, the correction circuit 30A may be electrically connected to any of the monitor light-emitting element 21, the monitor transistor 22A, and the resistor 23 of the monitor circuit 20A.

<1-7. Configuration Example 3 of Monitor Circuit and Correction Circuit>

Next, a configuration example different from that of the monitor circuit 20 and the correction circuit 30 in FIG. 2 is described with reference to FIG. 8.

Figure 8:
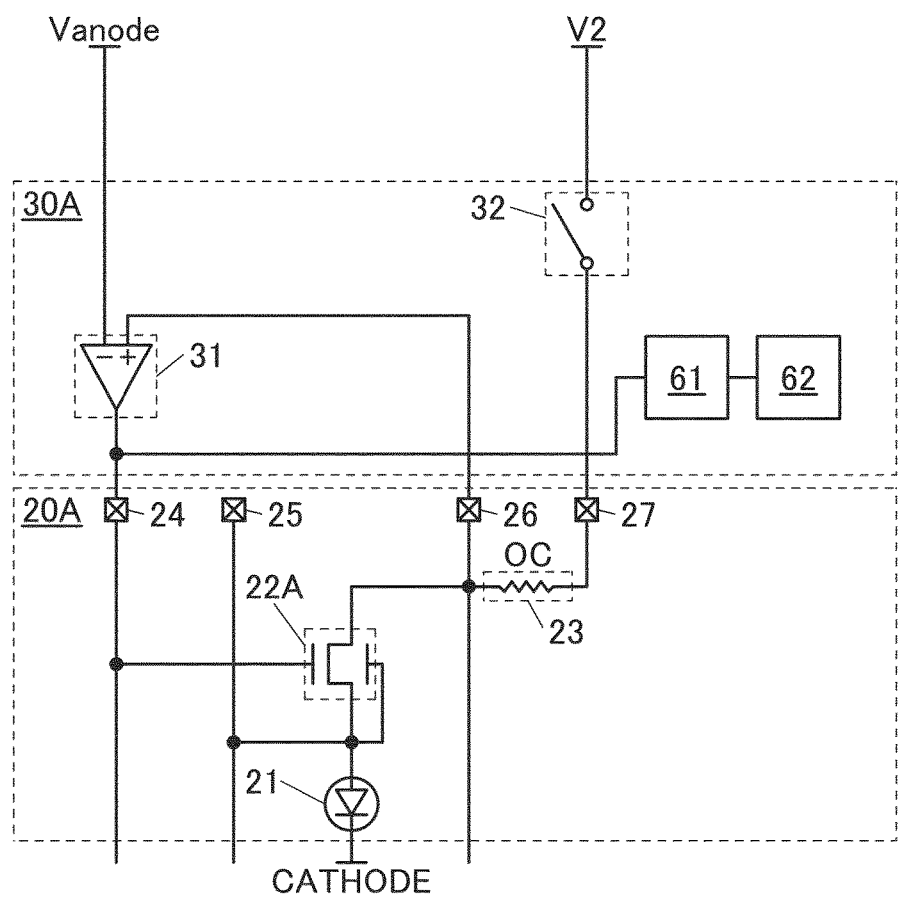
FIG. 8 illustrates a circuit of one embodiment of a semiconductor device.

FIG. 8 is a circuit diagram showing an example of a semiconductor device of one embodiment of the present invention. A semiconductor device illustrated in FIG. 8 includes the monitor circuit 20A and the correction circuit 30A. Note that the semiconductor device in FIG. 8 is different from the semiconductor device in FIG. 6 in a manner of connecting the monitor circuit 20A and the correction circuit 30A.

Specifically, the monitor circuit 20A and the correction circuit 30A in FIG. 8 are connected to each other as follows: the terminal 24 and the output terminal of the amplifier circuit 31 are electrically connected to each other; the terminal 26 and the first input terminal of the amplifier circuit 31 are electrically connected to each other; and the terminal 27 and the one electrode of the switching element 32 are electrically connected to each other.

In the configuration in FIG. 8, the resistor 50 in FIG. 6 can be omitted because the resistor 23 of the monitor circuit 20A can be used.

<1-8. Configuration Example 1 of Pixel Circuit>

Figure 9:
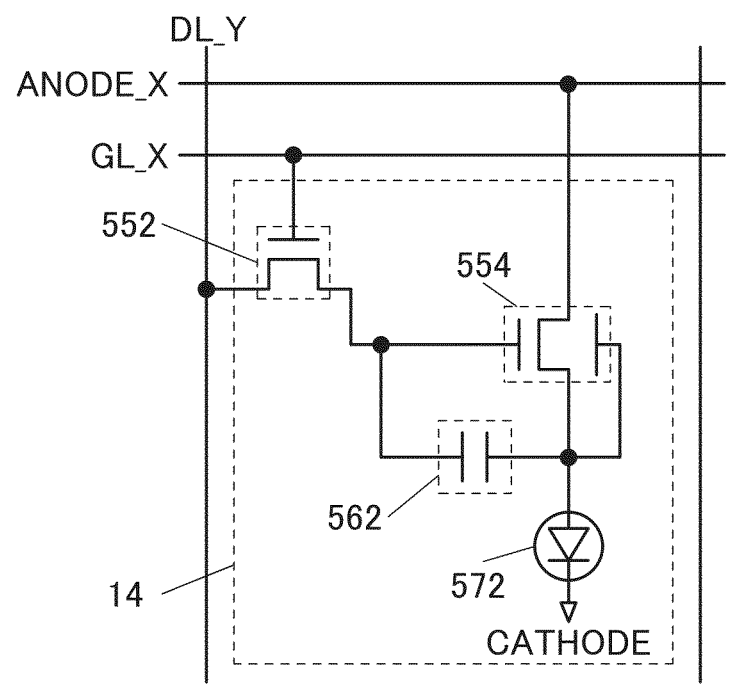
FIG. 9 illustrates a circuit of one embodiment of a semiconductor device.

Next, a specific configuration of the pixel circuit 14 in FIG. 1 is described with reference to FIG. 9. FIG. 9 is a circuit diagram showing an example of the pixel circuit 14.

The pixel circuit 14 illustrated in FIG. 9 includes transistors 552 and 554, a capacitor 562, and a light-emitting element 572. A transistor including an oxide semiconductor can be used as one or both of the transistors 552 and 554.

One of source and drain electrodes of the transistor 552 is electrically connected to a data line DL_Y. A gate electrode of the transistor 552 is electrically connected to a scan line GL_X.

The transistor 552 has a function of controlling whether to write a data signal by being turned on or off.

One of a pair of electrodes of the capacitor 562 is electrically connected to the other of the source and drain electrodes of the transistor 552. The other of the pair of electrodes of the capacitor 562 is electrically connected to a second gate electrode (also referred to as a back gate electrode) of the transistor 554. The capacitor 562 functions as a storage capacitor for holding written data.

One of source and drain electrodes of the transistor 554 is electrically connected to an anode line (ANODE_X).

One of an anode and a cathode of the light-emitting element 572 is electrically connected to the other of the source and drain electrodes of the transistor 554, and the other of the anode and the cathode of the light-emitting element 572 is electrically connected to a cathode line (CATHODE). Note that the other of the pair of electrodes of the capacitor 562 is electrically connected to the one of the anode and the cathode of the light-emitting element 572.

As the light-emitting element 572, for example, an organic EL element can be used. Note that the light-emitting element 572 is not limited to an organic EL element; an inorganic EL element including an inorganic material may be used.

For example, in the circuit configuration in FIG. 9, the pixel circuits 14 are sequentially selected row by row by the gate line driver circuit 16 in FIG. 1, whereby the transistors 552 are turned on and a data signal is written.

When the transistors 552 are turned off, the pixel circuits 14 in which the data has been written are brought into a holding state. Furthermore, the amount of current flowing between the source and drain electrodes of the transistor 554 is controlled in accordance with the potential of the written data signal. The light-emitting element 572 emits light with a luminance corresponding to the amount of flowing current. This operation is sequentially performed row by row; thus, an image can be displayed.

Note that the potential of the cathode of the light-emitting element 572 is adjusted to an arbitrary value as appropriate by the above-described monitor circuit and correction circuit.

Although the example of the configuration including the light-emitting element 572 as a display element of the display device is shown in this embodiment, one embodiment of the present invention is not limited to the structure and a variety of elements may be included in the display device. Examples of the elements are electroluminescent (EL) element (e.g., an EL element including organic and inorganic materials, an organic EL element, an inorganic EL element, an LED), a light-emitting transistor (a transistor which emits light by current), an electron emitter, a liquid crystal element, an electronic ink display element, an electrophoretic element, an electrowetting element, a plasma display (PDP) element, micro electro mechanical systems (MEMS) display element (e.g., a grating light valve (GLV), a digital micromirror device (DMD), a digital micro shutter (DMS) element, an interferometric modulator display (IMOD) element, and the like), or a piezoelectric ceramic display, which has a display media whose contrast, luminance, reflectivity, transmittance, or the like is changed by electrical or magnetic effect. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink display element or electrophoretic elements is electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

A progressive type display, an interlace type display, or the like can be employed as the display type of the display device. Further, color elements controlled in a pixel at the time of color display are not limited to three colors of R (red), G (green), and B (blue). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Further, the size of a display region may be different depending on respective dots of the color elements. Embodiments of the disclosed invention are not limited to a display device for color display; the disclosed invention can also be applied to a display device for monochrome display.

White light (W) may be emitted from a backlight (e.g., an organic EL element, an inorganic EL element, an LED, or a fluorescent lamp) in the display device. Furthermore, a coloring layer (also referred to as a color filter) may be provided in the display device. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using self-luminous elements such as organic EL elements or inorganic EL elements, the elements may emit light of their respective colors R, G, B, Y, and W. By using self-luminous elements, power consumption can be further reduced as compared to the case of using the coloring layer in some cases.

<1-9. Configuration Example 2 of Pixel Circuit>

Figure 10A:
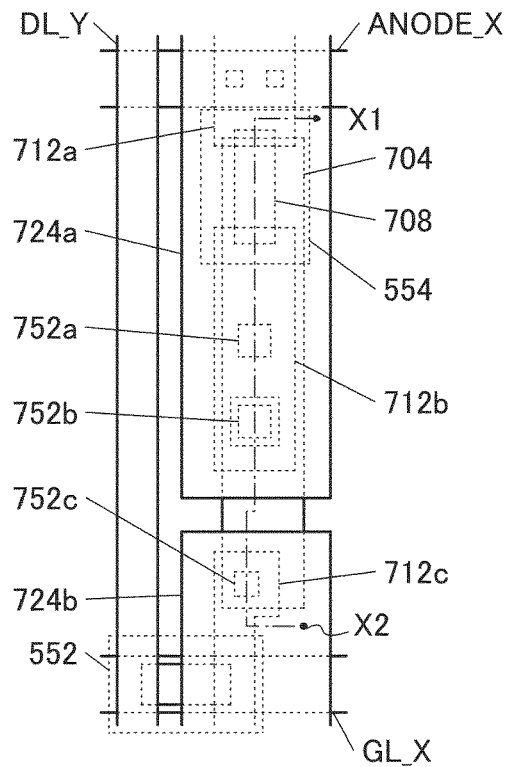
FIGS. 10A and 10B are a top view and a cross-sectional view illustrating one embodiment of a semiconductor device.
Figure 10B:
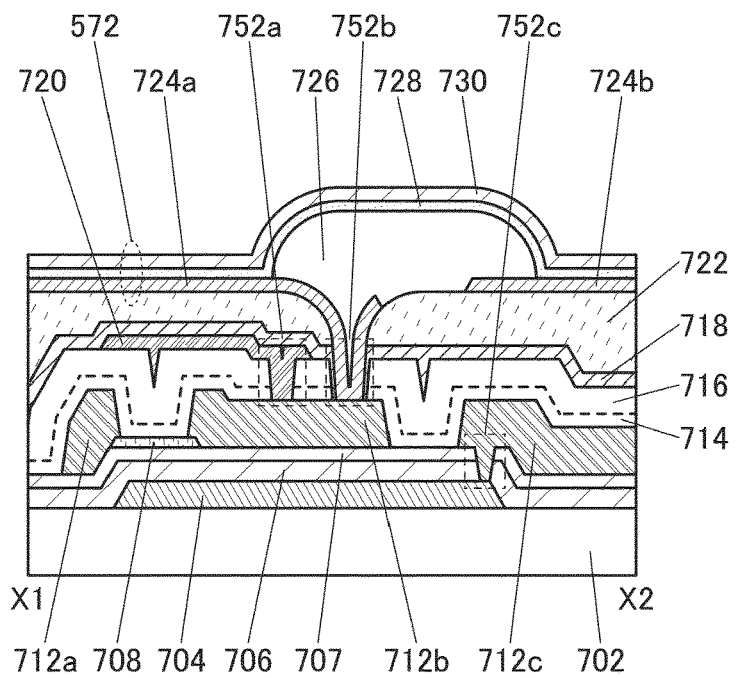

Next, a specific configuration of the pixel circuit 14 in FIG. 9 is described with reference to FIGS. 10A and 10B. FIG. 10A is a top view of the pixel circuit 14, and FIG. 10B is a cross-sectional view taken along the dashed dotted line X1-X2 in FIG. 10A. Note that in FIG. 10A, some components are not illustrated in order to avoid complexity of the drawing.

The pixel circuit 14 illustrated in FIGS. 10A and 10B includes a conductive film 704 functioning as a first gate electrode over a substrate 702, insulating films 706 and 707 over the conductive film 704, an oxide semiconductor film 708 over the insulating film 707, conductive films 712a and 712b functioning as source and drain electrodes over the insulating film 707 and the oxide semiconductor film 708, a conductive film 712c over the insulating film 707, insulating films 714 and 716 covering the oxide semiconductor film 708 and the conductive films 712a, 712b, and 712c, an oxide semiconductor film 720 functioning as a second gate electrode over the insulating film 716, an insulating film 718 over the insulating film 716 and the oxide semiconductor film 720, an insulating film 722 functioning as a planarization insulating film over the insulating film 718, conductive films 724a and 724b functioning as pixel electrodes over the insulating film 722, a structure body 726 having a function of suppressing electrical connection between the conductive films 724a and 724b, an EL layer 728 over the conductive films 724a and 724b and the structure body 726, and a conductive film 730 over the EL layer 728.

The conductive film 712c is electrically connected to the conductive film 704 through an opening 752c provided in the insulating films 706 and 707. The oxide semiconductor film 720 functioning as a second gate electrode is electrically connected to the conductive film 712b through an opening 752a provided in the insulating films 714 and 716. The conductive film 724a is electrically connected to the conductive film 712b through an opening 752b provided in the insulating films 714, 716, 718, and 722.

The conductive film 724a functioning as a pixel electrode, the EL layer 728, and the conductive film 730 form the light-emitting element 572. Note that the EL layer 728 can be formed by any of the following methods: a sputtering method, an evaporation method (including a vacuum evaporation method), a printing method (such as relief printing, intaglio printing, gravure printing, planography printing, and stencil printing), an ink jet method, a coating method, and the like.

The configuration of the pixel circuit 14 including two transistors and one capacitor as illustrated in FIGS. 10A and 10B can reduce the number of wirings. For example, as illustrated in FIG. 10A, wirings included in the pixel circuit are mainly three wirings of a gate line, a scan line, and the anode line. A pixel with such a configuration can have a high aperture ratio. Moreover, by reducing the number of wirings, a short circuit between adjacent wirings is unlikely to occur, for example. Thus, a semiconductor device having high display quality can be provided.

The structure described in this embodiment can be combined as appropriate with any of the structures described in the other embodiments, examples, and a reference example.

Embodiment 2

In this embodiment, a transistor included in a semiconductor device of one embodiment of the present invention and a method for manufacturing the transistor will be described with reference to FIGS. 14A to 14C, FIGS. 15A to 15C, FIGS. 16A to 16C, FIGS. 17A to 17C, FIGS. 18A to 18C, FIGS. 19A to 19D, FIGS. 20A and 20B, FIGS. 21A to 21D, FIGS. 22A and 22B, FIGS. 23A to 23C, and FIGS. 24A to 24D.

<2-1. Structure Example 1 of Transistor>

Figure 14A:
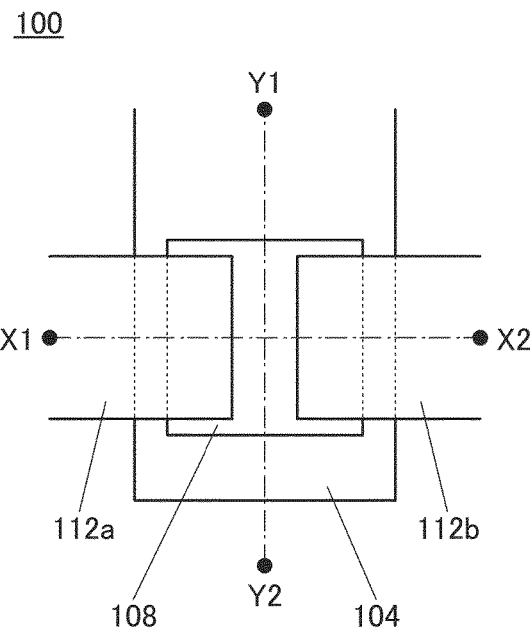
FIGS. 14A to 14C are a top view and cross-sectional views illustrating one embodiment of a transistor.
Figure 14B:
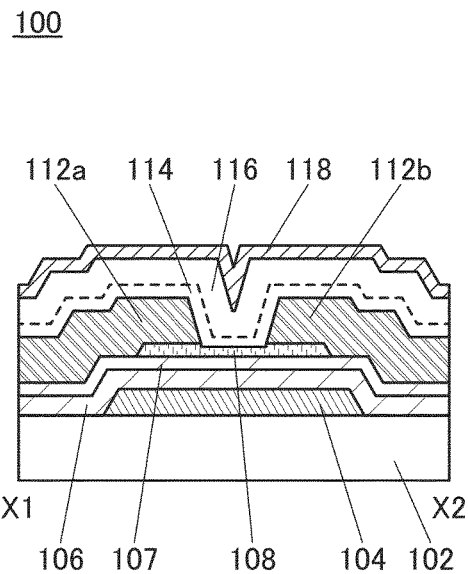
Figure 14C:
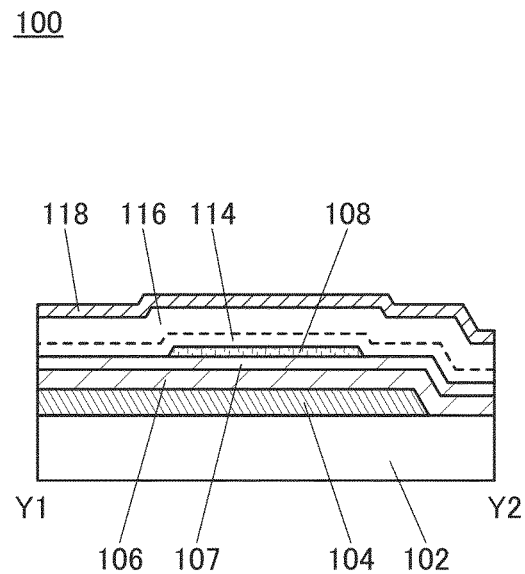

FIG. 14A is a top view of a transistor 100 of the semiconductor device of one embodiment of the present invention. FIG. 14B is a cross-sectional view taken along the dashed dotted line X1-X2 in FIG. 14A, and FIG. 14C is a cross-sectional view taken along the dashed dotted line Y1-Y2 in FIG. 14A. Note that in FIG. 14A, some components of the transistor 100 (e.g., an insulating film functioning as a gate insulating film) are not illustrated to avoid complexity. Furthermore, the direction of the dashed-dotted line X1-X2 may be called a channel length direction, and the direction of the dashed-dotted line Y1-Y2 may be called a channel width direction. As in FIG. 14A, some components are not illustrated in some cases in top views of transistors are described below.

The transistor 100 includes a conductive film 104 functioning as a gate electrode over a substrate 102, an insulating film 106 over the substrate 102 and the conductive film 104, an insulating film 107 over the insulating film 106, an oxide semiconductor film 108 over the insulating film 107, a conductive film 112a functioning as a source electrode electrically connected to the oxide semiconductor film 108, and a conductive film 112b functioning as a drain electrode electrically connected to the oxide semiconductor film 108. Insulating films 114, 116, and 118 are provided over the transistor 100, specifically, over the conductive films 112a and 112b and the oxide semiconductor film 108. The insulating films 114, 116, and 118 function as a protective insulating film for the transistor 100.

When impurities such as hydrogen or moisture enter the oxide semiconductor film 108, the impurities are bonded to oxygen vacancy formed in the oxide semiconductor film 108, generating electrons serving as carriers. The carriers due to the impurities tend to make the transistor 100 be normally on. Therefore, for stable transistor characteristics, it is important to reduce impurities such as hydrogen or moisture in the oxide semiconductor film 108 and to reduce oxygen vacancy in the oxide semiconductor film 108. Thus, in the transistor 100, oxygen vacancy in the oxide semiconductor film 108 can be filled by supply of oxygen from the insulating films 114 and 116 to the oxide semiconductor film 108.

Thus, the insulating films 114 and 116 each include a region that contains oxygen in excess of that in the stoichiometric composition (oxygen-excess region). In other words, the insulating films 114 and 116 are insulating films capable of releasing oxygen. The oxygen-excess region is formed in the insulating films 114 and 116 in such a manner that oxygen is added to the insulating films 114 and 116 after the deposition, for example. Oxygen can be added by an ion implantation method, an ion doping method, a plasma immersion ion implantation method, plasma treatment, or the like. For the plasma treatment, an apparatus with which an oxygen gas is made to be plasma by high-frequency power (also referred to as a plasma etching apparatus or a plasma ashing apparatus) is preferably used.

The amount of released oxygen can be found by measuring an insulating film by thermal desorption spectroscopy (TDS). For example, the amount of released oxygen molecules from the insulating films 114 and 116 is larger than or equal to $8.0\times10^{14}/cm^2$, preferably larger than or equal to $1.0\times10^{15}/cm^2$ and further preferably larger than or equal to $1.5\times10^{15}/cm^2$, by TDS. Note that the surface temperature of the films in TDS is higher than or equal to 100° C. and lower than or equal to 700° C., preferably higher than or equal to 100° C. and lower than or equal to 500° C.

<2-2. Components of Semiconductor Device>

Next, components of the semiconductor device of this embodiment will be described.

[Substrate]

There is no particular limitation on the property of a material and the like of the substrate 102 as long as the material has heat resistance high enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI (silicon on insulator) substrate, or the like may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

[Conductive Film]

The conductive film 104 functioning as a gate electrode and the conductive films 112a and 112b functioning as source and drain electrodes can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal element as its component; an alloy including a combination of any of these elements; or the like.

Furthermore, each of the conductive films 104, 112a, and 112b may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

The conductive films 104, 112a, and 112b can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide.

A Cu—X alloy film (X is Mn, Ni, Cr, Fe, Co, Mo, Ta, or Ti) may be used for the conductive films 104, 112a, and 112b. The use of a Cu—X alloy film results in lower manufacturing costs because the film can be processed by wet etching.

[Gate Insulating Film]

As each of the insulating films 106 and 107 functioning as a gate insulating film of the transistor 100, an insulating layer including at least one of the following films formed by a plasma-enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a stacked-layer structure of the insulating films 106 and 107, an insulating film of a single layer formed using a material selected from the above or an insulating film including three or more stacked layers may be used.

Note that the insulating film 107 in contact with the oxide semiconductor film 108 of the transistor 100 is preferably an oxide insulating film and preferably includes a region that contains oxygen in excess of that in the stoichiometric composition (oxygen-excess region). In other words, the insulating film 107 is an insulating film which is capable of releasing oxygen. In order to provide the oxygen-excess region in the insulating film 107, the insulating film 107 is formed in an oxygen atmosphere, for example. Alternatively, the oxygen-excess region may be formed by introduction of oxygen into the insulating film 107 after the deposition. Oxygen can be introduced by an ion implantation method, an ion doping method, a plasma immersion ion implantation method, plasma treatment, or the like.

In the case where hafnium oxide is used for the insulating film 107, the following effect is attained. Hafnium oxide has a higher dielectric constant than silicon oxide and silicon oxynitride. Therefore, by using hafnium oxide, the thickness of the insulating film 107 can be made large as compared with the case where silicon oxide is used; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to obtain a transistor with a low off-state current. Examples of the crystalline structure include a monoclinic crystal structure and a cubic crystal structure. Note that one embodiment of the present invention is not limited to the above examples.

In this embodiment, a silicon nitride film is formed as the insulating film 106, and a silicon oxide film is formed as the insulating film 107. A silicon nitride film has a higher dielectric constant than a silicon oxide film and needs a larger thickness for capacitance equivalent to that of a silicon oxide film. Thus, when a silicon nitride film is included in the gate insulating film of the transistor 100, the physical thickness of the insulating film can be increased. This makes it possible to suppress a decrease in withstand voltage of the transistor 100 and furthermore to increase the withstand voltage, thereby inhibiting electrostatic breakdown of the transistor 100.

[Oxide Semiconductor Film]

The oxide semiconductor film 108 contains In, Zn, and M (M is Ti, Ga, Y, Zr, La, Ce, Nd, Sn, or Hf). Typically, In—Ga oxide, In—Zn oxide, or In-M-Zn oxide can be used for the oxide semiconductor film 108. It is particularly preferable to use In-M-Zn oxide for the oxide semiconductor film 108.

In the case where the oxide semiconductor film 108 includes In-M-Zn oxide, it is preferable that the atomic ratio of metal elements of a sputtering target used for forming the In-M-Zn oxide satisfy In≥M and Zn≥M. As the atomic ratio of metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable.

For example, it is preferable to use a sputtering target with an atomic ratio of In:Ga:Zn=4:2:4.1 to form the In-M-Zn oxide as the oxide semiconductor film 108, in which case the transistor can have high field-effect mobility. The transistor having high field-effect mobility is preferably used in a pixel circuit or a driver circuit in a high-definition display device typified by 4K×2K pixels (3840 pixels in the horizontal direction and 2160 pixels in the perpendicular direction) or 8K×4K pixels (7680 pixels in the horizontal direction and 4320 pixels in the perpendicular direction).

Note that the atomic ratio of metal elements in the formed oxide semiconductor film 108 may vary from that in the above-described sputtering target, in a range of ±40%. For example, when a sputtering target with an atomic ratio of In:Ga:Zn=4:2:4.1 is used, an atomic ratio of In:Ga:Zn in the oxide semiconductor film 108 may be 4:2:3 and its vicinity. For example, when a sputtering target with an atomic ratio of In:Ga:Zn=1:1:1.2 is used, the atomic ratio of In:Ga:Zn in the oxide semiconductor film 108 may be 1:1:1 and its vicinity.

Note that in the case where the oxide semiconductor film 108 is formed of In-M-Zn oxide, the proportion of In and the proportion of M, not taking Zn and O into consideration, are preferably greater than 25 atomic % and less than 75 atomic %, respectively, and further preferably greater than 34 atomic % and less than 66 atomic %, respectively.

The energy gap of the oxide semiconductor film 108 is 2.0 eV or more, preferably 2.5 eV or more and further preferably 3.0 eV or more. The use of an oxide semiconductor having such a wide energy gap can reduce the off-state current of the transistor 100.

The thickness of the oxide semiconductor film 108 is preferably greater than or equal to 3 nm and less than or equal to 200 nm, further preferably greater than or equal to 3 nm and less than or equal to 100 nm, and still further preferably greater than or equal to 3 nm and less than or equal to 50 nm.

Note that without limitation to the compositions and materials described above, a material with an appropriate composition may be used in accordance with required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 108 be set to be appropriate.

A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Further, a highly purified intrinsic or substantially highly purified intrinsic oxide semiconductor film has an extremely low off-state current; even when an element has a channel width (W) of $1\times10^6$ μm and a channel length (L) of 10 μm, the off-state current can be less than or equal to the measurement limit of a semiconductor parameter analyzer, i.e., less than or equal to $1\times10^{-13}$ A, at a voltage (drain voltage) between source and drain electrodes of from 1 V to 10 V.

Accordingly, the transistor in which the channel region is formed in the highly purified intrinsic or substantially highly purified intrinsic oxide semiconductor film can have a small variation in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, an alkali metal, an alkaline earth metal, and the like are given.

Hydrogen contained in the oxide semiconductor film 108 reacts with oxygen bonded to a metal atom to form water, and also causes oxygen vacancy in a lattice from which oxygen is released (or a portion from which oxygen is released). Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor film that contains hydrogen is likely to be normally-on. Thus, hydrogen in the oxide semiconductor film 108 is preferably reduced as much as possible. Specifically, in the oxide semiconductor film 108, the concentration of hydrogen which is measured by secondary ion mass spectrometry (SIMS) is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$ and lower than or equal to $5 \times 10^{18}$ atoms/cm$^3$, still further preferably lower than or equal to $1 \times 10^{18}$ atoms/cm$^3$, yet further preferably lower than or equal to $5 \times 10^{17}$ atoms/cm$^3$, and even further preferably lower than or equal to $1 \times 10^{16}$ atoms/cm$^3$.

When silicon or carbon that is one of elements belonging to Group 14 is contained in the oxide semiconductor film 108, oxygen vacancy is increased in the oxide semiconductor film 108, and the oxide semiconductor film 108 becomes an n-type film. Thus, the concentration of silicon or carbon (the concentration is measured by SIMS) in the oxide semiconductor film 108 or the concentration of silicon or carbon (the concentration is measured by SIMS) in the vicinity of an interface with the oxide semiconductor film 108 is set to be lower than or equal to $2 \times 10^{18}$ atoms/cm$^3$, preferably lower than or equal to $2 \times 10^{17}$ atoms/cm$^3$.

Furthermore, the concentration of an alkali metal or an alkaline earth metal of the oxide semiconductor film 108, which is measured by SIMS, is lower than or equal to $1 \times 10^{18}$ atoms/cm$^3$, preferably lower than or equal to $2 \times 10^{16}$ atoms/cm$^3$. An alkali metal and an alkaline earth metal might generate carriers when bonded to an oxide semiconductor, in which case the off-state current of the transistor might be increased. Therefore, it is preferable to reduce the concentration of an alkali metal or an alkaline earth metal in the oxide semiconductor film 108.

When the oxide semiconductor film 108 contains nitrogen, the oxide semiconductor film 108 easily become n-type by generation of electrons serving as carriers and an increase of carrier density. A transistor including an oxide semiconductor film that contains nitrogen is likely to be normally-on. For this reason, nitrogen in the oxide semiconductor film is preferably reduced as much as possible; the concentration of nitrogen which is measured by SIMS is preferably set to be, for example, lower than or equal to $5 \times 10^{18}$ atoms/cm$^3$.

A structure or the like of an oxide semiconductor which can be used for the oxide semiconductor film 108 will be described in detail in Embodiment 3.

[Protective Insulating Film]

The insulating films 114, 116, and 118 function as a protective insulating film. The insulating films 114 and 116 contain oxygen, and the insulating film 118 contains nitrogen. Furthermore, the insulating film 114 is an insulating film that allows oxygen to pass through. Note that the insulating film 114 also functions as a film that relieves damage to the oxide semiconductor film 108 at the time of forming the insulating film 116 in a later step.

A silicon oxide film or a silicon oxynitride film with a thickness greater than or equal to 5 nm and less than or equal to 150 nm, preferably greater than or equal to 5 nm and less than or equal to 50 nm, can be used as the insulating film 114.

In addition, it is preferable that the number of defects in the insulating film 114 be small and typically, the spin density of a signal that appears at g=2.001 due to a dangling bond of silicon be lower than or equal to $3 \times 10^{17}$ spins/cm$^3$ by electron spin resonance (ESR) measurement. This is because if the density of defects in the insulating film 114 is high, oxygen is bonded to the defects and the amount of oxygen that passes through the insulating film 114 is decreased.

Note that not all oxygen entering the insulating film 114 from the outside move to the outside of the insulating film 114 and some oxygen remains in the insulating film 114. Furthermore, movement of oxygen occurs in the insulating film 114 in some cases in such a manner that oxygen enters the insulating film 114 and oxygen contained in the insulating film 114 moves to the outside of the insulating film 114. When an oxide insulating film that allows oxygen to pass through is formed as the insulating film 114, oxygen released from the insulating film 116 provided over the insulating film 114 can be moved to the oxide semiconductor film 108 through the insulating film 114.

The insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the above oxide insulating film.

Note that a silicon oxynitride film that releases a small amount of nitrogen oxide is a film of which the amount of released ammonia is larger than the amount of released nitrogen oxide in thermal desorption spectroscopy analysis; the amount of released ammonia is typically greater than or equal to $1 \times 10^{18}$/cm$^3$ and less than or equal to $5 \times 10^{19}$/cm$^3$. Note that the amount of released ammonia is the amount of ammonia released by heat treatment with which the surface temperature of the film becomes a temperature higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms levels in the insulating film 114, for example. The level is positioned in the energy gap of the oxide semiconductor film 108. Therefore, when nitrogen oxide is diffused to the vicinity of the interface between the insulating film 114 and the oxide semiconductor film 108, an electron is in some cases trapped by the level on the insulating film 114 side. As a result, the trapped electron remains in the vicinity of the interface between the insulating film 114 and the oxide semiconductor film 108; thus, the threshold voltage of the transistor is shifted in the positive direction.

Nitrogen oxide reacts with ammonia and oxygen in heat treatment. Since nitrogen oxide contained in the insulating film 114 reacts with ammonia contained in the insulating film 116 in heat treatment, nitrogen oxide contained in the insulating film 114 is reduced. Therefore, an electron is hardly trapped at the vicinity of the interface between the insulating film 114 and the oxide semiconductor film 108.

By using such an oxide insulating film, the insulating film 114 can reduce the shift in the threshold voltage of the transistor, which leads to a smaller change in the electrical characteristics of the transistor.

Note that in an ESR spectrum at 100 K or lower of the insulating film 114, by heat treatment of a manufacturing process of the transistor, typically heat treatment at a temperature higher than or equal to 300° C. and lower than the strain point of the substrate, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the smaller amount of nitrogen oxide the oxide insulating film contains.

The concentration of nitrogen of the above oxide insulating film measured by SIMS is lower than or equal to $6\times10^{20}$ atoms/cm$^3$.

The above oxide insulating film is formed by a PECVD method at a substrate temperature higher than or equal to 220° C., higher than or equal to 280° C., or higher than or equal to 350° C. using silane and dinitrogen monoxide, whereby a dense and hard film can be formed.

The insulating film 116 is formed using an oxide insulating film that contains oxygen at a higher proportion than oxygen in the stoichiometric composition. Part of oxygen is released by heating from the oxide insulating film that contains oxygen at a higher proportion than oxygen in the stoichiometric composition. The oxide insulating film that contains oxygen at a higher proportion than oxygen in the stoichiometric composition is an oxide insulating film of which the amount of released oxygen converted into oxygen molecules is greater than or equal to $8.0\times10^{14}$ atoms/cm$^3$, preferably greater than or equal to $1.0\times10^{15}$ atoms/cm$^3$ in TDS analysis. Note that the temperature of the film surface in the TDS analysis is higher than or equal to 100° C. and lower than or equal to 700° C., preferably higher than or equal to 100° C. and lower than or equal to 500° C.

A silicon oxide film or a silicon oxynitride film with a thickness greater than or equal to 30 nm and less than or equal to 500 nm, preferably greater than or equal to 50 nm and less than or equal to 400 nm, can be used as the insulating film 116.

It is preferable that the number of defects in the insulating film 116 be small, and typically, the spin density of a signal that appears at g=2.001 due to a dangling bond of silicon be lower than $1.5\times10^{18}$ spins/cm$^3$, further preferably lower than or equal to $1\times10^{18}$ spins/cm$^3$, by ESR measurement. Note that the insulating film 116 is provided more apart from the oxide semiconductor film 108 than the insulating film 114 is; thus, the insulating film 116 may have higher defect density than the insulating film 114.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this structure. For example, a single-layer structure of either one of the insulating films 114 and 116 may be employed.

The insulating film 118 contains nitrogen. Alternatively, the insulating film 118 contains nitrogen and silicon. The insulating film 118 has a function of blocking oxygen, hydrogen, water, an alkali metal, an alkaline earth metal, or the like. The provision of the insulating film 118 makes it possible to prevent outward diffusion of oxygen from the oxide semiconductor film 108, outward diffusion of oxygen contained in the insulating films 114 and 116, and entry of hydrogen, water, or the like into the oxide semiconductor film 108 from the outside. The insulating film 118 can be formed using a nitride insulating film, for example. The nitride insulating film is formed using silicon nitride, silicon nitride oxide, aluminum nitride, aluminum nitride oxide, or the like. Note that instead of the nitride insulating film having a blocking effect against oxygen, hydrogen, water, an alkali metal, an alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

Note that the above-described various films such as the conductive films, the insulating films, and the oxide semiconductor film can be formed by a sputtering method, a chemical vapor deposition (CVD) method, a vacuum evaporation method, a pulsed laser deposition (PLD) method, or the like. Alternatively, the above-described various films such as the conductive films, the insulating films, and the oxide semiconductor film can be formed by a plasma-enhanced chemical vapor deposition (PECVD) method, a thermal CVD method, or an atomic layer deposition (ALD) method. As an example of a thermal CVD method, a metal organic chemical vapor deposition (MOCVD) method can be given. Further alternatively, the above-described various films such as the conductive films, the insulating films, and the oxide semiconductor film can be formed by a coating method or a printing method.

A thermal CVD method has an advantage that no defect due to plasma damage is generated because it does not utilize plasma for forming a film.

Deposition by a thermal CVD method may be performed in such a manner that a source gas and an oxidizer are supplied at a time to the chamber, in which the pressure is set to an atmospheric pressure or a reduced pressure, and react with each other in the vicinity of the substrate or over the substrate.

Deposition by an ALD method may be performed in such a manner that source gases for reaction are sequentially introduced into the chamber, in which the pressure is set to an atmospheric pressure or a reduced pressure, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The above-described variety of films such as the conductive film, the insulating film, the oxide semiconductor film, and the metal oxide film in this embodiment can be formed by an ALD method or a thermal CVD method such as an MOCVD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source gas which is obtained by vaporizing liquid containing a solvent and a hafnium precursor compound (hafnium alkoxide or hafnium amide such as tetrakis(dimethylamide)hafnium (TDMAH)) are used. The chemical formula of tetrakis(dimethylamide)hafnium is $Hf[N(CH_3)_2]_4$. Examples of another material liquid include tetrakis(ethylmethylamide) hafnium.

For example, in the case where an aluminum oxide film is formed by a deposition apparatus using an ALD method, two kinds of gases, e.g., $H_2O$ as an oxidizer and a source gas which is obtained by vaporizing liquid containing a solvent and an aluminum precursor compound (e.g., trimethylaluminum (TMA)) are used. The chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus using an ALD method, a $WF_6$ gas and a $B_2H_6$ gas are used to form an initial tungsten film, and then a $WF_6$ gas and an $H_2$ gas are used to form a tungsten film. Note that an $SiH_4$ gas may be used instead of a $B_2H_6$ gas.

For example, in the case where an oxide semiconductor film, e.g., an In—Ga—Zn—O film is formed with a deposition apparatus using an ALD method, an $In(CH_3)_3$ gas and an $O_3$ gas are used to form an In—O layer, a $Ga(CH_3)_3$ gas and an $O_3$ gas are used to form a Ga—O layer, and then a $Zn(CH_3)_2$ gas and an $O_3$ gas are introduced to form a Zn—O layer. Note that the order of these layers is not limited to this example. A mixed compound layer such as an In—Ga—O layer, an In—Zn—O layer, or a Ga—Zn—O layer may be formed by mixing any of these gases. Note that although an $H_2O$ gas which is obtained by bubbling with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

<2-3. Structure Example 2 of Transistor>

A structural example which is different from the transistor 100 in FIGS. 14A to 14C will be described with reference to FIGS. 15A to 15C.

Figure 15A:
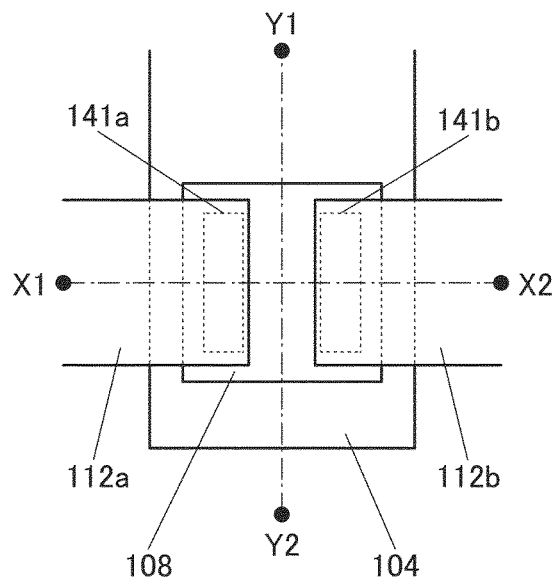
FIGS. 15A to 15C are a top view and cross-sectional views illustrating one embodiment of a transistor.

FIG. 15A is a top view of a transistor 150 of the semiconductor device of one embodiment of the present invention. FIG. 15B is a cross-sectional view taken along the dashed dotted line X1-X2 in FIG. 15A, and FIG. 15C is a cross-sectional view taken along the dashed dotted line Y1-Y2 in FIG. 15A.

The transistor 150 includes the conductive film 104 functioning as a gate electrode over the substrate 102, the insulating film 106 over the substrate 102 and the conductive film 104, the insulating film 107 over the insulating film 106, the oxide semiconductor film 108 over the insulating film 107, the insulating film 114 over the oxide semiconductor film 108, the insulating film 116 over the insulating film 114, the conductive film 112a functioning as a source electrode electrically connected to the oxide semiconductor film 108 through an opening 141a provided in the insulating films 114 and 116, and the conductive film 112b functioning as a drain electrode electrically connected to the oxide semiconductor film 108 through an opening 141b provided in the insulating films 114 and 116. The insulating film 118 is provided over the transistor 150, specifically, over the conductive films 112a and 112b and the insulating film 116. The insulating films 114 and 116 function as a protective insulating film for the oxide semiconductor film 108. The insulating film 118 functions as a protective insulating film for the transistor 150.

Figure 15B:
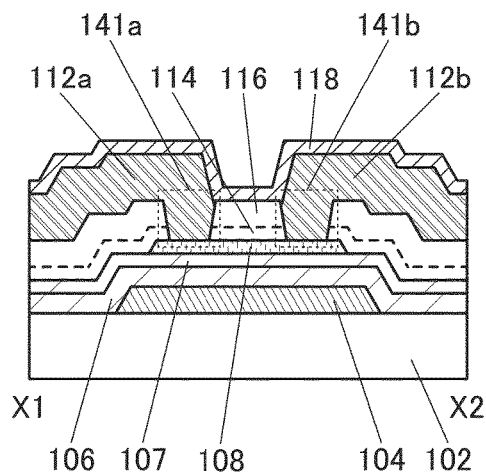
Figure 15C:
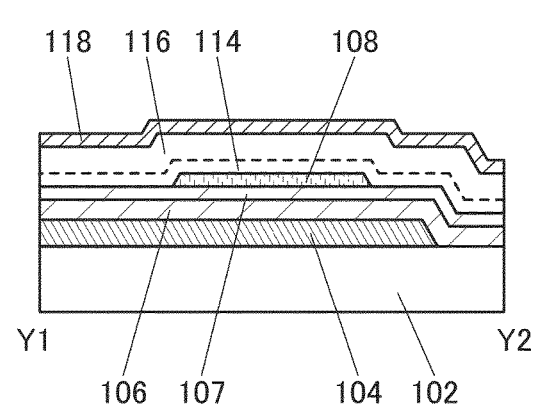

Although the above-described transistor 100 has a channel-etched structure, the transistor 150 in FIGS. 15A to 15C has a channel-protective structure. Thus, the semiconductor device of one embodiment of the present invention can have either the channel-etched structure or the channel-protective structure.

<2-4. Structure Example 3 of Transistor>

A structural example which is different from the transistor 150 in FIGS. 15A to 15C will be described with reference to FIGS. 16A to 16C.

Figure 16A:
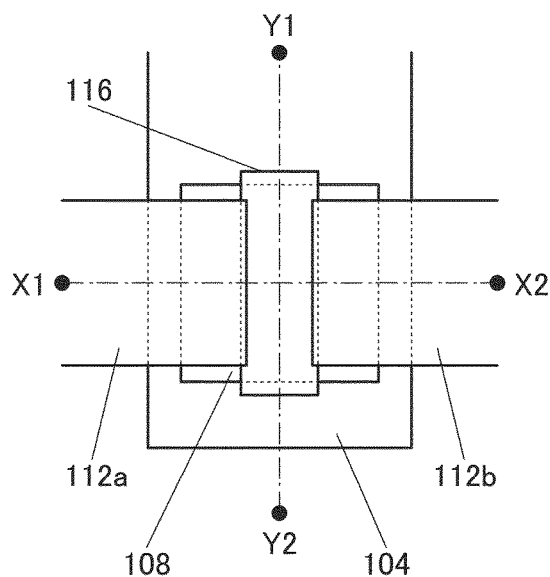
FIGS. 16A to 16C are a top view and cross-sectional views illustrating one embodiment of a transistor.
Figure 16B:
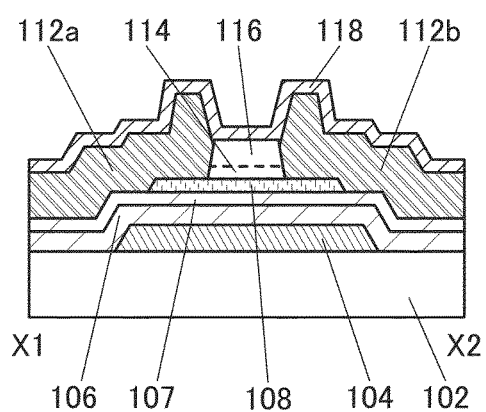
Figure 16C:
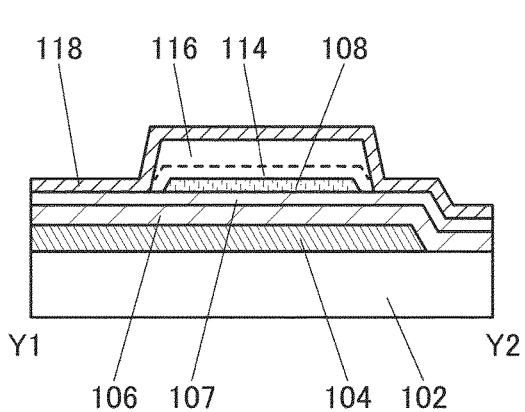

FIG. 16A is a top view of a transistor 160 of the semiconductor device of one embodiment of the present invention. FIG. 16B is a cross-sectional view taken along the dashed dotted line X1-X2 in FIG. 16A, and FIG. 16C is a cross-sectional view taken along the dashed dotted line Y1-Y2 in FIG. 16A.

The transistor 160 includes the conductive film 104 functioning as a gate electrode over the substrate 102, the insulating film 106 over the substrate 102 and the conductive film 104, the insulating film 107 over the insulating film 106, the oxide semiconductor film 108 over the insulating film 107, the insulating film 114 over the oxide semiconductor film 108, the insulating film 116 over the insulating film 114, the conductive film 112a functioning as a source electrode electrically connected to the oxide semiconductor film 108, and the conductive film 112b functioning as a drain electrode electrically connected to the oxide semiconductor film 108. The insulating film 118 is provided over the transistor 160, specifically, over the conductive films 112a and 112b and the insulating film 116. The insulating films 114 and 116 function as a protective insulating film for the oxide semiconductor film 108. The insulating film 118 functions as a protective insulating film for the transistor 160.

The transistor 160 is different from the transistor 150 in FIGS. 15A to 15C in the shapes of the insulating films 114 and 116. Specifically, the insulating films 114 and 116 of the transistor 160 have island shapes and are provided over a channel region of the oxide semiconductor film 108. The other components are similar to those of the transistor 150, and an effect similar to that of the transistor 150 can be obtained.

<2-5. Structure Example 4 of Transistor>

A structural example which is different from the transistor 100 in FIGS. 14A to 14C will be described with reference to FIGS. 17A to 17C.

Figure 17A:
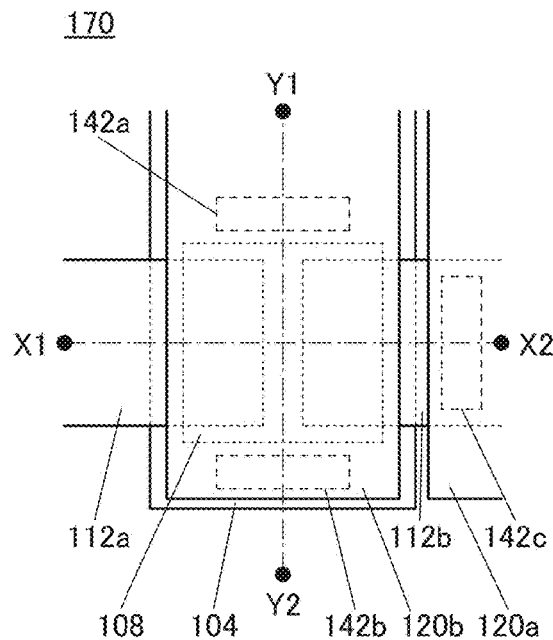
FIGS. 17A to 17C are a top view and cross-sectional views illustrating one embodiment of a transistor.

FIG. 17A is a top view of a transistor 170 of the semiconductor device of one embodiment of the present invention. FIG. 17B is a cross-sectional view taken along the dashed dotted line X1-X2 in FIG. 17A, and FIG. 17C is a cross-sectional view taken along the dashed dotted line Y1-Y2 in FIG. 17A.

The transistor 170 includes the conductive film 104 functioning as a first gate electrode over the substrate 102, the insulating film 106 over the substrate 102 and the conductive film 104, the insulating film 107 over the insulating film 106, the oxide semiconductor film 108 over the insulating film 107, the conductive film 112a functioning as a source electrode electrically connected to the oxide semiconductor film 108, the conductive film 112b functioning as a drain electrode electrically connected to the oxide semiconductor film 108, the insulating film 114 over the oxide semiconductor film 108 and the conductive films 112a and 112b, the insulating film 116 over the insulating film 114, oxide semiconductor films 120a and 120b over the insulating film 116, and the insulating film 118 over the insulating film 114 and oxide semiconductor films 120a and 120b.

Furthermore, the insulating films 106 and 107 function as a first gate insulating film of the transistor 170. The insulating films 114 and 116 function as a second gate insulating film of the transistor 170. The insulating film 118 functions as a protective insulating film for the transistor 170. The oxide semiconductor film 120a functions as, for example, a pixel electrode used in a display device. The oxide semiconductor film 120a is connected to the conductive film 112b through an opening 142c provided in the insulating films 114 and 116. The oxide semiconductor film 120b functions as a second gate electrode (also referred to as a back gate electrode).

Figure 17B:
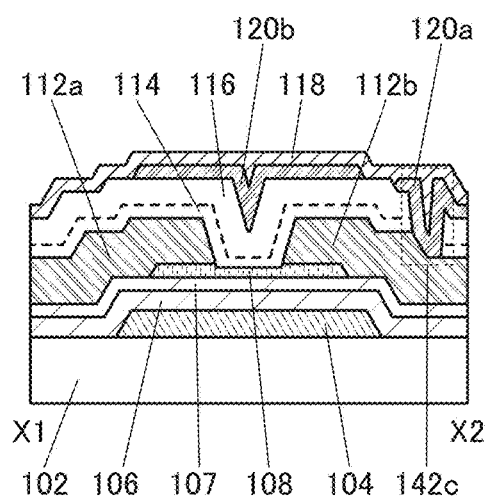
Figure 17C:
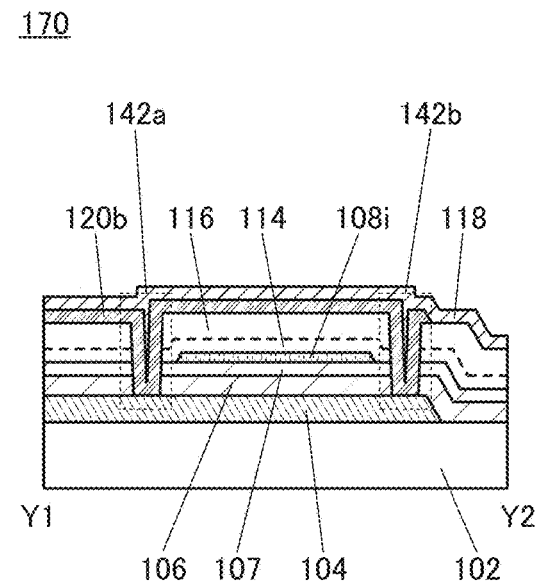

As illustrated in FIG. 17C, the oxide semiconductor film 120b is connected to the conductive film 104 functioning as the first gate electrode through openings 142a and 142b provided in the insulating films 106, 107, 114, and 116. Accordingly, the oxide semiconductor film 120b and the conductive film 104 are supplied with the same potential.

Note that although the structure in which the openings 142a and 142b are provided so that the oxide semiconductor film 120b and the conductive film 104 are connected to each other is described in this embodiment, one embodiment of the present invention is not limited thereto. For example, a structure in which only one of the openings 142a and 142b is provided so that the oxide semiconductor film 120b and the conductive film 104 are connected to each other, or a structure in which the openings 142a and 142b are not provided and the oxide semiconductor film 120b and the conductive film 104 are not connected to each other may be employed. Note that in the case where the oxide semiconductor film 120b and the conductive film 104 are not connected to each other, it is possible to apply different potentials to the oxide semiconductor film 120b and the conductive film 104.

As illustrated in FIG. 17B, the oxide semiconductor film 108 is positioned to be opposite each of the conductive film 104 functioning as the first gate electrode and the oxide semiconductor film 120b functioning as the second gate electrode, and is provided between the two conductive films functioning as gate electrodes. The lengths in the channel length direction and the channel width direction of the oxide semiconductor film 120b functioning as the second gate electrode are longer than those in the channel length direction and the channel width direction of the oxide semiconductor film 108. The whole oxide semiconductor film 108 is covered with the oxide semiconductor film 120b with the insulating films 114 and 116 provided therebetween. In addition, since the oxide semiconductor film 120b functioning as the second gate electrode is connected to the conductive film 104 functioning as the first gate electrode through the openings 142a and 142b provided in the insulating films 106, 107, 114, and 116; a side surface of the oxide semiconductor film 108 in the channel width direction faces the oxide semiconductor film 120b functioning as the second gate electrode with the insulating films 114 and 116 provided therebetween.

In other words, in the channel width direction of the transistor 170, the conductive film 104 functioning as the first gate electrode and the oxide semiconductor film 120b functioning as the second gate electrode are connected to each other through the openings provided in the insulating films 106 and 107 functioning as the first gate insulating film and the insulating films 114 and 116 functioning as a second gate insulating film; and the conductive film 104 and the oxide semiconductor film 120b surround the oxide semiconductor film 108 with the insulating films 106 and 107 functioning as the first gate insulating film and the insulating films 114 and 116 functioning as the second gate insulating film provided therebetween.

Such a structure makes it possible that the oxide semiconductor film 108 included in the transistor 170 is electrically surrounded by electric fields of the conductive film 104 functioning as the first gate electrode and the oxide semiconductor film 120b functioning as the second gate electrode. The device structure of a transistor, like that of the transistor 170, in which electric fields of a first gate electrode and a second gate electrode electrically surround an oxide semiconductor film where a channel region is formed can be referred to as a surrounded channel (s-channel) structure.

Since the transistor 170 has the s-channel structure, an electric field for inducing a channel can be effectively applied to the oxide semiconductor film 108 by the conductive film 104 functioning as the first gate electrode; therefore, the current drive capability of the transistor 170 can improve and high on-state current characteristics can be obtained. In addition, since the on-state current can be increased, it is possible to reduce the size of the transistor 170. In addition, since the transistor 170 has a structure in which the oxide semiconductor film 108 is surrounded by the conductive film 104 functioning as the first gate electrode and the oxide semiconductor film 120b functioning as the second gate electrode, the mechanical strength of the transistor 170 can be increased.

<2-6. Structure Example 5 of Transistor>

A structural example which is different from the transistor 100 in FIGS. 14A to 14C will be described with reference to FIGS. 18A to 18C.

Figure 18A:
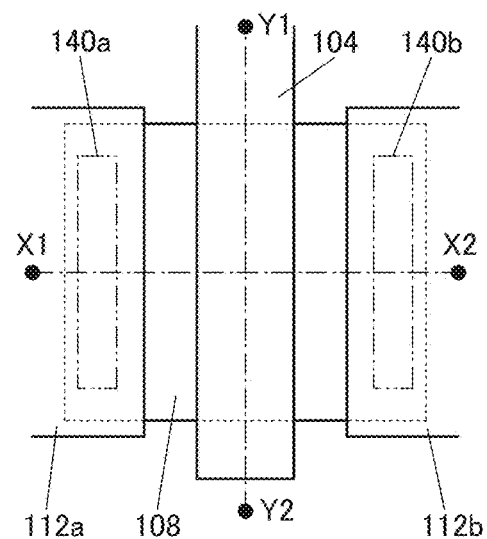
FIGS. 18A to 18C are a top view and cross-sectional views illustrating one embodiment of a transistor.
Figure 18B:
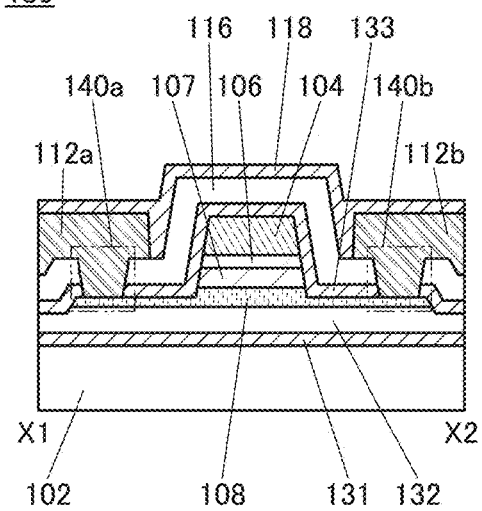
Figure 18C:
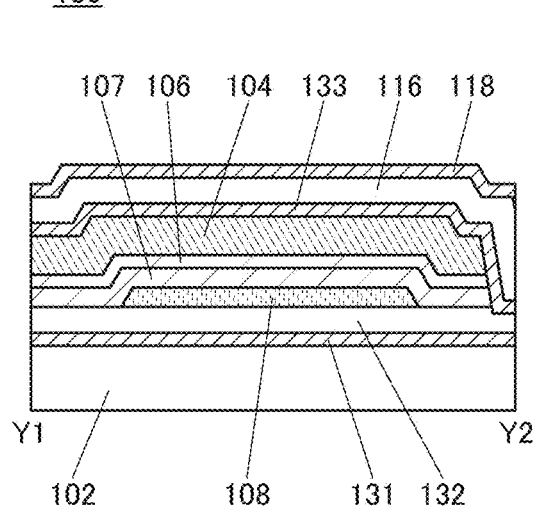

FIG. 18A is a top view of a transistor 180 of the semiconductor device of one embodiment of the present invention. FIG. 18B is a cross-sectional view taken along the dashed dotted line X1-X2 in FIG. 18A, and FIG. 18C is a cross-sectional view taken along the dashed dotted line Y1-Y2 in FIG. 18A.

The transistor 180 includes an insulating film 131 formed over the substrate 102, an insulating film 132 over the insulating film 131, the oxide semiconductor film 108 over the insulating film 132, the insulating film 107 over the oxide semiconductor film 108, the insulating film 106 over the insulating film 107, the conductive film 104 overlapping with the oxide semiconductor film 108 with the insulating films 106 and 107 provided therebetween, an insulating film 133 covering the oxide semiconductor film 108, the insulating film 132, and the conductive film 104, the insulating film 116 over the insulating film 133, the conductive film 112a connected to the oxide semiconductor film 108 through an opening 140a provided in the insulating films 133 and 116, and the conductive film 112b connected to the oxide semiconductor film 108 through an opening 140b provided in the insulating films 133 and 116. Note that the insulating film 118 covering the insulating film 116, the conductive film 104, and the conductive films 112a and 112b may be provided over the transistor 180.

In the transistor 180, the conductive film 104 functions as a gate electrode (also referred to as a top-gate electrode), the conductive film 112a functions as one of source and drain electrodes, and the conductive film 112b functions as the other of the source and drain electrodes. Furthermore, in the transistor 180, the insulating films 131 and 132 function as a base film of the oxide semiconductor film 108, and the insulating films 107 and 106 function as a gate insulating film. As illustrated in FIGS. 18A to 18C, the transistor 180 is a single-gate transistor having a top-gate structure. As described above, transistors having a variety of structures such as a bottom-gate structure, a dual-gate structure, and a top-gate structure can be employed for the semiconductor device of one embodiment of the present invention.

<2-7. Structure Example 6 of Transistor>

A structural example which is different from the transistor 100 in FIGS. 14A to 14C will be described with reference to FIGS. 19A to 19D.

FIGS. 19A to 19D each illustrate a cross-sectional view of a modification example of the transistor 100 in FIGS. 14B and 14C.

Figure 19A:
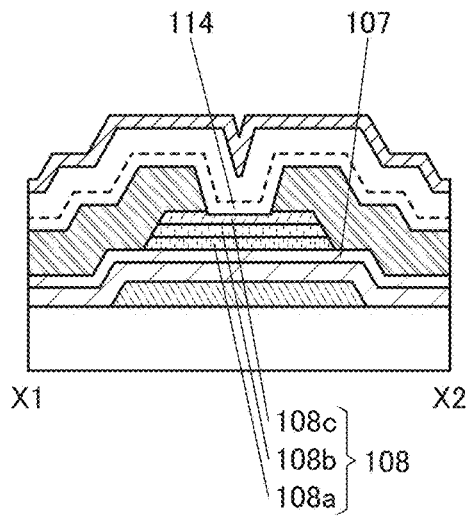
FIGS. 19A to 19D are cross-sectional views each illustrating one embodiment of a transistor.
Figure 19B:
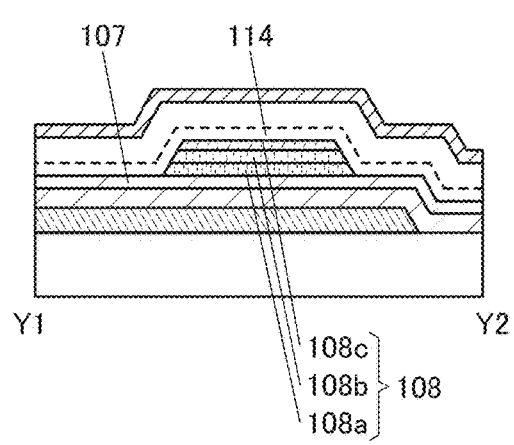

A transistor 100A illustrated in FIGS. 19A and 19B has the same structure as the transistor 100 in FIGS. 14B and 14C except that the oxide semiconductor film 108 has a three-layer structure. Specifically, the oxide semiconductor film 108 of the transistor 100A includes oxide semiconductor films 108a, 108b, and 108c.

Figure 19C:
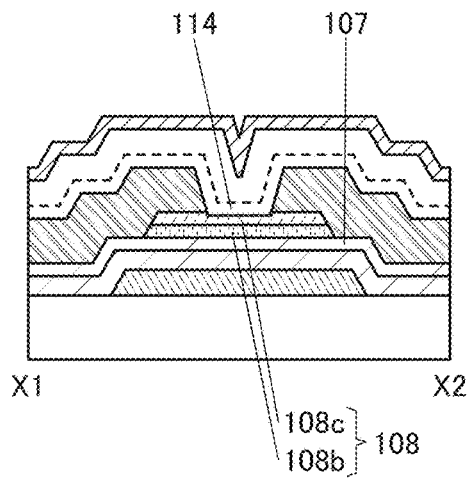
Figure 19D:
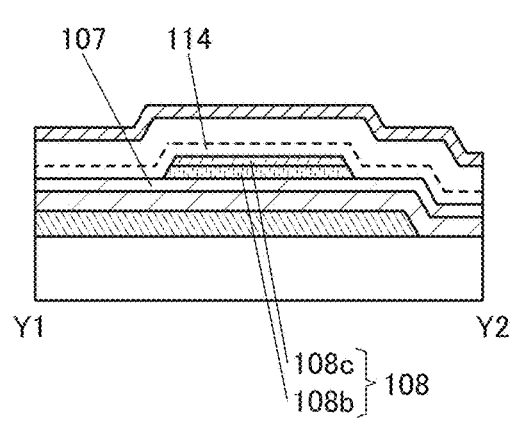

A transistor 100B illustrated in FIGS. 19C and 19D has the same structure as the transistor 100 in FIGS. 14B and 14C except that the oxide semiconductor film 108 has a two-layer structure. Specifically, the oxide semiconductor film 108 of the transistor 100B includes the oxide semiconductor films 108b and 108c.

Here, a band structure including the oxide semiconductor film 108 and insulating films in contact with the oxide semiconductor film 108 is described with reference to FIGS. 20A and 20B.

Figure 20A:
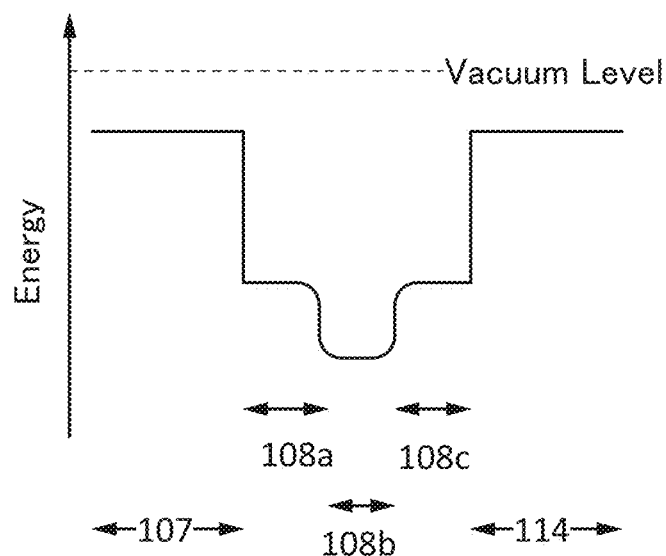
FIGS. 20A and 20B each illustrate a band structure of an oxide semiconductor.

FIG. 20A shows an example of a band structure in the thickness direction of a stack including the insulating film 107, the oxide semiconductor films 108a, 108b, and 108c, and the insulating film 114. FIG. 20B shows an example of a band structure in the thickness direction of a stack including the insulating film 107, the oxide semiconductor films 108b and 108c, and the insulating film 114. For easy understanding, energy level of the conduction band minimum ($E_c$) of each of the insulating film 107, the oxide semiconductor films 108a, 108b, and 108c, and the insulating film 114 is shown in the band structures.

In FIG. 20A, a silicon oxide film is used as each of the insulating films 107 and 114, an oxide semiconductor film formed using a metal oxide target having an atomic ratio of metal elements of In:Ga:Zn=1:3:2 is used as the oxide semiconductor film 108a, an oxide semiconductor film formed using a metal oxide target having an atomic ratio of metal elements of In:Ga:Zn=1:1:1 is used as the oxide semiconductor film 108b, and an oxide semiconductor film formed using a metal oxide target having an atomic ratio of metal elements of In:Ga:Zn=1:3:2 is used as the oxide semiconductor film 108c.

Figure 20B:
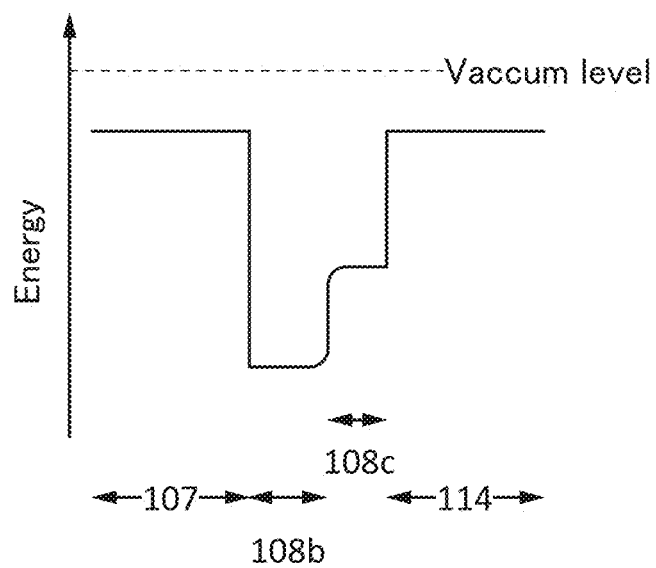

In the band structure of FIG. 20B, a silicon oxide film is used as each of the insulating films 107 and 114, an oxide semiconductor film formed using a metal oxide target having an atomic ratio of metal elements of In:Ga:Zn=1:1:1 is used as the oxide semiconductor film 108b, and a metal oxide film formed using a metal oxide target having an atomic ratio of metal elements of In:Ga:Zn=1:3:2 is used as the oxide semiconductor film 108c.

As illustrated in FIGS. 20A and 20B, the energy level of the conduction band minimum gradually varies between the oxide semiconductor films 108a and 108b and between the oxide semiconductor films 108b and 108c. In other words, the energy level of the conduction band minimum is continuously varied or continuously connected. To obtain such a band structure, there exists no impurity, which forms a defect state such as a trap center or a recombination center, at the interface between the oxide semiconductor films 108a and 108b or at the interface between the oxide semiconductor films 108b and 108c.

To form a continuous junction between the oxide semiconductor films 108a and 108b and between the oxide semiconductor films 108b and 108c, the films may be formed successively without exposure to the air by using a multi-chamber deposition apparatus (sputtering apparatus) provided with a load lock chamber.

With the band structure of FIG. 20A or 20B, the oxide semiconductor film 108b serves as a well, and a channel region is formed in the oxide semiconductor film 108b in the transistor with the stacked-layer structure.

Note that with the above stacked-layer structure, trap states, which can be formed in the oxide semiconductor film 108b in the case where the oxide semiconductor films 108a and 108c are not formed, are formed in the oxide semiconductor film 108a and/or the oxide semiconductor film 108c. Therefore, the trap states can be distanced away from the oxide semiconductor film 108b.

In addition, the trap states might be more distant from the vacuum level than the energy level of the conduction band minimum ($E_c$) of the oxide semiconductor film 108b functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the trap states be closer to the vacuum level than the energy level of the conduction band minimum ($E_c$) of the oxide semiconductor film 108b. Such a structure inhibits accumulation of electrons in the trap states. As a result, the on-state current and the field-effect mobility of the transistor can be increased.

In FIGS. 20A and 20B, the energy level of the conduction band minimum of each of the oxide semiconductor films 108a and 108c is closer to the vacuum level than that of the oxide semiconductor film 108b. Typically, a difference in energy level between the conduction band minimum of the oxide semiconductor film 108b and the conduction band minimum of each of the oxide semiconductor films 108a and 108c is 0.15 eV or more or 0.5 eV or more and 2 eV less or 1 eV or less. That is, the difference between the electron affinity of each of the oxide semiconductor films 108a and 108c and the electron affinity of the oxide semiconductor film 108b is 0.15 eV or more or 0.5 eV or more and 2 eV or less or 1 eV or less.

In such a structure, the oxide semiconductor film 108b serves as a main path of current and functions as a channel region. In addition, since the oxide semiconductor films 108a and 108c each include one or more metal elements included in the oxide semiconductor film 108b in which a channel region is formed, interface scattering is less likely to occur at the interface between the oxide semiconductor films 108a and 108b or at the interface between the oxide semiconductor films 108b and 108c. Thus, the transistor can have high field-effect mobility because the movement of carriers is not hindered at the interface.

To prevent each of the oxide semiconductor films 108a and 108c from functioning as part of a channel region, a material having sufficiently low conductivity is used for the oxide semiconductor films 108a and 108c. Alternatively, a material which has a smaller electron affinity (a difference in energy level between the vacuum level and the conduction band minimum) than the oxide semiconductor film 108b and has a difference in energy level in the conduction band minimum from the oxide semiconductor film 108b (band offset) is used for the oxide semiconductor films 108a and 108c. Furthermore, to inhibit generation of a difference between threshold voltages due to the value of the drain voltage, it is preferable to form the oxide semiconductor films 108a and 108c using a material whose energy level of the conduction band minimum is closer to the vacuum level than that of the oxide semiconductor film 108b. For example, a difference in energy level between the conduction band minimum of the oxide semiconductor film 108b and the conduction band minimum of the oxide semiconductor films 108a and 108c is preferably 0.2 eV or more and further preferably 0.5 eV or more.

It is preferable that the oxide semiconductor films 108a and 108c not have a spinel crystal structure. This is because if the oxide semiconductor films 108a and 108c have a spinel crystal structure, constituent elements of the conductive films 112a and 112b might be diffused to the oxide semiconductor film 108b at the interface between the spinel crystal structure and another region. Note that each of the oxide semiconductor film 108a and 108c is preferably a CAAC-OS, which is described later, in which case a higher blocking property against constituent elements of the conductive films 112a and 112b, for example, copper elements is obtained.

The thickness of each of the oxide semiconductor films 108a and 108c is greater than or equal to a thickness that is capable of inhibiting diffusion of the constituent elements of the conductive films 112a and 112b to the oxide semiconductor film 108b, and less than a thickness that inhibits supply of oxygen from the insulating film 114 to the oxide semiconductor film 108b. For example, when the thickness of each of the oxide semiconductor films 108a and 108c is greater than or equal to 10 nm, diffusion of the constituent elements of the conductive films 112a and 112b to the oxide semiconductor film 108b can be inhibited. When the thickness of each of the oxide semiconductor films 108a and 108c is less than or equal to 100 nm, oxygen can be effectively supplied from the insulating films 114 and 116 to the oxide semiconductor film 108b.

When the oxide semiconductor films 108a and 108c are each an In-M-Zn oxide in which the atomic ratio of the element M (M is Ti, Ga, Y, Zr, La, Ce, Nd, Sn, or Hf) is higher than that of In, the energy gap of each of the oxide semiconductor films 108a and 108c can be large and the electron affinity thereof can be small. Therefore, a difference in electron affinity between the oxide semiconductor film 108b and each of the oxide semiconductor films 108a and 108c may be controlled by the proportion of the element M. Furthermore, oxygen vacancy is less likely to be generated in the oxide semiconductor film in which the atomic ratio of Ti, Ga, Y, Zr, La, Ce, Nd, Sn, or Hf is higher than that of In because Ti, Ga, Y, Zr, La, Ce, Nd, Sn, and Hf each are a metal element that is strongly bonded to oxygen.

When an In-M-Zn oxide is used for the oxide semiconductor films 108a and 108c, the proportions of In and M, not taking Zn and O into consideration, is preferably as follows: the atomic percentage of In is less than 50 atomic % and the atomic percentage of M is greater than 50 atomic %; and further preferably, the atomic percentage of In is less than 25 atomic % and the atomic percentage of M is greater than 75 atomic %. Alternatively, a gallium oxide film may be used as each of the oxide semiconductor films 108a and 108c.

Furthermore, in the case where each of the oxide semiconductor films 108a, 108b, and 108c is an In-M-Zn oxide, the proportion of M atoms in each of the oxide semiconductor films 108a and 108c is higher than that in the oxide semiconductor film 108b. Typically, the proportion of M atoms in each of the oxide semiconductor films 108a and 108c is 1.5 or more times, preferably twice or more times and further preferably three or more times, as high as that in the oxide semiconductor film 108b.

Furthermore, in the case where the oxide semiconductor films 108a, 108b, and 108c are each an In-M-Zn oxide, when the oxide semiconductor film 108b has an atomic ratio of In:M:Zn=$x_1$:$y_1$:$z_1$ and the oxide semiconductor films 108a and 108c each have an atomic ratio of In:M:Zn=$x_2$:$y_2$:$z_2$, $y_2/x_2$ is larger than $y_1/x_1$, preferably $y_2/x_2$ is 1.5 or more times as large as $y_1/x_1$, further preferably $y_2/x_2$ is two or more times as large as $y_1/x_1$, and still further preferably $y_2/x_2$ is three or more times or four or more times as large as $y_1/x_1$. At this time, $y_1$ is preferably greater than or equal to $x_1$ in the oxide semiconductor film 108b, because stable electrical characteristics of a transistor including the oxide semiconductor film 108b can be achieved. However, when $y_1$ is three or more times as large as $x_1$, the field-effect mobility of the transistor including the oxide semiconductor film 108b is reduced. Accordingly, $y_1$ is preferably smaller than three times $x_1$.

In the case where the oxide semiconductor film 108b is an In-M-Zn oxide and a target having the atomic ratio of metal elements of In:M:Zn=$x_1$:$y_1$:$z_1$ is used for depositing the oxide semiconductor film 108b, $x_1/y_1$ is preferably greater than or equal to ⅓ and less than or equal to 6 and further preferably greater than or equal to 1 and less than or equal to 6, and $z_1/y_1$ is preferably greater than or equal to ⅓ and less than or equal to 6 and further preferably greater than or equal to 1 and less than or equal to 6. Note that when $z_1/y_1$ is greater than or equal to 1 and less than or equal to 6, a CAAC-OS to be described later is easily formed as the oxide semiconductor film 108b. Typical examples of the atomic ratio of the metal elements of the target are In:M:Zn=1:1:1, In:M:Zn=1:1:1.2, and In:M:Zn=3:1:2.

In the case where the oxide semiconductor films 108a and 108c are each an In-M-Zn oxide and a target having an atomic ratio of metal elements of In:M:Zn=$x_2$:$y_2$:$z_2$ is used for depositing the oxide semiconductor films 108a and 108c, $x_2/y_2$ is preferably less than $x_1/y_1$, and $z_2/y_2$ is preferably greater than or equal to ⅓ and less than or equal to 6 and further preferably greater than or equal to 1 and less than or equal to 6. When the atomic ratio of M with respect to indium is high, the energy gap of the oxide semiconductor films 108a and 108c can be large and the electron affinity thereof can be small; therefore, $y_2/x_2$ is preferably higher than or equal to 3 or higher than or equal to 4. Typical examples of the atomic ratio of the metal elements of the target include In:M:Zn=1:3:2, In:M:Zn=1:3:4, InM:Zn=1:3:5, In:M:Zn=1:3:6, In:M:Zn=1:4:2, In:M:Zn=1:4:4, In:M:Zn=1:4:5, and In:M:Zn=1:5:5.

Furthermore, in the case where the oxide semiconductor films 108a and 108c are each an In-M oxide, when a divalent metal element (e.g., zinc) is not included as M, the oxide semiconductor films 108a and 108c which do not include a spinel crystal structure can be formed. As the oxide semiconductor films 108a and 108c, for example, an In—Ga oxide film can be used. The In—Ga oxide film can be formed by a sputtering method using an In—Ga metal oxide target (In:Ga=7:93), for example. To deposit the oxide semiconductor films 108a and 108c by a sputtering method using DC discharge, on the assumption that an atomic ratio of In:M is x:y, y/(x+y) is preferably less than or equal to 0.96 and further preferably less than or equal to 0.95, for example, 0.93.

In each of the oxide semiconductor films 108a, 108b, and 108c, the proportions of the atoms in the above atomic ratio vary in a range of ±40%.

The structures of the transistors of this embodiment can be freely combined with each other.

<2-8. Method 1 for Manufacturing Semiconductor Device>

Next, a method for manufacturing the transistor 100 will be described with reference to FIGS. 21A to 21D and FIGS. 22A and 22B. FIGS. 21A to 21D and FIGS. 22A and 22B are cross-sectional views illustrating a method for manufacturing a semiconductor device.

Figure 21A:
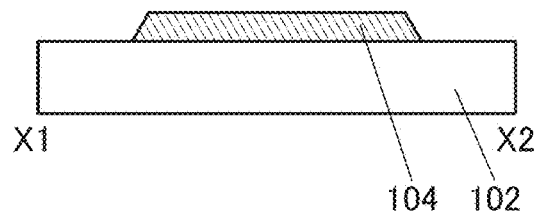
FIGS. 21A to 21D are cross-sectional views showing an example of a manufacturing process of a semiconductor device.

First, a conductive film is formed over the substrate 102 and processed through a lithography process and an etching process, whereby the conductive film 104 functioning as the gate electrode is formed (see FIG. 21A).

In this embodiment, a glass substrate is used as the substrate 102, and as the conductive film 104 functioning as the gate electrode, a 100-nm-thick tungsten film is formed by a sputtering method.

Figure 21B:
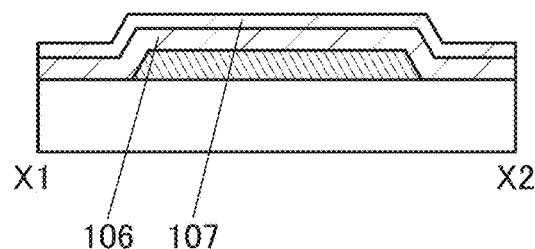

Then, the insulating films 106 and 107 functioning as the gate insulating film are formed over the conductive film 104 (see FIG. 21B).

In this embodiment, a 400-nm-thick silicon nitride film as the insulating film 106 and a 50-nm-thick silicon oxynitride film as the insulating film 107 are formed by a PECVD method.

Note that the insulating film 106 can have a stacked-layer structure of silicon nitride films. Specifically, the insulating film 106 can have a three-layer structure of a first silicon nitride film, a second silicon nitride film, and a third silicon nitride film. An example of the three-layer structure is as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and the power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and the power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and the power of 2000 W is supplied using a 27.12 MHz high-frequency power source.

Note that the first silicon nitride film, the second silicon nitride film, and the third silicon nitride film can each be formed at a substrate temperature of 350° C.

When the insulating film 106 has the three-layer structure of silicon nitride films, for example, in the case where a conductive film including copper (Cu) is used as the conductive film 104, the following effect can be obtained.

The first silicon nitride film can inhibit diffusion of a copper (Cu) element from the conductive film 104. The second silicon nitride film has a function of releasing hydrogen and can improve withstand voltage of the insulating film functioning as the gate insulating film. The third silicon nitride film releases a small amount of hydrogen and can inhibit diffusion of hydrogen released from the second silicon nitride film.

The insulating film 107 is preferably an insulating film containing oxygen to improve characteristics of an interface with the oxide semiconductor film 108 formed later.

Figure 21C:
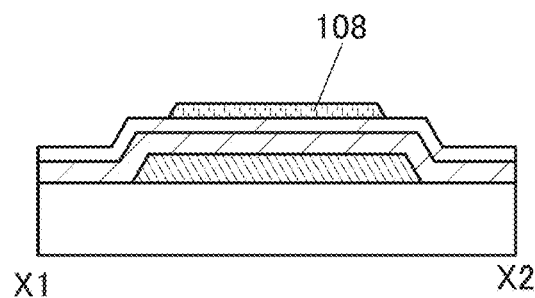

Next, the oxide semiconductor film 108 is formed over the insulating film 107 (see FIG. 21C).

In this embodiment, an oxide semiconductor film is formed by a sputtering method using an In—Ga—Zn metal oxide target (having an atomic ratio of In:Ga:Zn=1:1:1.2), a mask is formed over the oxide semiconductor film through a lithography process, and the oxide semiconductor film is processed into a desired region, whereby the oxide semiconductor film 108 having an island shape is formed.

After the oxide semiconductor film 108 is formed, heat treatment may be performed at a temperature higher than or equal to 150° C. and lower than the strain point of the substrate, preferably higher than or equal to 200° C. and lower than or equal to 450° C. and further preferably higher than or equal to 300° C. and lower than or equal to 450° C. The heat treatment performed here serves as one kind of treatment for increasing the purity of the oxide semiconductor film and can reduce hydrogen, water, and the like included in the oxide semiconductor film 108. Note that the heat treatment for the purpose of reducing hydrogen, water, and the like may be performed before the oxide semiconductor film 108 is processed into an island shape.

A gas baking furnace, an electric furnace, an RTA apparatus, or the like can be used for the heat treatment performed on the oxide semiconductor film 108. With the use of an RTA apparatus, the heat treatment can be performed at a temperature higher than or equal to the strain point of the substrate if the heating time is short. Therefore, the heat treatment time can be shortened.

The heat treatment may be performed on the oxide semiconductor film 108 in an atmosphere of a nitrogen gas, an oxygen gas, clean dry air (also referred to as CDA, which is an air with a water content of 20 ppm or less, preferably 1 ppm or less and further preferably 10 ppb or less), or a rare gas (e.g., argon or helium). The atmosphere of a nitrogen gas, an oxygen gas, CDA, or a rare gas preferably does not contain hydrogen, water, and the like.

The purity of the nitrogen gas, the oxygen gas, or CDA is preferably increased, for example. Specifically, the purity of the nitrogen gas, the oxygen gas, or CDA is preferably 6N (99.9999%) or 7N (99.99999%). When a gas which is highly purified to have a dew point of −60° C. or lower, preferably −100° C. or lower, is used as the nitrogen gas, the oxygen gas, or CDA, entry of moisture and the like into the oxide semiconductor film 108 can be minimized.

Further, another heat treatment may be performed on the oxide semiconductor film 108 in an oxygen atmosphere or a CDA atmosphere after the heat treatment in a nitrogen atmosphere or a rare gas atmosphere. As a result, hydrogen, water, and the like can be released from the oxide semiconductor film 108 and oxygen can be supplied to the oxide semiconductor film 108 at the same time. Consequently, the amount of oxygen vacancy in the oxide semiconductor film 108 can be reduced.

In the case where the oxide semiconductor film is formed by a sputtering method, a rare gas (typically argon), oxygen, or a mixed gas of a rare gas and oxygen is used as a sputtering gas, as appropriate. In the case where the mixed gas of a rare gas and oxygen is used, the proportion of oxygen to a rare gas is preferably increased. In addition, increasing the purity of a sputtering gas is necessary. For example, as an oxygen gas or an argon gas used for a sputtering gas, a gas that is highly purified to have a dew point of −60° C. or lower, preferably −100° C. or lower, is used, whereby entry of moisture or the like into the oxide semiconductor film 108 can be minimized.

In the case where the oxide semiconductor film 108 is formed by a sputtering method, a chamber in a sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the oxide semiconductor film 108, as much as possible. Alternatively, a turbo molecular pump and a cold trap are preferably combined so as to prevent a backflow of a gas, especially a gas containing carbon or hydrogen from an exhaust system to the inside of the chamber.

Figure 21D:
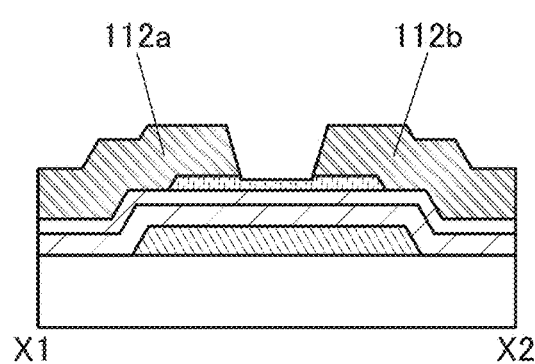

Next, a conductive film is formed over the insulating film 107 and the oxide semiconductor film 108 and processed into a desired shape, whereby the conductive films 112a and 112b are formed (see FIG. 21D).

In this embodiment, as the conductive films 112a and 112b, a 50-nm-thick tungsten film, a 400-nm-thick aluminum film, and a 100-nm-thick titanium film were formed in this order. Note that as a method of forming the conductive films 112a and 112b, a sputtering method may be used.

After the conductive films 112a and 112b are formed, a step of cleaning a surface of the oxide semiconductor film 108 may be performed. As a method of cleaning the surface of the oxide semiconductor film 108, a phosphoric acid solution or the like may be used, for example. Note that a recessed portion might be formed in part of the surface of the oxide semiconductor film 108 in the step of forming the conductive films 112a and 112b or the step of cleaning the surface of the oxide semiconductor film 108.

Through the above process, the transistor 100 is formed.

Figure 22A:
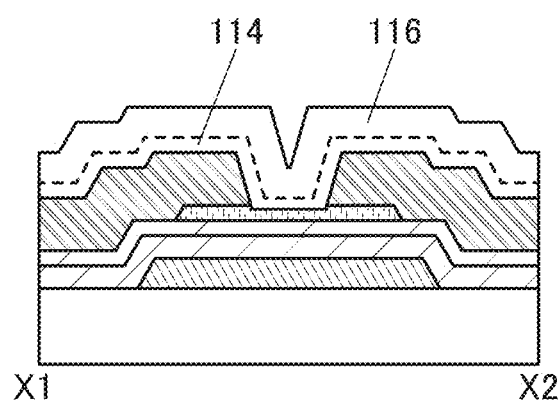
FIGS. 22A and 22B are cross-sectional views showing an example of a manufacturing process of a semiconductor device.

Next, the insulating films 114 and 116 functioning as protective insulating films of the transistor 100 are formed over the transistor 100, specifically, over the oxide semiconductor film 108 and the conductive films 112a and 112b (see FIG. 22A).

Note that after the insulating film 114 is formed, the insulating film 116 is preferably formed in succession without exposure to the air. After the insulating film 114 is formed, the insulating film 116 is formed in succession without exposure to the air while at least one of the flow rate of a source gas, pressure, a high-frequency power, and a substrate temperature is adjusted, whereby the concentration of impurities attributed to the atmospheric component at the interface between the insulating films 114 and 116 can be reduced and oxygen in the insulating films 114 and 116 can be moved to the oxide semiconductor film 108; accordingly, the amount of oxygen vacancy in the oxide semiconductor film 108 can be reduced.

As the insulating film 114, a silicon oxynitride film can be formed by a PECVD method, for example. In this case, a deposition gas containing silicon and an oxidizing gas are preferably used as a source gas. Typical examples of the deposition gas containing silicon include silane, disilane, trisilane, and silane fluoride. Examples of the oxidizing gas include dinitrogen monoxide and nitrogen dioxide. An insulating film containing nitrogen and having a small number of defects can be formed as the insulating film 114 by a PECVD method under the conditions where the flow rate of the oxidizing gas is higher than 20 times and lower than 100 times, preferably higher than or equal to 40 times and lower than or equal to 80 times, that of the deposition gas; and the pressure in a treatment chamber is lower than 100 Pa, preferably lower than or equal to 50 Pa.

In this embodiment, a silicon oxynitride film is formed as the insulating film 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6\times10^{-2}$ W/cm$^2$ as the power density) is supplied to parallel-plate electrodes.

As the insulating film 116, a silicon oxide film or a silicon oxynitride film is formed under the conditions where the substrate placed in a treatment chamber of the PECVD apparatus that is vacuum-evacuated is held at a temperature higher than or equal to 180° C. and lower than or equal to 280° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa, with introduction of a source gas into the treatment chamber, and a high-frequency power greater than or equal to 0.17 W/cm$^2$ and less than or equal to 0.5 W/cm$^2$, preferably greater than or equal to 0.25 W/cm$^2$ and less than or equal to 0.35 W/cm$^2$, is supplied to an electrode provided in the treatment chamber.

As the deposition conditions of the insulating film 116, the high-frequency power having the above power density is supplied to a reaction chamber having the above pressure, whereby the degradation efficiency of the source gas in plasma is increased, oxygen radicals are increased, and oxidation of the source gas is promoted; thus, the oxygen content in the insulating film 116 becomes higher than that in the stoichiometric composition. On the other hand, in the film formed at a substrate temperature within the above temperature range, the bond between silicon and oxygen is weak, and accordingly, part of oxygen in the film is released by heat treatment in a later step. Thus, an oxide insulating film that contains oxygen at a higher proportion than oxygen in the stoichiometric composition and from which part of oxygen is released by heating can be formed.

Note that the insulating film 114 functions as a protective film for the oxide semiconductor film 108 in the step of forming the insulating film 116. Therefore, the insulating film 116 can be formed using the high-frequency power having a high power density while damage to the oxide semiconductor film 108 is reduced.

Note that in the deposition conditions of the insulating film 116, when the flow rate of the deposition gas containing silicon with respect to the oxidizing gas is increased, the number of defects in the insulating film 116 can be reduced. Typically, it is possible to form an oxide insulating layer in which the number of defects is small, i.e., the spin density of a signal that appears at g=2.001 due to a dangling bond of silicon is lower than $6\times10^{17}$ spins/cm$^3$, preferably lower than or equal to $3\times10^{17}$ spins/cm$^3$ and further preferably lower than or equal to $1.5\times10^{17}$ spins/cm$^3$, by ESR measurement. As a result, the reliability of the transistor can be improved.

Heat treatment may be performed after the insulating films 114 and 116 are formed. The heat treatment can reduce nitrogen oxide included in the insulating films 114 and 116. By the heat treatment, part of oxygen included in the insulating films 114 and 116 can be moved to the oxide semiconductor film 108, so that the amount of oxygen vacancy included in the oxide semiconductor film 108 can be reduced.

The temperature of the heat treatment performed on the insulating films 114 and 116 is typically higher than or equal to 150° C. and lower than or equal to 400° C., preferably higher than or equal to 300° C. and lower than or equal to 400° C. and further preferably higher than or equal to 320° C. and lower than or equal to 370° C. The heat treatment may be performed under an atmosphere of nitrogen, oxygen, CDA, or a rare gas (argon, helium, and the like). Note that a gas baking furnace, an electric furnace, an RTA apparatus, or the like can be used for the heat treatment, in which it is preferable that hydrogen, water, and the like not be contained in the nitrogen, oxygen, ultra-dry air, or a rare gas.

In this embodiment, the heat treatment is performed at 350° C. for one hour in an atmosphere of nitrogen and oxygen.

Figure 22B:
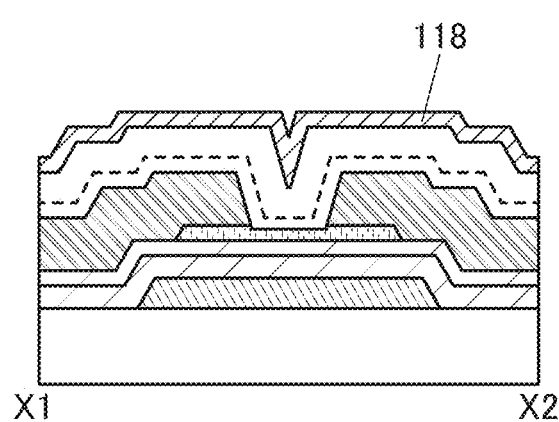

Next, the insulating film 118 is formed over the insulating film 116 (see FIG. 22B).

In the case where the insulating film 118 is formed by a PECVD method, the substrate temperature is preferably set to be higher than or equal to 300° C. and lower than or equal to 400° C. and further preferably higher than or equal to 320° C. and lower than or equal to 370° C., so that a dense film can be formed.

For example, in the case where a silicon nitride film is formed by a PECVD method as the insulating film 118, a deposition gas containing silicon, nitrogen, and ammonia are preferably used as a source gas. A small amount of ammonia compared with the amount of nitrogen is used, whereby ammonia is dissociated in the plasma and activated species are generated. The activated species cleave a bond between silicon and hydrogen which are included in a deposition gas containing silicon and a triple bond between nitrogen molecules. As a result, a dense silicon nitride film having few defects, in which bonds between silicon and nitrogen are promoted and bonds between silicon and hydrogen are few, can be formed. On the other hand, when the amount of ammonia with respect to nitrogen is large, decomposition of a deposition gas containing silicon and decomposition of nitrogen are not promoted, so that a sparse silicon nitride film in which bonds between silicon and hydrogen remain and defects are increased is formed. Therefore, in the source gas, a flow rate ratio of the nitrogen to the ammonia is preferably set to be greater than or equal to 5 and less than or equal to 50 and further preferably greater than or equal to 10 and less than or equal to 50.

In this embodiment, with the use of a PECVD apparatus, a 50-nm-thick silicon nitride film is formed as the insulating film 118 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and high-frequency power of 1000 W is supplied to parallel-plate electrodes with a 27.12 MHz high-frequency power source. Note that the PECVD apparatus is a parallel-plate PECVD apparatus in which the electrode area is 6000 cm$^2$, and the power per unit area (power density) into which the supplied power is converted is $1.7\times10^{-1}$ W/cm$^2$.

In the case where the insulating film 118 is formed by thermal deposition, it is preferable that preheating be not performed before formation of the insulating film 118. For example, in the case where preheating is performed before formation of the insulating film 118, excess oxygen in the insulating films 114 and 116 is released to the outside in some cases. Therefore, when the insulating film 118 is formed, excess oxygen in the insulating films 114 and 116 can be prevented from being released to the outside without preheating by, specifically, forming the insulating film 118 over the insulating film 116 within preferably three minutes and further preferably within one minute after the substrate is transferred to a heated chamber.

Note that heat treatment may be performed before or after the formation of the insulating film 118, so that excess oxygen included in the insulating films 114 and 116 can be diffused to the oxide semiconductor film 108 to fill oxygen vacancy in the oxide semiconductor film 108. Alternatively, the insulating film 118 may be deposited by heating, so that excess oxygen included in the insulating films 114 and 116 can be diffused to the oxide semiconductor film 108 to fill oxygen vacancy in the oxide semiconductor film 108. The temperature of the heat treatment that can be performed before or after the formation of the insulating films 118 is typically higher than or equal to 150° C. and lower than or equal to 400° C., preferably higher than or equal to 300° C. and lower than or equal to 400° C. and further preferably higher than or equal to 320° C. and lower than or equal to 370° C.

Through the above process, the transistor 100 can be manufactured.

<2-9. Method 2 for Manufacturing Semiconductor Device>

Figure 23A:
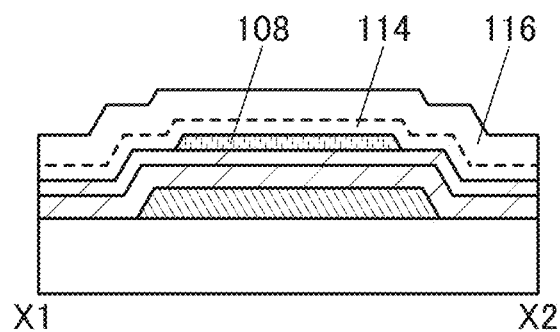
FIGS. 23A to 23C are cross-sectional views showing an example of the manufacturing process of a semiconductor device.
Figure 23B:
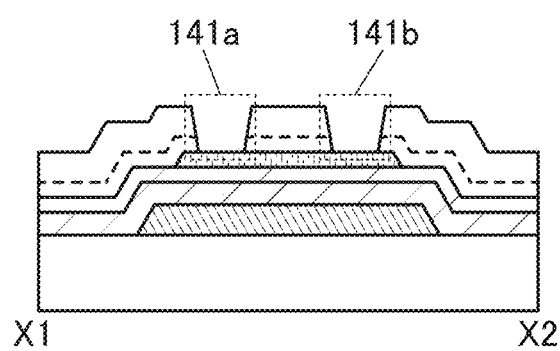
Figure 23C:
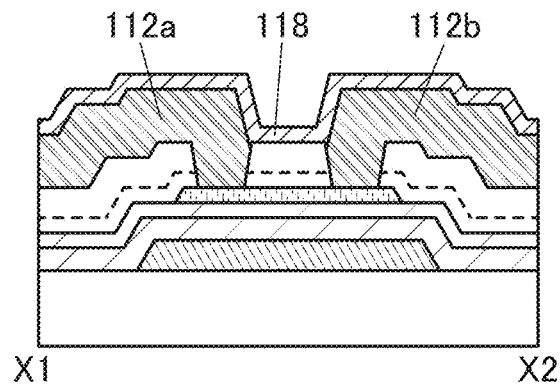

Next, a method for manufacturing the transistor 150 will be described with reference to FIGS. 23A to 23C. FIGS. 23A to 23C are cross-sectional views illustrating a method for manufacturing a semiconductor device.

First, the steps up to the step in FIG. 21C are performed, and then the insulating films 114 and 116 are formed over the insulating film 107 and the oxide semiconductor film 108 (see FIG. 23A).

Next, a mask is formed over the insulating film 116 through a lithography process, and the openings 141a and 141b are formed in desired regions in the insulating films 114 and 116. Note that the openings 141a and 141b reach the oxide semiconductor film 108 (see FIG. 23B).

Next, a conductive film is deposited over the oxide semiconductor film 108 and the insulating film 116 to cover the openings 141a and 141b, a mask is formed over the conductive film through a lithography process, and the conductive film is processed into desired regions, whereby the conductive films 112a and 112b are formed. After that, the insulating film 118 is formed over the insulating film 116 and the conductive films 112a and 112b (see FIG. 23C).

Through the above process, the transistor 150 can be manufactured.

Note that the transistor 160 can be manufactured in such a manner that the insulating films 114 and 116 are left over a channel region of the oxide semiconductor film 108 at the formation of the openings 141a and 141b.

<2-10. Method 3 for Manufacturing Semiconductor Device>

Next, a method for manufacturing the transistor 170 will be described with reference to FIGS. 24A to 24D. FIGS. 24A to 24D are cross-sectional views illustrating a method for manufacturing a semiconductor device.

Figure 24A:
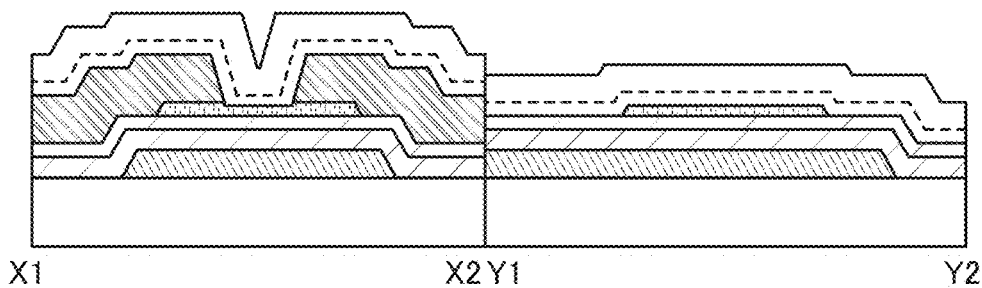
FIGS. 24A to 24D are cross-sectional views showing an example of a manufacturing process of a semiconductor device.
Figure 24B:
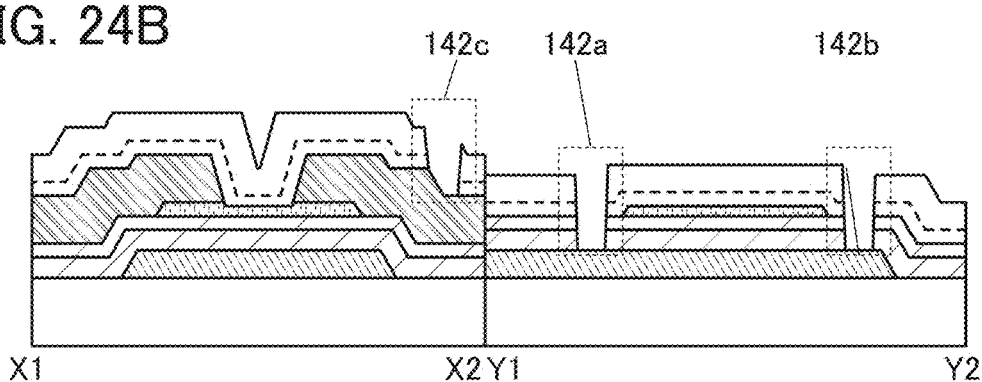

First, the steps up to the step in FIG. 22A are performed (see FIG. 24A).

Next, a mask is formed over the insulating film 116 through a lithography process, and the opening 142c is formed in a desired region in the insulating films 114 and 116. In addition, a mask is formed over the insulating film 116 through a lithography process, and the openings 142a and 142b are formed in desired regions in the insulating films 106, 107, 114, and 116. Note that the opening 142c reaches the conductive film 112b. The openings 142a and 142b reach the conductive film 104 (see FIG. 24B).

Note that the openings 142a and 142b and the opening 142c may be formed in the same step or may be formed by different steps. In the case where the openings 142a and 142b and the opening 142c are formed in the same step, for example, a gray-tone mask or a half-tone mask may be used.

Figure 24C:
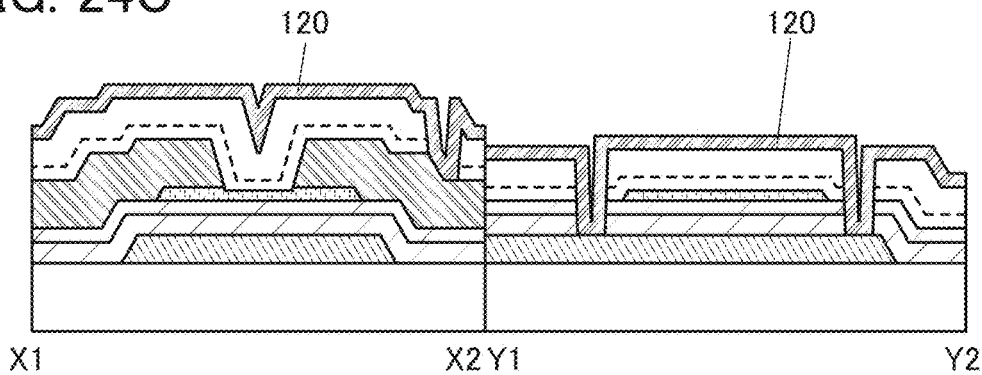
Figure 24D:
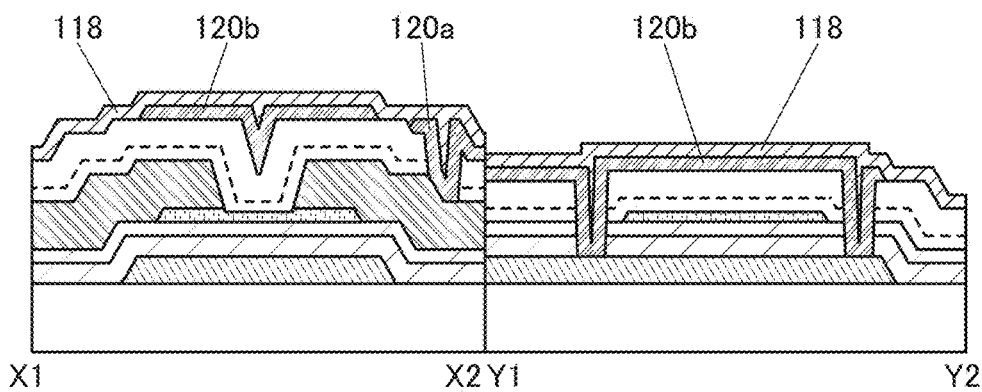

Next, an oxide semiconductor film 120 is formed over the insulating film 116 to cover the openings 142a, 142b, and 142c (see FIG. 24C).

The oxide semiconductor film 120 can be formed using a material and a method similar to those of the oxide semiconductor film 108. Note that when the oxide semiconductor film 120 is formed, plasma discharge is preferably performed in an atmosphere containing an oxygen gas. In that case, oxygen is added to the insulating film 116 over which the oxide semiconductor film 120 is to be formed. When the oxide semiconductor film 120 is formed, an inert gas (e.g., a helium gas, an argon gas, or a xenon gas) and the oxygen gas may be mixed. For example, it is preferable to use the argon gas and the oxygen gas with the flow rate higher than the flow rate of the argon gas.

The oxide semiconductor film 120 is formed at a substrate temperature higher than or equal to room temperature and lower than 340° C., preferably higher than or equal to room temperature and lower than or equal to 300° C., further preferably higher than or equal to 100° C. and lower than or equal to 250° C., and still further preferably higher than or equal to 100° C. and lower than or equal to 200° C. The oxide semiconductor film 120 is formed while being heated, so that the crystallinity of the oxide semiconductor film 120 can be increased. On the other hand, in the case where a large-sized glass substrate (e.g., the 6th generation to the 10th generation) is used as the substrate 102 and the oxide semiconductor film 120 is formed at a substrate temperature higher than or equal to 150° C. and lower than 340° C., the substrate 102 might be changed in shape (distorted or warped). In the case where a large-sized glass substrate is used, the change in the shape of the glass substrate can be suppressed by forming the oxide semiconductor film 120 at a substrate temperature higher than or equal to 100° C. and lower than 150° C.

In this embodiment, the oxide semiconductor film 120 is formed by a sputtering method using an In—Ga—Zn metal oxide target (In:Ga:Zn=4:2:4.1 [atomic ratio]). The substrate temperature when the oxide semiconductor film 120 is formed is set to 170° C. As the deposition gas for forming the oxide semiconductor film 120, an oxygen gas at a flow rate of 100 sccm is used.

The oxide semiconductor film 120 is not limited to the above-described composition; for example, the composition in which the atomic ratio of In:Ga:Zn is 1:1:1, 1:3:2, 1:3:4, 1:3:6, 3:1:2, or 4:2:3 may be employed.

The oxide semiconductor film 120 formed in an atmosphere containing the oxygen gas enables the insulating film 116 to contain oxygen or excess oxygen in the vicinity of its surface.

Next, a mask is formed over the oxide semiconductor film 120 through a lithography process, and the oxide semiconductor film 120 is processed into desired shapes, whereby the oxide semiconductor films 120a and 120b are formed. After that, the insulating film 118 is formed over the insulating films 116 and 118 and the oxide semiconductor films 120a and 120b (see FIG. 24D).

The insulating film 118 includes one or both of hydrogen and nitrogen. Thus, one or both of hydrogen and nitrogen is added to the oxide semiconductor films 120a and 120b in contact with the formed insulating film 118, so that the oxide semiconductor films 120a and 120b have high carrier density and can function as oxide conductive films.

As the insulating film 118, a silicon nitride film is preferably used, for example. The insulating film 118 can be formed by a sputtering method or a PECVD method, for example. In the case where the insulating film 118 is formed by a PECVD method, for example, the substrate temperature is lower than 400° C., preferably lower than 375° C., and further preferably higher than or equal to 180° C. and lower than or equal to 350° C. The substrate temperature at which the insulating film 118 is formed is preferably within the above range because a dense film can be formed. Furthermore, when the substrate temperature at which the insulating film 118 is formed is within the above range, oxygen or excess oxygen in the insulating films 114 and 116 can be moved to the oxide semiconductor film 108.

Through the above process, the transistor 170 can be manufactured.

In this embodiment, one embodiment of the present invention has been described. Note that one embodiment of the present invention is not limited to the above examples. That is, since various embodiments of the present invention are disclosed in this embodiment and the other embodiments, one embodiment of the present invention is not limited to a specific embodiment. For example, an example in which a channel formation region of a transistor includes an oxide semiconductor is described as one embodiment of the present invention; however, one embodiment of the present invention is not limited to these examples. Depending on circumstances, various transistors of embodiments of the present invention may include various semiconductors. For example, transistors of embodiments of the present invention may include, for example, at least one of silicon, germanium, silicon germanium, silicon carbide, gallium arsenide, aluminum gallium arsenide, indium phosphide, gallium nitride, and an organic semiconductor. Alternatively, various transistors of embodiments of the present invention do not necessarily include an oxide semiconductor.

The structure and method described in this embodiment can be combined as appropriate with any of the other structures and methods described in the other embodiments, examples, and a reference example.

Embodiment 3

In this embodiment, a structure of an oxide semiconductor and the like will be described with reference to FIGS. 25A to 25E, FIGS. 26A to 26E, FIGS. 27A to 27D, FIGS. 28A and 28B, and FIG. 29.

<3-1. Structure of Oxide Semiconductor>

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS has physical properties similar to those of an amorphous oxide semiconductor.

<3-2. CAAC-OS>

First, a CAAC-OS is described.

A CAAC-OS is one of oxide semiconductors having a plurality of c-axis aligned crystal parts (also referred to as pellets).

Figure 25A:
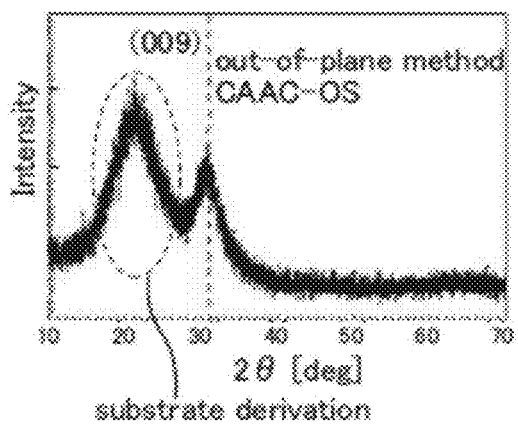
FIGS. 25A to 25E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31° as shown in FIG. 25A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 25B:
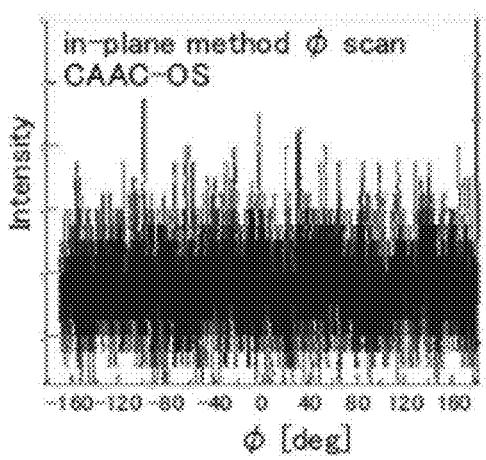
Figure 25C:
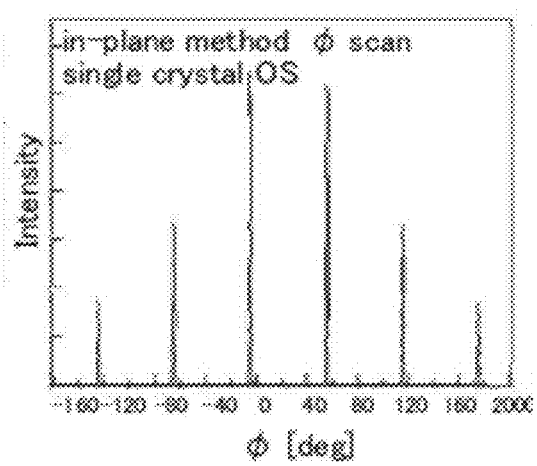
Figure 25D:
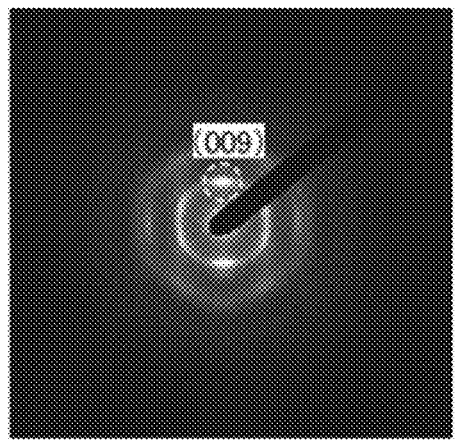

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the $InGaZnO_4$ crystal. When analysis (φ scan) is performed with 2θ fixed at around 56° and with the sample rotated using a normal vector to the sample surface as an axis (φ axis), as shown in FIG. 25B, a peak is not clearly observed. In contrast, in the case where single crystal $InGaZnO_4$ is subjected to φ scan with 2θ fixed at around 56°, as shown in FIG. 25C, six peaks which are derived from crystal planes equivalent to the (110) plane are observed. Accordingly, the structural analysis using XRD shows that the directions of a-axes and b-axes are irregularly oriented in the CAAC-OS.

Figure 25E:
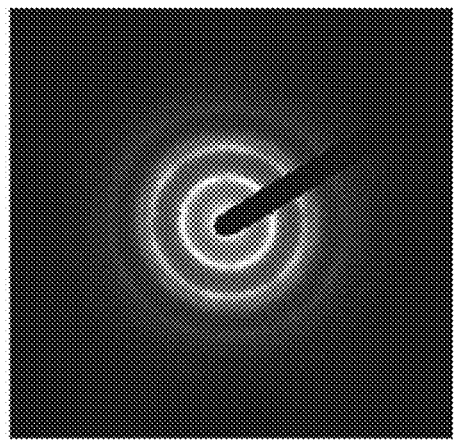

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 25D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 25E shows a diffraction pattern obtained in such a manner that an electron beam with a probe diameter of 300 nm is incident on the same sample in a direction perpendicular to the sample surface. As shown in FIG. 25E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 25E is considered to be derived from the (010) plane, the (100) plane, and the like of the $InGaZnO_4$ crystal. The second ring in FIG. 25E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 26A:
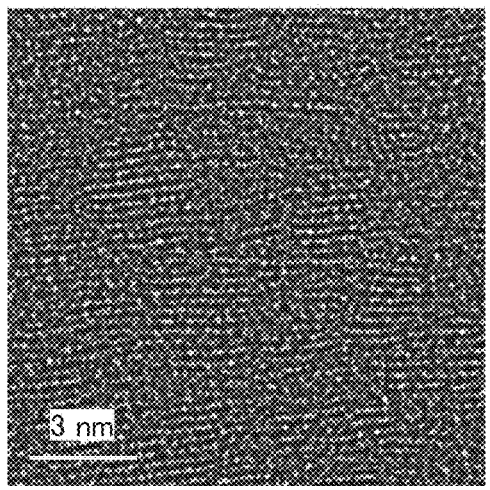
FIGS. 26A to 26E show a cross-sectional TEM image and plan-view TEM images of a CAAC-OS and images obtained through analysis thereof.

FIG. 26A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 26A shows pellets in which metal atoms are arranged in a layered manner. FIG. 26A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 26B:
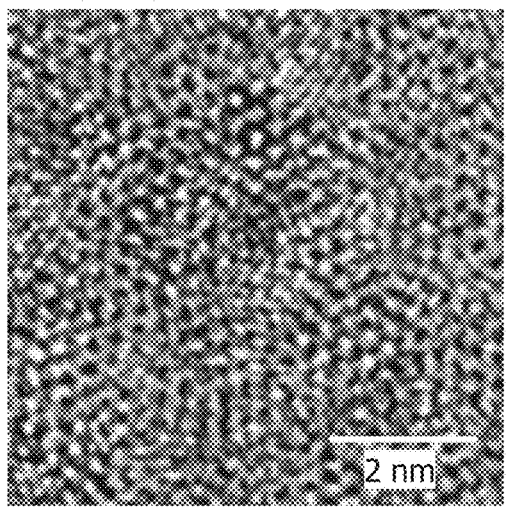
Figure 26C:
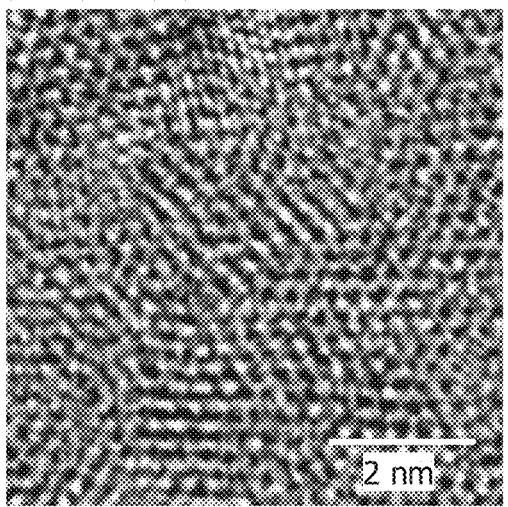
Figure 26D:
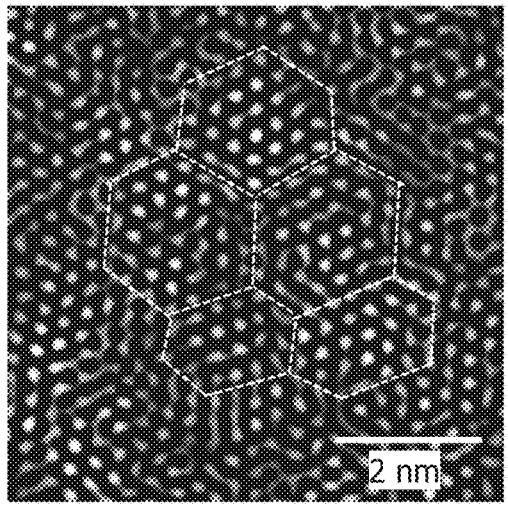
Figure 26E:
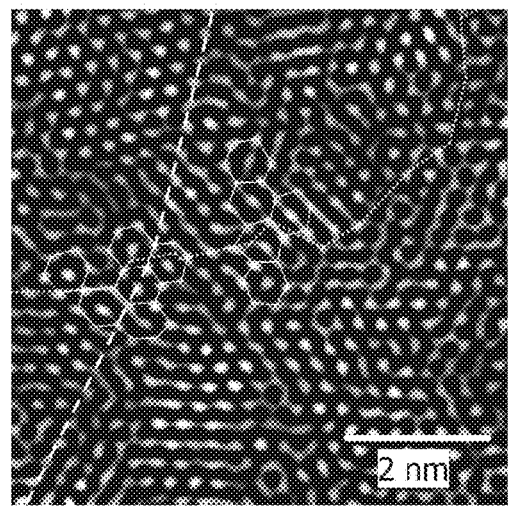

FIGS. 26B and 26C show Cs-corrected high-resolution TEM images of a plane of the CAAC-OS observed from a direction substantially perpendicular to the sample surface. FIGS. 26D and 26E are images obtained through image processing of FIGS. 26B and 26C. The method of image processing is as follows. The image in FIG. 26B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 26D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 26E, a dotted line denotes a boundary between a region with a regular lattice arrangement and another region with a regular lattice arrangement. No clear crystal grain boundary can be observed even in the vicinity of the dotted line. When lattice points around a lattice point in the vicinity of the dotted line are joined, a distorted hexagon can be formed. That is, a lattice arrangement is distorted so that formation of a crystal grain boundary is inhibited. This is probably because the following features of the CAAC-OS can allow distortion: a low density of the atomic arrangement in the a-b plane direction, an interatomic bond distance changed by substitution of a metal element, and the like.

In the above-described manner, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, an oxygen vacancy in the oxide semiconductor might serve as a carrier trap or serve as a carrier generation source when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, and further preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<3-3. nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 27A:
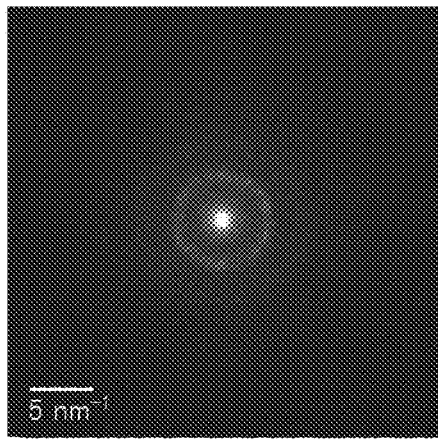
FIGS. 27A to 27D show electron diffraction patterns and a cross-sectional TEM image of an nc-OS.
Figure 27B:
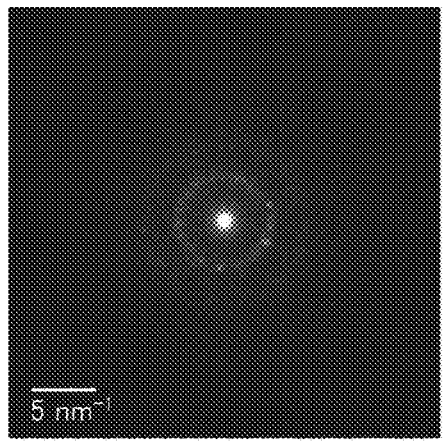

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 27A is observed. FIG. 27B shows a diffraction pattern obtained when an electron beam with a probe diameter of 1 nm is incident on the same sample. As shown in FIG. 27B, a plurality of spots are observed in a ring-like region. In other words, ordering in an nc-OS is not observed with an electron beam with a probe diameter of 50 nm but is observed with an electron beam with a probe diameter of 1 nm.

Figure 27C:
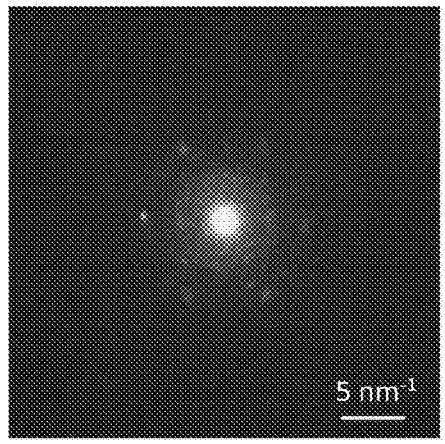

Furthermore, an electron diffraction pattern in which spots are arranged in an approximately hexagonal shape is observed in some cases as shown in FIG. 27C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 27D:
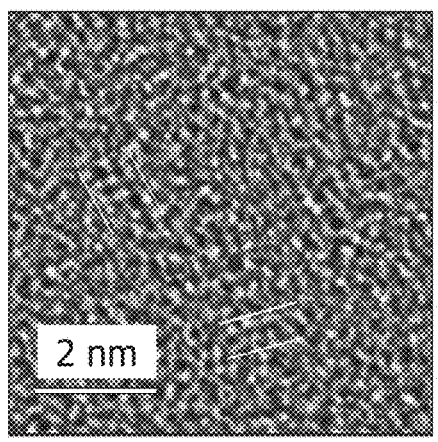

FIG. 27D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 27D, and a region in which a crystal part is not clearly observed. In most cases, the size of a crystal part included in the nc-OS is greater than or equal to 1 nm and less than or equal to 10 nm, in particular, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the above-described manner, in the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<3-4. a-like OS>

An a-like OS has a structure intermediate between those of the nc-OS and the amorphous oxide semiconductor.

FIGS. 28A and 28B are high-resolution cross-sectional TEM images of an a-like OS. FIG. 28A is the high-resolution cross-sectional TEM image of the a-like OS at the start of the electron irradiation. FIG. 28B is the high-resolution cross-sectional TEM image of a-like OS after the electron ($e^-$) irradiation at $4.3 \times 10^8$ $e^-/nm^2$. FIGS. 28A and 28B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared to a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 29:
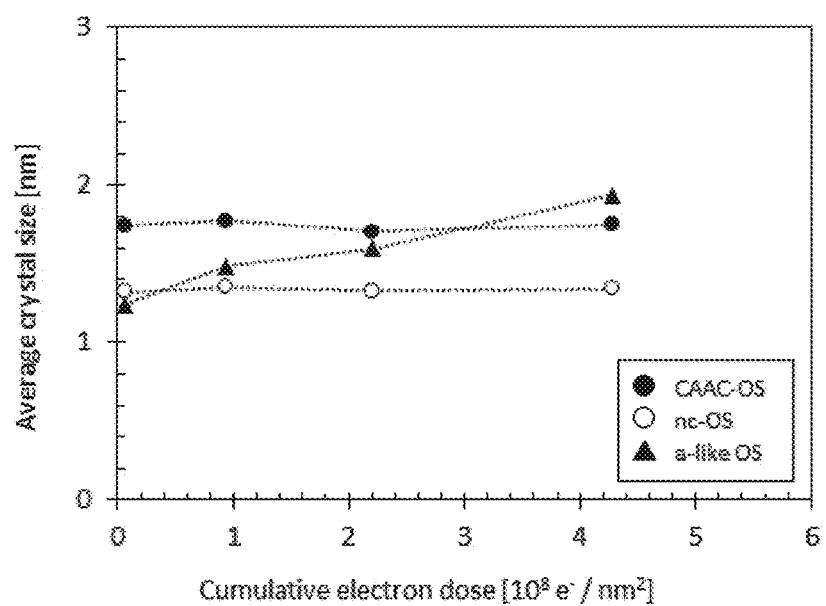
FIG. 29 shows a change of crystal part of an In—Ga—Zn oxide owing to electron irradiation.

FIG. 29 shows change in the average size of crystal parts (at 22 points to 30 points) in each sample. Note that the crystal part size corresponds to the length of a lattice fringe. FIG. 29 indicates that the crystal part size in the a-like OS increases with an increase in the cumulative electron dose in obtaining TEM images, for example. As shown in FIG. 29, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 29, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared to the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

In the above-described manner, oxide semiconductors have various structures and various properties. Note that an oxide semiconductor may be a stacked-layer film including two or more films of an amorphous oxide semiconductor, an a-like OS, an nc-OS, and a CAAC-OS, for example.

The structure described in this embodiment can be combined as appropriate with any of the other structures described in the other embodiments, examples, and a reference example.

Embodiment 4

In this embodiment, a display device including a semiconductor device of one embodiment of the present invention and an electronic device in which the display device is provided with an input device will be described with reference to FIGS. 30A and 30B, FIGS. 31A and 31B, FIGS. 32A and 32B, FIGS. 33A and 33B, and FIG. 34.

<4-1. Touch Panel>

In this embodiment, a touch panel 2000 including a display device and an input device will be described as an example of an electronic device. In addition, an example in which a touch sensor is used as an input device will be described.

Figure 30A:
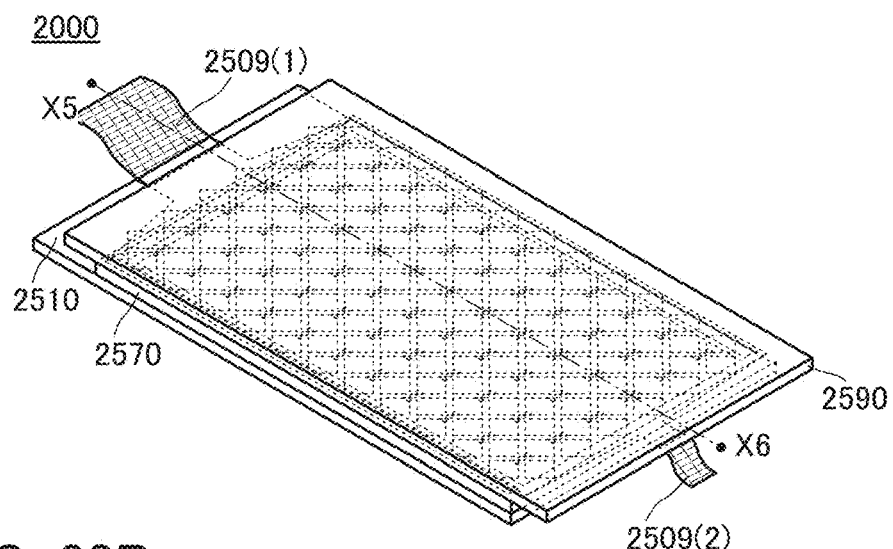
FIGS. 30A and 30B are perspective views showing an example of a touch panel.
Figure 30B:
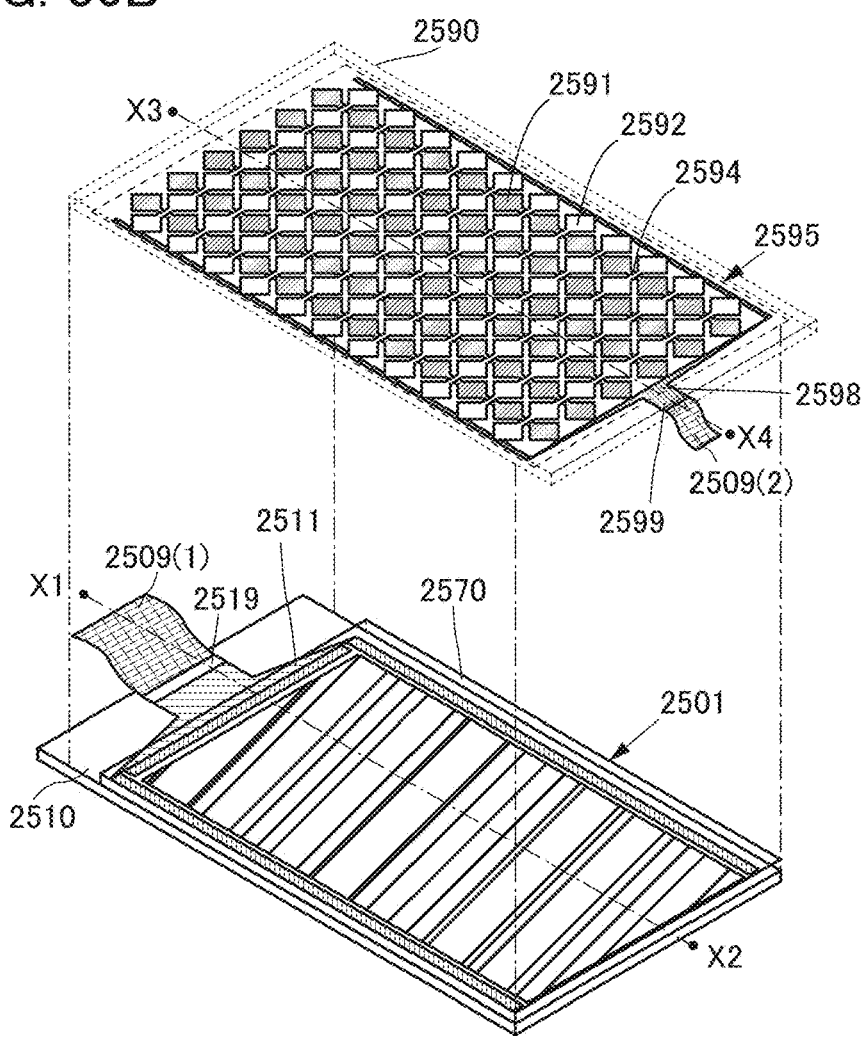

FIGS. 30A and 30B are perspective views of the touch panel 2000. Note that FIGS. 30A and 30B illustrate only main components of the touch panel 2000 for simplicity.

Figure 31A:
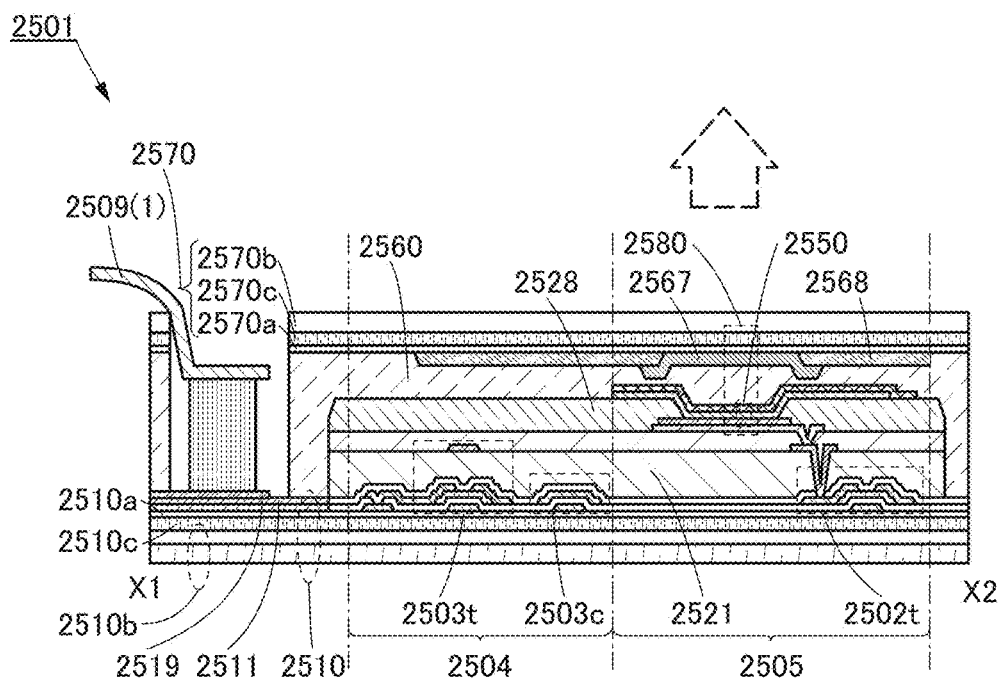
FIGS. 31A and 31B are cross-sectional views showing examples of a display device and a touch sensor.
Figure 31B:
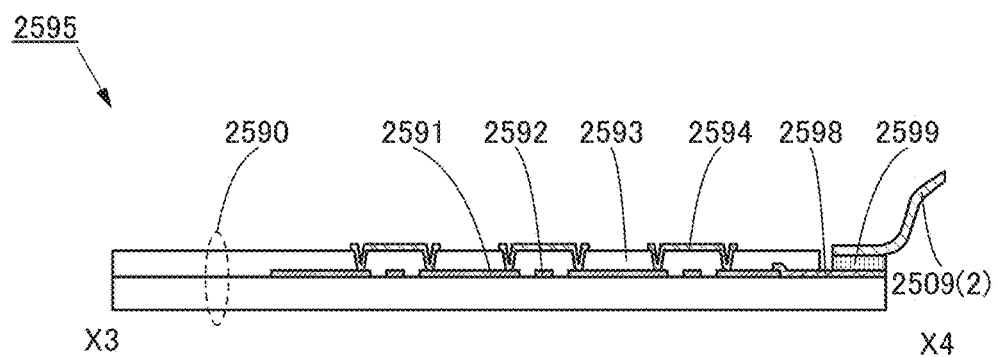

The touch panel 2000 includes a display device 2501 and a touch sensor 2595 (see FIG. 31B). The touch panel 2000 also includes substrates 2510, 2570, and 2590. The substrates 2510, 2570, and 2590 each have flexibility. Note that one or all of the substrates 2510, 2570, and 2590 may be inflexible.

The display device 2501 includes a plurality of pixels over the substrate 2510 and a plurality of wirings 2511 through which signals are supplied to the pixels. The plurality of wirings 2511 are led to a peripheral portion of the substrate 2510, and part of the plurality of wirings 2511 form a terminal 2519. The terminal 2519 is electrically connected to an FPC 2509(1).

The substrate 2590 includes the touch sensor 2595 and a plurality of wirings 2598 electrically connected to the touch sensor 2595. The plurality of wirings 2598 are led to a peripheral portion of the substrate 2590, and part of the plurality of wirings 2598 form a terminal. The terminal is electrically connected to an FPC 2509(2). Note that in FIG. 30B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

Note that the touch sensor 2595 illustrated in FIG. 30B is an example of using a projected capacitive touch sensor.

Note that a variety of sensors that can sense the approach or contact of a sensing target such as a finger can be used as the touch sensor 2595.

The projected capacitive touch sensor 2595 includes electrodes 2591 and 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 30A and 30B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

Note that as a material of the conductive films used for the electrodes 2591 and 2592 and the wirings 2598, that is, wirings and electrodes forming the touch panel, a transparent conductive film containing indium oxide, tin oxide, zinc oxide, or the like (e.g., ITO) can be given. For example, a low-resistance material is preferably used as a material that can be used as the wirings and electrodes forming the touch panel. For example, silver, copper, aluminum, a carbon nanotube, graphene, or a metal halide (such as a silver halide) may be used. Alternatively, a metal nanowire including a plurality of conductors with an extremely small width (e.g., a diameter of several nanometers) may be used. Further alternatively, a net-like metal mesh with a conductor may be used. For example, an Ag nanowire, a Cu nanowire, an Al nanowire, an Ag mesh, a Cu mesh, or an Al mesh may be used. For example, in the case of using an Ag nanowire as the wirings and electrodes forming the touch panel, a visible light transmittance of 89% or more and a sheet resistance of 40 Ω/sq. or more and 100 Ω/sq. or less can be achieved. Since the above-described metal nanowire, metal mesh, carbon nanotube, graphene, and the like, which are examples of the material that can be used as the wirings and electrodes forming the touch panel, have high visible light transmittances, they may be used as electrodes of display elements (e.g., a pixel electrode or a common electrode).

<4-2. Display Device>

Next, the display device 2501 will be described in detail with reference to FIG. 31A. FIG. 31A corresponds to a cross-sectional view taken along the dashed-dotted line X1-X2 in FIG. 30B.

The display device 2501 includes a plurality of pixels arranged in a matrix. Each of the pixels includes a display element and a pixel circuit for driving the display element.

A structure that uses an EL element as a display element will be described below with reference to FIG. 31A. In the following description, an example of using an EL element that emits white light will be described; however, the EL element is not limited to this element. For example, EL elements that emit light of different colors may be included so that the light of different colors can be emitted from adjacent pixels.

For the substrates 2510 and 2570, for example, a flexible material with a vapor permeability of lower than or equal to $10^{-5}$ g/(m$^2$·day), preferably lower than or equal to $10^{-6}$ g/(m$^2$·day), can be favorably used. Alternatively, materials whose thermal expansion coefficients are substantially equal to each other are preferably used for the substrate 2510 and 2570. For example, the coefficients of linear expansion of the materials are preferably lower than or equal to $1 \times 10^{-3}$/K, further preferably lower than or equal to $5 \times 10^{-5}$/K, and still further preferably lower than or equal to $1 \times 10^{-5}$/K.

Note that the substrate 2510 is a stacked body including an insulating layer 2510a for preventing impurity diffusion into the EL element, a flexible substrate 2510b, and an adhesive layer 2510c for attaching the insulating layer 2510a and the flexible substrate 2510b to each other. The substrate 2570 is a stacked body including an insulating layer 2570a for preventing impurity diffusion into the EL element, a flexible substrate 2570b, and an adhesive layer 2570c for attaching the insulating layer 2570a and the flexible substrate 2570b to each other.

For the adhesive layers 2510c and 2570c, for example, materials that include polyester, polyolefin, polyamide (e.g., nylon, aramid), polyimide, polycarbonate, polyurethane, an acrylic resin, an epoxy resin, or a resin having a siloxane bond can be used.

A sealing layer 2560 is provided between the substrates 2510 and 2570. The sealing layer 2560 preferably has a refractive index higher than that of air. In the case where light is extracted to the sealing layer 2560 side as illustrated in FIG. 31A, the sealing layer 2560 can also serve as an optical element.

A sealant may be formed in the peripheral portion of the sealing layer 2560. With the use of the sealant, an EL element 2550 can be provided in a region surrounded by the substrates 2510 and 2570, the sealing layer 2560, and the sealant. Note that an inert gas (such as nitrogen or argon) may be used instead of the sealing layer 2560. A drying agent may be provided in the inert gas so as to adsorb moisture or the like. For example, an epoxy-based resin or a glass frit is preferably used as the sealant. As a material used for the sealant, a material which does not transmit moisture or oxygen is preferably used.

The display device 2501 illustrated in FIG. 31A includes a pixel 2505. The pixel 2505 includes a light-emitting module 2580, the EL element 2550, and a transistor 2502t that can supply electric power to the EL element 2550. Note that the transistor 2502t functions as part of the pixel circuit.

The light-emitting module 2580 includes the EL element 2550 and a coloring layer 2567. The EL element 2550 includes a lower electrode, an upper electrode, and an EL layer between the lower electrode and the upper electrode.

In the case where the sealing layer 2560 is provided on the light extraction side, the sealing layer 2560 is in contact with the EL element 2550 and the coloring layer 2567.

The coloring layer 2567 is positioned in a region overlapping with the EL element 2550. Accordingly, part of light emitted from the EL element 2550 passes through the coloring layer 2567 and is emitted to the outside of the light-emitting module 2580 as indicated by an arrow in FIG. 31A.

The display device 2501 includes a light-blocking layer 2568 on the light extraction side. The light-blocking layer 2568 is provided so as to surround the coloring layer 2567.

The coloring layer 2567 is a coloring layer having a function of transmitting light in a particular wavelength region. For example, a color filter for transmitting light in a red wavelength range, a color filter for transmitting light in a green wavelength range, a color filter for transmitting light in a blue wavelength range, a color filter for transmitting light in a yellow wavelength range, or the like can be used. Each color filter can be formed with any of various materials by a printing method, an inkjet method, an etching method using a photolithography technique, or the like.

An insulating layer 2521 is provided in the display device 2501. The insulating layer 2521 covers the transistor 2502t and the like. Note that the insulating layer 2521 has a function of covering the roughness caused by the pixel circuit to provide a flat surface. The insulating layer 2521 may have a function of suppressing impurity diffusion. This can prevent the reliability of the transistor 2502t or the like from being lowered by impurity diffusion.

The EL element 2550 is formed over the insulating layer 2521. A partition wall 2528 is provided so as to overlap with an end portion of the lower electrode of the EL element 2550. Note that a spacer for controlling the distance between the substrates 2510 and 2570 may be formed over the partition wall 2528.

A scan line driver circuit 2504 includes a transistor 2503t and a capacitor 2503c. Note that the driver circuit can be formed in the same process and over the same substrate as those of the pixel circuits.

The wirings 2511 through which signals can be supplied are provided over the substrate 2510. The terminal 2519 is provided over the wirings 2511. The FPC 2509(1) is electrically connected to the terminal 2519. The FPC 2509(1) has a function of supplying a video signal, a clock signal, a start signal, a reset signal, or the like. Note that the FPC 2509(1) may be provided with a printed wiring board (PWB).

Any of the transistors described in the above embodiments may be used as one or both of the transistors 2502t and 2503t. The transistors used in this embodiment each include an oxide semiconductor film which is highly purified and in which formation of oxygen vacancy is inhibited. In the transistors, the current in an off state (off-state current) can be made small. Accordingly, an electrical signal such as an image signal can be held for a longer period, and a writing interval can be set longer in an on state. Thus, the frequency of refresh operation can be reduced, which leads to an effect of reducing power consumption. In addition, the transistors used in this embodiment can have relatively high field-effect mobility and are thus capable of high speed operation. For example, with such transistors which can operate at high speed used for the display device 2501, a switching transistor of a pixel circuit and a driver transistor in a driver circuit can be formed over one substrate. That is, a semiconductor device formed using a silicon wafer or the like is not additionally needed as a driver circuit, by which the number of components of the semiconductor device can be reduced. In addition, by using a transistor which can operate at high speed in a pixel circuit, a high-quality image can be provided.

<4-3. Touch Sensor>

Next, the touch sensor 2595 will be described in detail with reference to FIG. 31B. FIG. 31B corresponds to a cross-sectional view taken along the dashed-dotted line X3-X4 in FIG. 30B.

The touch sensor 2595 includes the electrodes 2591 and 2592 provided in a staggered arrangement in the substrate 2590, an insulating layer 2593 covering the electrodes 2591 and 2592, and the wiring 2594 that electrically connects the adjacent electrodes 2591 to each other.

The electrodes 2591 and 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film containing graphene may be used as well. The film containing graphene can be formed, for example, by reducing a film containing graphene oxide. As a reducing method, a method with application of heat or the like can be employed.

The electrodes 2591 and 2592 may be formed by, for example, depositing a light-transmitting conductive material on the substrate 2590 by a sputtering method and then removing an unnecessary portion by any of various patterning techniques such as photolithography.

Examples of a material for the insulating layer 2593 are a resin such as an acrylic resin or an epoxy resin, a resin having a siloxane bond, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used as the wiring 2594 because the aperture ratio of the touch panel can be increased. Moreover, a material with higher conductivity than the conductivities of the electrodes 2591 and 2592 can be favorably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degree and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

<4-4. Touch Panel>

Figure 32A:
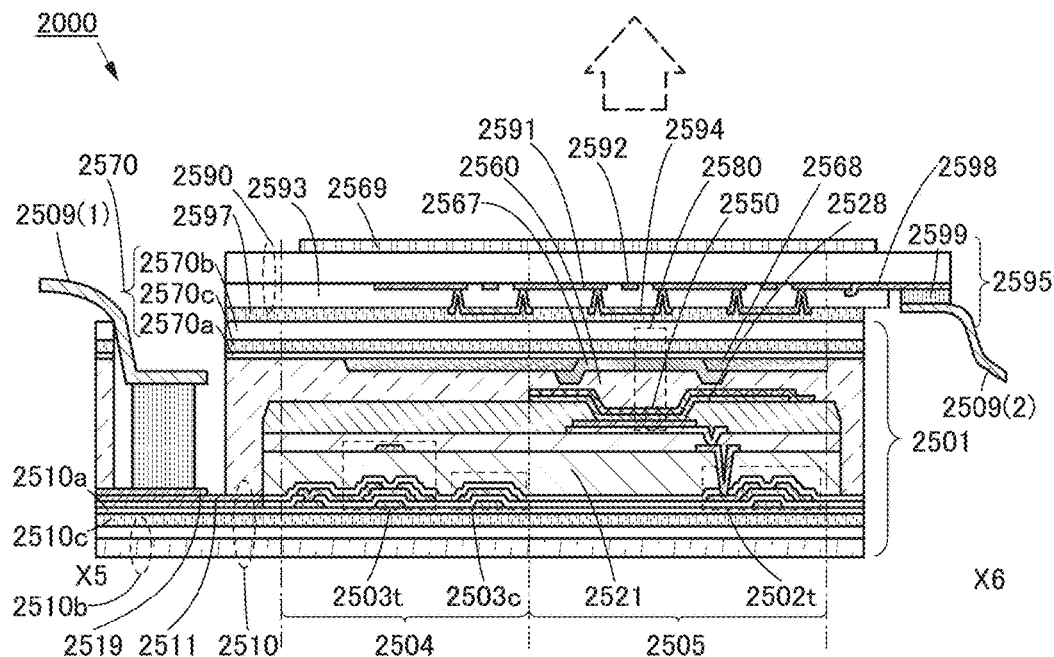
FIGS. 32A and 32B are cross-sectional views showing examples of a touch panel.

Next, the touch panel 2000 will be described in detail with reference to FIG. 32A. FIG. 32A corresponds to a cross-sectional view taken along the dashed-dotted line X5-X6 in FIG. 30A.

In the touch panel 2000 illustrated in FIG. 32A, the display device 2501 described with reference to FIG. 31A and the touch sensor 2595 described with reference to FIG. 31B are attached to each other.

The touch panel 2000 illustrated in FIG. 32A includes an adhesive layer 2597 and an anti-reflective layer 2569 in addition to the components described with reference to FIG. 31A.

The adhesive layer 2597 is provided in contact with the wiring 2594. Note that the adhesive layer 2597 attaches the substrate 2590 to the substrate 2570 so that the touch sensor 2595 overlaps with the display device 2501. The adhesive layer 2597 preferably has a light-transmitting property. A heat curable resin or an ultraviolet curable resin can be used for the adhesive layer 2597. For example, an acrylic resin, a urethane-based resin, an epoxy-based resin, or a siloxane-based resin can be used.

The anti-reflective layer 2569 is positioned in a region overlapping with pixels. As the anti-reflective layer 2569, a circularly polarizing plate can be used, for example.

Next, a touch panel having a structure different from that illustrated in FIG. 32A will be described with reference to FIG. 32B.

Figure 32B:
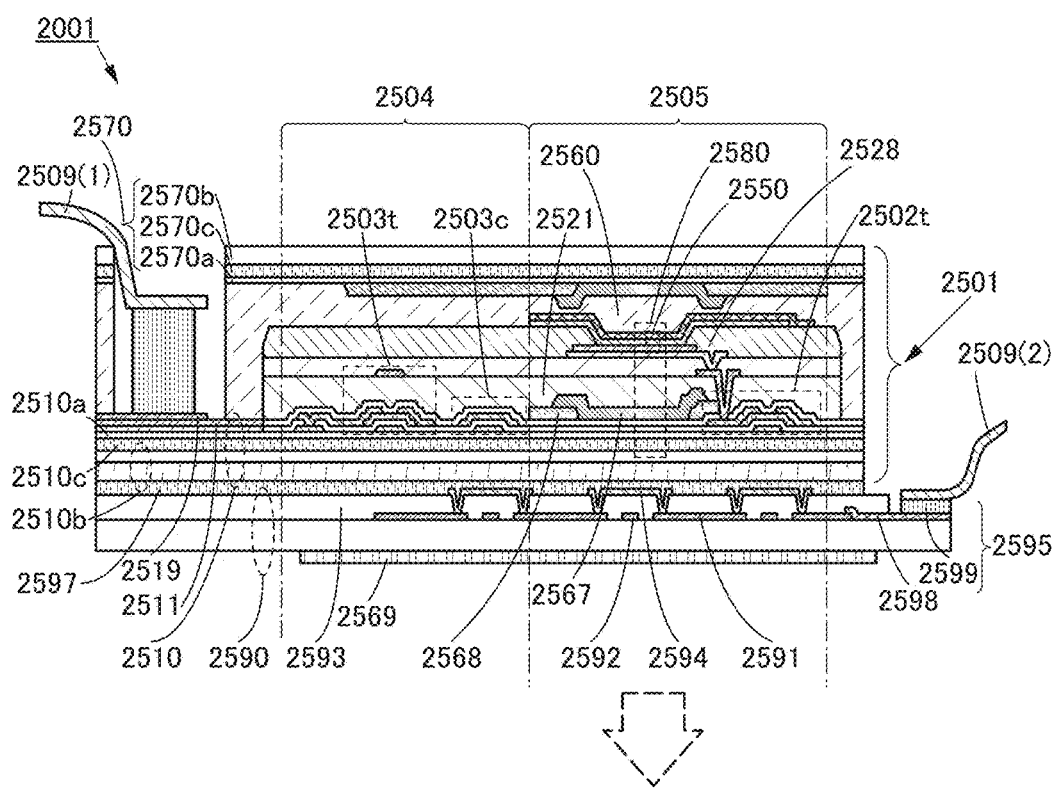

FIG. 32B is a cross-sectional view of a touch panel 2001. The touch panel 2001 illustrated in FIG. 32B differs from the touch panel 2000 illustrated in FIG. 32A in the position of the touch sensor 2595 relative to the display device 2501. Different parts are described in detail below, and the above description of the touch panel 2000 is referred to for the other similar parts.

The coloring layer 2567 is positioned under the EL element 2550. The EL element 2550 illustrated in FIG. 32B emits light to the side where the transistor 2502t is provided. Accordingly, part of light emitted from the EL element 2550 passes through the coloring layer 2567 and is emitted to the outside of the light-emitting module 2580 as indicated by an arrow in FIG. 32B.

The touch sensor 2595 is provided on the substrate 2510 side of the display device 2501.

The adhesive layer 2597 is provided between the substrates 2510 and 2590 and attaches the touch sensor 2595 to the display device 2501.

As illustrated in FIG. 32A or 32B, light may be emitted from the light-emitting element to one or both of the substrates 2510 and 2570.

<4-5. Driving Method of Touch Panel>

Next, an example of a method for driving a touch panel will be described with reference to FIGS. 33A and 33B.

Figure 33A:
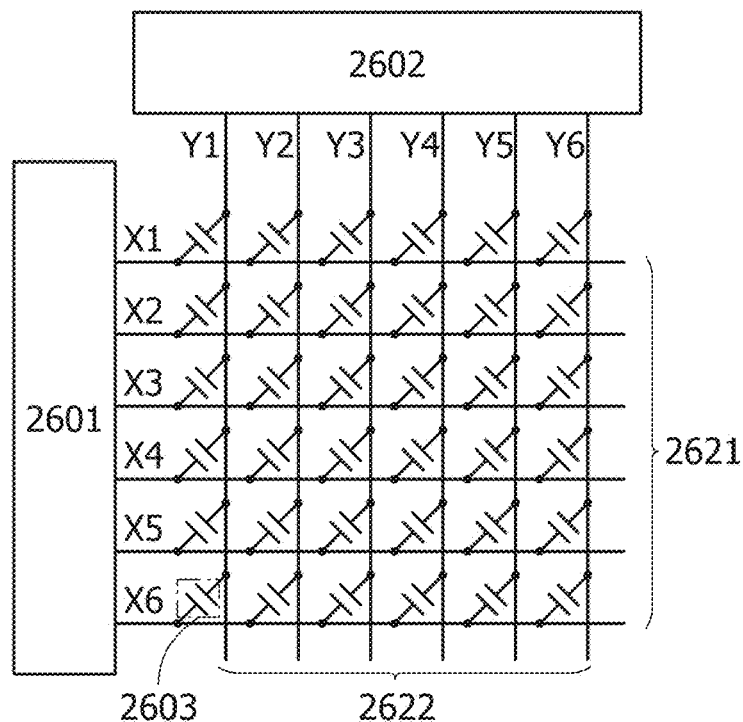
FIGS. 33A and 33B are a block diagram and a timing chart of a touch sensor.

FIG. 33A is a block diagram illustrating the structure of a mutual capacitive touch sensor. FIG. 33A illustrates a pulse voltage output circuit 2601 and a current sensing circuit 2602. Note that in FIG. 33A, six wirings X1 to X6 represent electrodes 2621 to which a pulse voltage is applied, and six wirings Y1 to Y6 represent electrodes 2622 that detect changes in current. FIG. 33A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 33B:
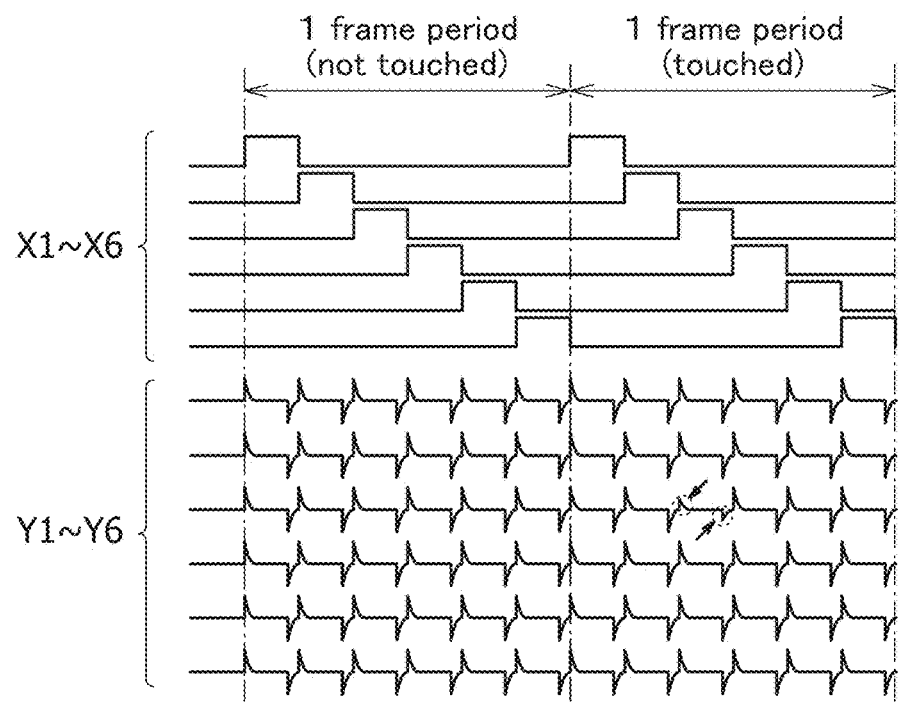

FIG. 33B is a timing chart showing input and output waveforms in the mutual capacitive touch sensor illustrated in FIG. 33A. In FIG. 33B, sensing of a sensing target is performed in all the rows and columns in one frame period. FIG. 33B shows a period when a sensing target is not sensed (not touched) and a period when a sensing target is sensed (touched). Sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change uniformly in accordance with changes in the voltages of the wirings X1 to X6. The current value is decreased at the point of approach or contact of a sensing target and accordingly the waveform of the voltage level changes.

By detecting a change in mutual capacitance in this manner, the approach or contact of a sensing target can be sensed.

<4-6. Sensor Circuit>

Figure 34:
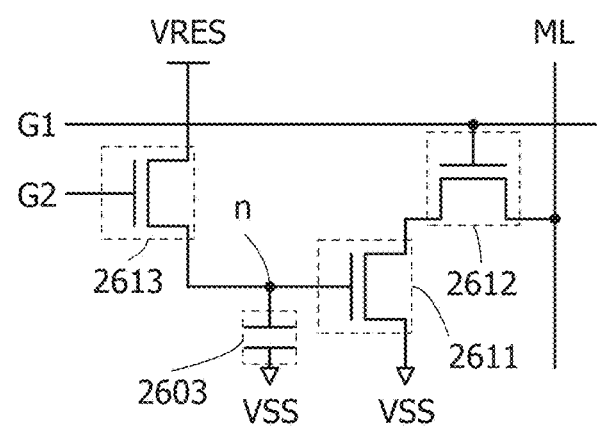
FIG. 34 is a circuit diagram of a touch sensor.

Although FIG. 33A illustrates a passive type touch sensor in which only the capacitor 2603 is provided at the intersection of wirings as a touch sensor, an active type touch sensor including a transistor and a capacitor may be used. FIG. 34 shows an example of a sensor circuit included in an active type touch sensor.

The sensor circuit in FIG. 34 includes the capacitor 2603 and transistors 2611, 2612, and 2613.

A signal G2 is applied to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is applied to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 34 will be described. First, a potential for turning on the transistor 2613 is supplied as the signal G2, and a potential with respect to the voltage VRES is thus applied to the node n connected to the gate of the transistor 2611. Then, a potential for turning off the transistor 2613 is applied as the signal G2, whereby the potential of the node n is held.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. Current flowing to the transistor 2611, that is, current flowing to the wiring ML is changed in accordance with the potential of the node n. By sensing this current, the approach or contact of a sensing target can be sensed.

In each of the transistors 2611, 2612, and 2613, any of the transistors described in the above embodiments can be used.

In particular, it is preferable to use any of the transistors described in the above embodiments as the transistor 2613 because the potential of the node n can be held for a long time and the frequency of operation of resupplying VRES to the node n (refresh operation) can be reduced.

The structure described in this embodiment can be combined as appropriate with any of the structures described in the other embodiments, examples, and a reference example.

Embodiment 5

In this embodiment, structure examples of an input/output device (a touch panel), an input device (a touch sensor), and an output device (a display panel) which can be used for the semiconductor device in the above embodiment will be described.

<5.1. Structure Example of Touch Panel>

Figure 35A:
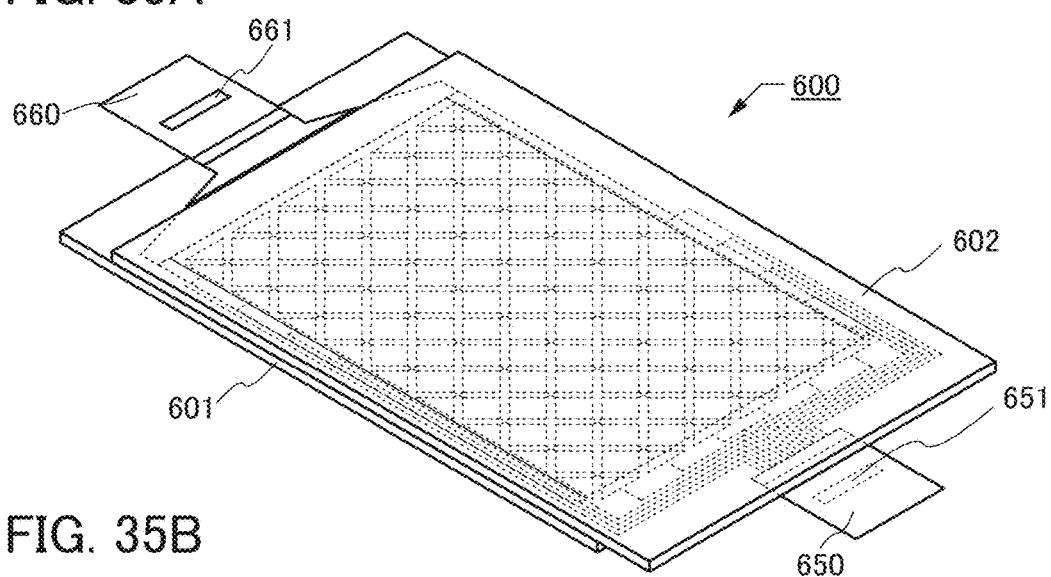
FIGS. 35A and 35B illustrate an input/output device.
Figure 35B:
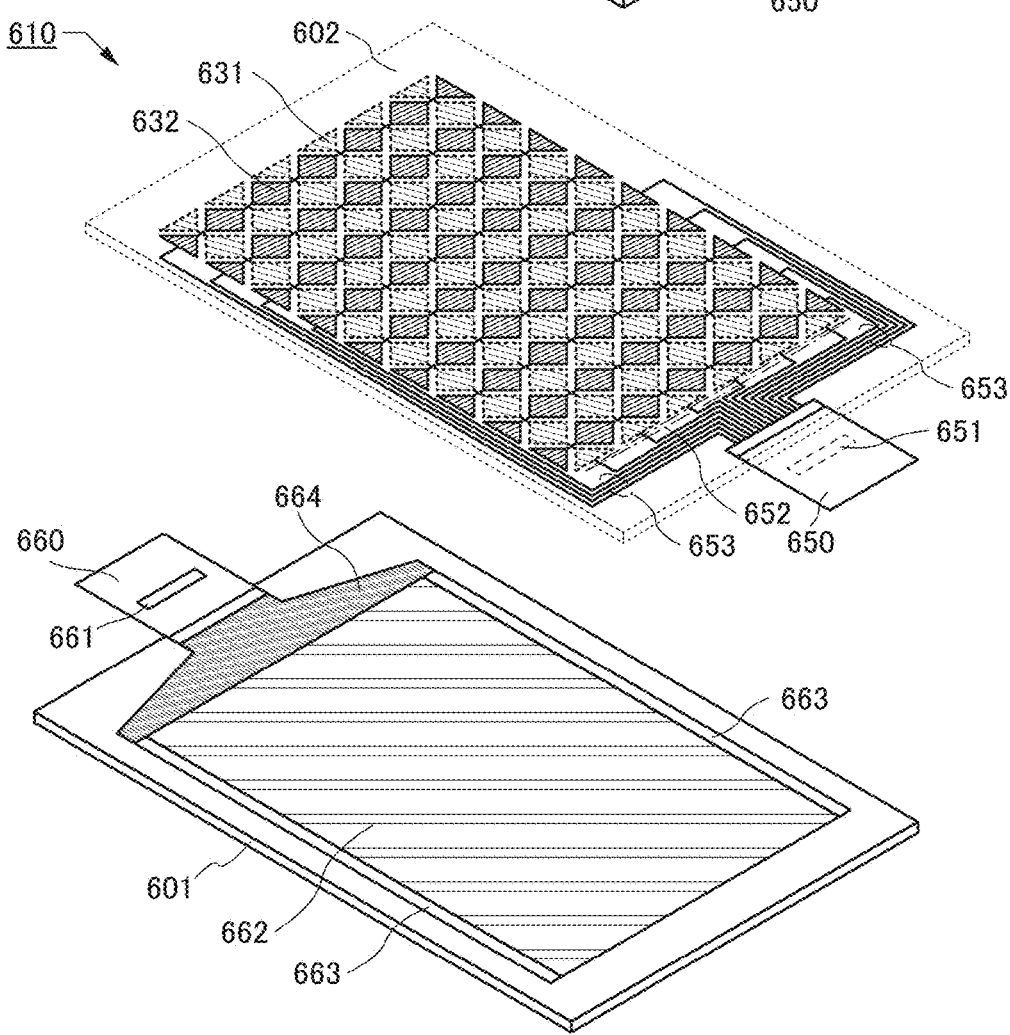

FIG. 35A is a schematic perspective view of a touch panel 600. FIG. 35B is a developed view of the schematic perspective view of FIG. 35A. Note that only typical components are illustrated for simplicity. In FIG. 35B, some components (such as a substrate 602) are illustrated only in dashed outline.

The touch panel 600 includes the substrate 602 and a substrate 601, which are provided to overlap with each other.

FIGS. 35A and 35B illustrate an example where an input device 610 includes the substrate 602, a plurality of electrodes 631, a plurality of electrodes 632, a plurality of wirings 652, a plurality of wirings 653, a flexible printed circuit (FPC) 650, and an IC 651.

As the input device 610, for example, a capacitive touch sensor can be used. Examples of the capacitive touch sensor are a surface capacitive touch sensor and a projected capacitive touch sensor. Examples of the projected capacitive touch sensor are a self capacitive touch sensor and a mutual capacitive touch sensor, which differ mainly in the driving method. The use of a mutual capacitive type is preferable because multiple points can be sensed simultaneously. An example of using a projected capacitive touch sensor will be described below.

Note that one embodiment of the present invention is not limited to this example, and any of a variety of sensors capable of sensing the approach or contact of a sensing target, such as a finger or a stylus, can be used as the input device 610.

A display portion 662, a driver circuit 663, a wiring 664, and the like are provided over the substrate 601. The substrate 601 is also provided with an FPC 660 which is electrically connected to the wiring 664. In the example shown in FIGS. 35A and 35B, an IC 661 is provided over the FPC 660.

The display portion 662 includes at least a plurality of pixels. Each of the pixels includes at least one display element. It is preferable that each of the pixels include a transistor and a display element. As the display element, typically, a light-emitting element such as an organic EL element can be used.

As the driver circuit 663, a circuit functioning as a gate line driver circuit or a signal line driver circuit, for example, can be used.

The wiring 664 has a function of supplying a signal or power to the display portion 662 or the driver circuit 663. The signal or power is input to the wiring 664 from the outside or the IC 661 through the FPC 660.

In the example shown in FIGS. 35A and 35B, the IC 661 is mounted on the FPC 660 by a chip-on-film (COF) method. As the IC 661, an IC functioning as a gate line driver circuit or a signal line driver circuit, for example, can be used. Note that it is possible that the IC 661 is not provided when the touch panel 600 includes circuits functioning as a gate line driver circuit and a signal line driver circuit or when circuits functioning as a gate line driver circuit and a signal line driver circuit are externally provided and a signal for driving the touch panel 600 is input through the FPC 660. The IC 661 may be directly mounted on the substrate 601 by a chip-on-glass (COG) method or the like.

<5-2. Structure Example of Input Device>

A structure example of the input device (touch sensor) will be described below with reference to drawings.

Figure 36A:
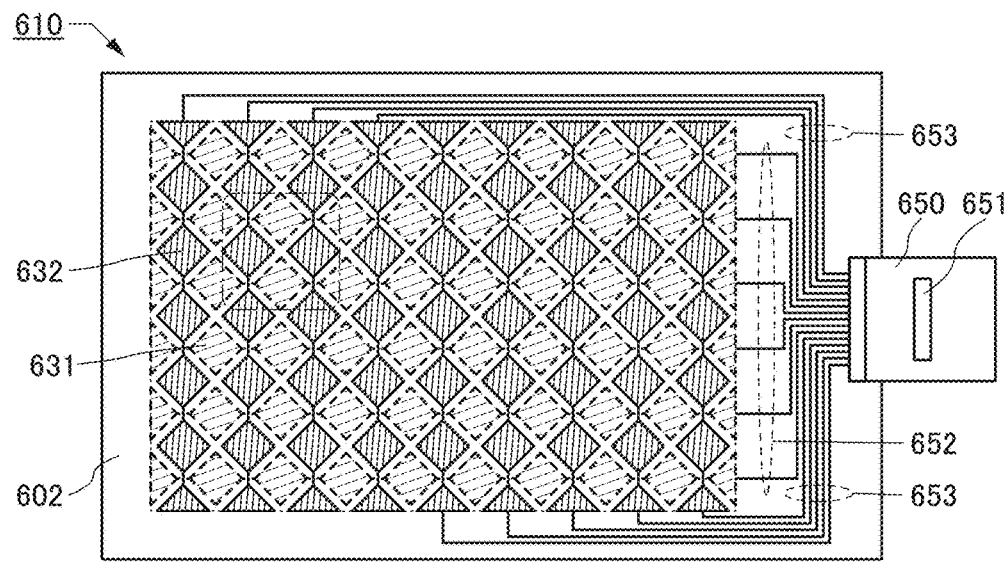
FIGS. 36A to 36D illustrate an input device.

FIG. 36A is a schematic top view of the input device 610. The input device 610 includes the plurality of electrodes 631, the plurality of electrodes 632, the plurality of wirings 652 and the plurality of wirings 653 over the substrate 602. The substrate 602 is provided with the FPC 650 which is electrically connected to each of the plurality of wirings 652 and the plurality of wirings 653. FIG. 36A shows an example in which the FPC 650 is provided with the IC 651.

Figure 36B:
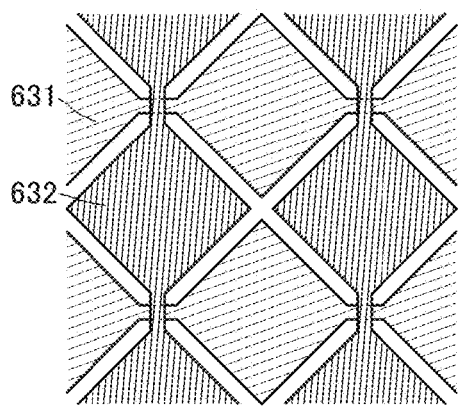

FIG. 36B is an enlarged view of a region surrounded by a dashed dotted line in FIG. 36A. The electrodes 631 are each in the form of a series of rhombic electrode patterns aligned in a lateral direction. The rhombic electrode patterns aligned in a line are electrically connected to each other. The electrodes 632 are also each in the form of a series of rhombic electrode patterns aligned in a longitudinal direction and the rhombic electrode patterns aligned in a line are electrically connected. Part of the electrode 631 and part of the electrode 632 overlap and intersect with each other. At this intersection portion, an insulator is sandwiched in order to avoid an electrical short-circuit between the electrode 631 and the electrode 632.

Figure 36C:
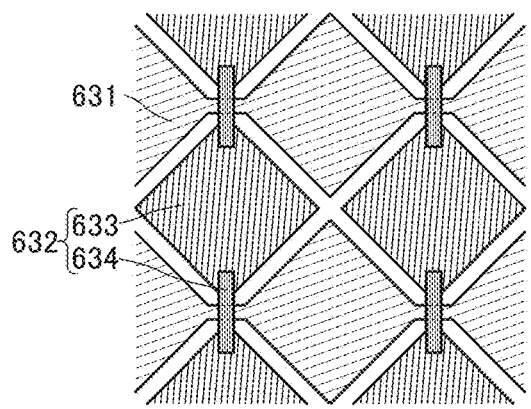

As illustrated in FIG. 36C, the electrodes 632 may form a plurality of rhombic electrodes 633 and bridge electrodes 634. The electrodes 633 are aligned in a longitudinal direction, and two adjacent electrodes 633 are electrically connected to each other by the bridge electrode 634. Such a structure makes it possible that the electrodes 633 and the electrodes 631 can be formed at the same time by processing the same conductive film. This can prevent variations in the thickness of these films, and can prevent the resistance value and the light transmittance of each electrode from varying from place to place. Note that although the electrodes 632 include the bridge electrodes 634 here, the electrodes 631 may have such a structure.

Figure 36D:
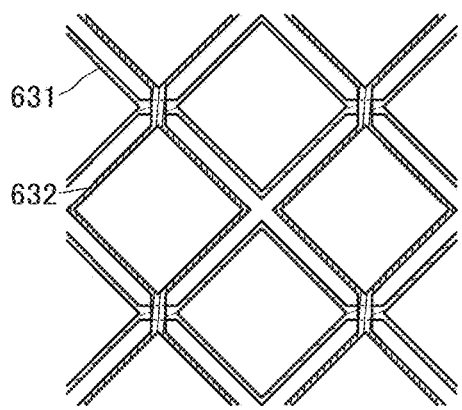

As illustrated in FIG. 36D, a design in which rhombic electrode patterns of the electrodes 631 and 632 illustrated in FIG. 36B are hollowed out and only edge portions are left may be used. At that time, when the electrodes 631 and 632 are too small in width for the users to see, the electrodes 631 and 632 can be formed using a light-blocking material such as a metal or an alloy, as will be described later. In addition, either the electrodes 631 or 632 illustrated in FIG. 36D may include the above bridge electrodes 634.

One of the electrodes 631 is electrically connected to one of the wirings 652. One of the electrodes 632 is electrically connected to one of the wirings 653. Here, either one of the electrodes 631 and 632 corresponds to the above row wiring, and the other corresponds to the above column wiring.

The IC 651 has a function of driving the touch sensor. A signal output from the IC 651 is supplied to either of the electrodes 631 and 632 through the wirings 652 or 653. A current (or a potential) flowing to either of the electrodes 631 and 632 is input to the IC 651 through the wirings 652 or 653.

When a touch panel is formed in such a manner that the input device 610 is stacked over a display surface of the display panel, a light-transmitting conductive material is preferably used for the electrodes 631 and 632. In the case where a light-transmitting conductive material is used for the electrodes 631 and 632 and light from the display panel is extracted through the electrodes 631 or 632, it is preferable that a conductive film containing the same conductive material be arranged between the electrodes 631 and 632 as a dummy pattern. Part of a space between the electrodes 631 and 632 is filled with the dummy pattern, which can reduce variation in light transmittance. As a result, unevenness in luminance of light transmitted through the input device 610 can be reduced.

As a light-transmitting conductive material, a conductive oxide such as indium oxide, indium tin oxide, indium zinc oxide, zinc oxide, or zinc oxide to which gallium is added can be used. Note that a film containing graphene may be used as well. The film containing graphene can be formed, for example, by reducing a film containing graphene oxide. As a reducing method, a method with application of heat or the like can be employed.

Further, a metal film or an alloy film which is thin enough to have a light-transmitting property can be used. For example, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material or the alloy material (e.g., titanium nitride), or the like may be used. Alternatively, a stacked film in which two or more of conductive films containing the above materials are stacked may be used.

For the electrodes 631 and 632, a conductive film which is processed to be too thin for the users to see may be used. Such a conductive film is processed into a lattice shape (a mesh shape), for example, which makes it possible to achieve both high conductivity and high visibility of the display device. It is preferable that the conductive film have a portion in which the width is greater than or equal to 30 nm and less than or equal to 100 μm, preferably greater than or equal to 50 nm and less than or equal to 50 μm and further preferably greater than or equal to 50 nm and less than or equal to 20 μm. In particular, the conductive film having the pattern width of 10 μm or less is extremely difficult for the users to see, which is preferable.

FIGS. 37A to 37D are examples of an enlarged schematic view in which a conductive film or a nanowire having a lattice shape (a mesh shape) is used for the electrodes 631 or the electrodes 632.

Figure 37A:
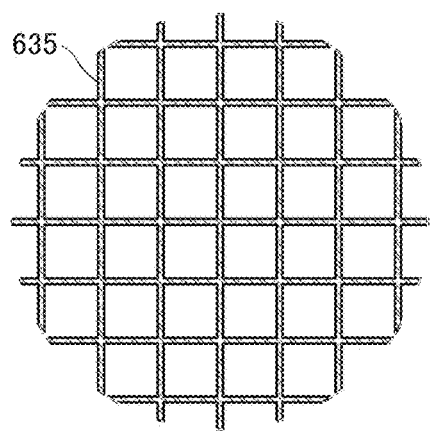
FIGS. 37A to 37D illustrate an input device.

FIG. 37A shows an example of the case where a lattice-shape conductive film 635 is used. The conductive film 635 is preferably placed so as not to overlap with the display element included in the display device because light from the display element is not blocked. In that case, it is preferable that the direction of the lattice be the same as the direction of the display element arrangement and that the pitch of the lattice be an integer multiple of the pitch of the display element arrangement.

Figure 37B:
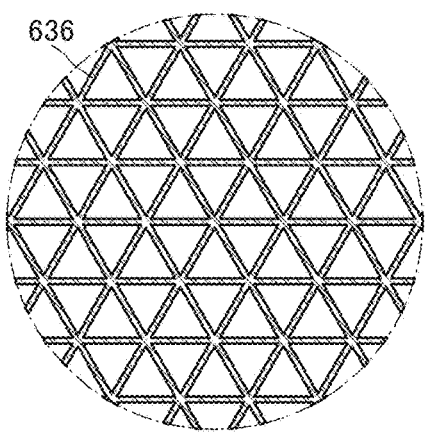

FIG. 37B shows an example of a lattice-shape conductive film 636, which is processed so as to be provided with triangle openings. Such a structure makes it possible to further reduce the resistance compared with the structure shown in FIG. 37A.

Figure 37C:
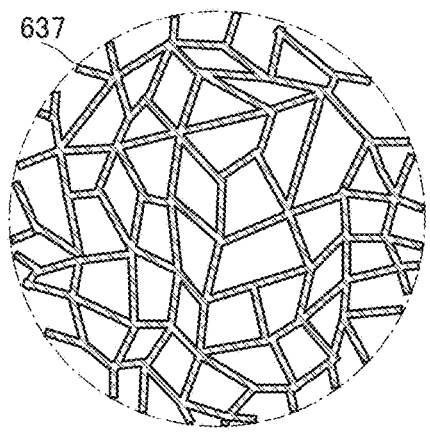

In addition, a conductive film 637, which has an irregular pattern shape, may be used as illustrated in FIG. 37C. Such a structure can prevent generation of moire when overlapping with the display portion of the display device.

Figure 37D:
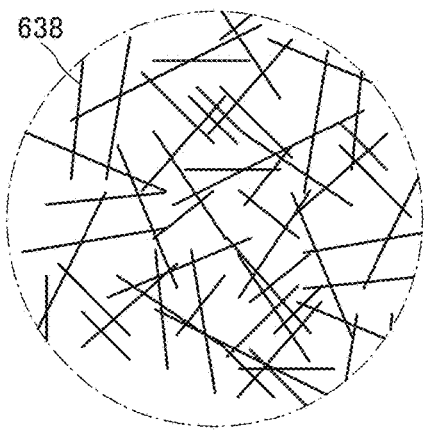

Conductive nanowires may be used for the electrodes 631 and 632. FIG. 37D shows an example of the case where nanowires 638 are used. The nanowires 638 are dispersed at appropriate density so as to be in contact with the adjacent nanowires, which can form a two-dimensional network; therefore, a conductive film with extremely high light-transmitting property can be provided. For example, a nanowire which has a mean value of the diameters of greater than or equal to 1 nm and less than or equal to 100 nm, preferably greater than or equal to 5 nm and less than or equal to 50 nm and further preferably greater than or equal to 5 nm and less than or equal to 25 nm, can be used. As the nanowire 638, a metal nanowire such as an Ag nanowire, a Cu nanowire, and an Al nanowire, a carbon nanotube, or the like can be used.

The above is the description of the input device.

<5-3. Cross-Sectional Structure Example>

Figure 38:
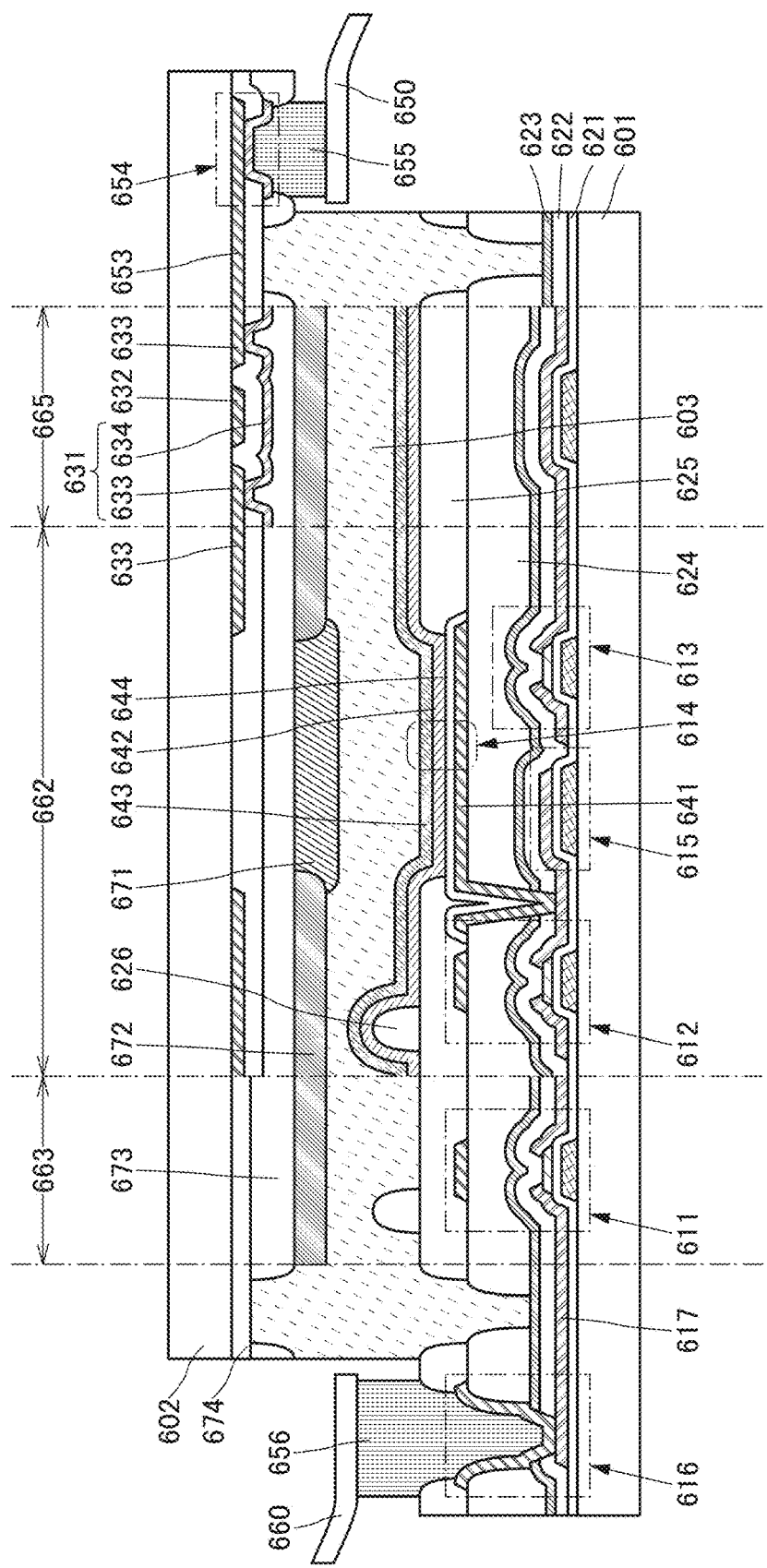
FIG. 38 illustrates an input/output device.

Next, an example of a cross-sectional structure of the touch panel 600 will be described with reference to a drawing. FIG. 38 is a schematic cross-sectional view of the touch panel 600. FIG. 38 illustrates cross sections of a region including the FPC 660, a region including the driver circuit 663, a region including the display portion 662, and a region including the FPC 650 in FIG. 35A.

The substrates 601 and 602 are attached to each other with an adhesive layer 603.

The following are provided between the substrates 601 and 602: a transistor 611, a driving transistor 612, a selection transistor 613, a display element 614, a capacitor 615, a connection portion 616, a wiring 617, and the like.

Insulating layers 621, 622, 623, 624, and 625, a spacer 626, and the like are provided over the substrate 601. A portion of the insulating layer 621 functions as a gate insulating layer of each transistor, and another portion thereof functions as a dielectric of the capacitor 615. The insulating layers 622, 623, and 624 are provided to cover each transistor, the capacitor 615, and the like. The insulating layer 624 functions as a planarization layer. Note that an example where the three insulating layers, the insulating layers 622, 623, and 624, are provided to cover the transistors and the like is described here; however, one embodiment of the present invention is not limited to this example, and four or more insulating layers, a single insulating layer, or two insulating layers may be provided. The insulating layer 624 functioning as a planarization layer is not necessarily provided when not needed.

The display element 614 is provided over the insulating layer 624. An example where a top-emission organic EL element is used as the display element 614 is described here. The driving transistor 612, the selection transistor 613, the capacitor 615, a wiring, and the like are provided to overlap with a light-emitting region of the display element 614. Thus, an aperture ratio of the display portion 662 can be increased.

The display element 614 includes an EL layer 642 between a first electrode 641 and a second electrode 643. An optical adjustment layer 644 is provided between the first electrode 641 and the EL layer 642. The insulating layer 625 is provided to cover end portions of the first electrode 641 and the optical adjustment layer 644.

FIG. 38 illustrates a cross section of one pixel as an example of the display portion 662. An example where the pixel includes the driving transistor 612, the selection transistor 613, and the capacitor 615 is described here. One of a source and a drain of the driving transistor 612 and one electrode of the capacitor 615 are electrically connected to the first electrode 641 through an opening provided in the insulating layers 622, 623, and 624.

FIG. 38 shows an example of the driver circuit 663 in which the transistor 611 is provided.

In the example shown in FIG. 38, the transistor 611 and the driving transistor 612 each have a structure in which a semiconductor layer where a channel is formed is provided between two gate electrodes.

Note that the transistors provided in the driver circuit 663 and the display portion 662 may have the same structure or different structures.

The spacer 626 is provided over the insulating layer 625 and has a function of adjusting the distance between the substrates 601 and 602. Alternatively, a particulate spacer may be used instead of the spacer 626.

The connection portion 616 is provided in a region near an end portion of the substrate 601. The connection portion 616 is electrically connected to the FPC 660 through a connection layer 656.

The electrodes and the like in the touch sensor are provided on the substrate 601 side of the substrate 602. Specifically, the electrodes 632 and 633, the wiring 652 (not illustrated), the wiring 653, and the like are formed over the substrate 602; an insulating layer 674 is formed to cover these components; and a bridge electrode 634 and the like are formed over the insulating layer 674. An insulating layer 673 is provided to cover the electrodes and the like of the touch sensor. In addition, a coloring layer 671, a light-blocking layer 672, and the like are provided over the insulating layer 673. The light-blocking layer 672 has an opening, and the opening is provided to overlap with a display region of the display element 614.

An example where the electrode 631 includes the electrode 633 and the bridge electrode 634 is described here. As illustrated in a crossing portion 665 in FIG. 38, the electrodes 632 and 633 are formed on the same plane. The bridge electrode 634 is provided over the insulating layer 674 which covers the electrodes 632 and 633. The bridge electrode 634 electrically connects two electrodes 633, between which the electrode 632 is provided, through openings formed in the insulating layer 674.

Here, the example in which the electrodes 633 have a mesh (lattice) shape is shown. At this time, a space between the electrodes 633 is preferably placed so as to overlap with the display region of the display element 614 because light from the display element 614 is not blocked by the electrode 633. Note that it is preferable that the electrode 632 and the bridge electrode 634 have a mesh shape in the same way as the electrode 633.

A connection portion 654 is provided in a region near an end portion of the substrate 602. The connection portion 654 is electrically connected to the FPC 650 through a connection layer 655.

Figure 39:
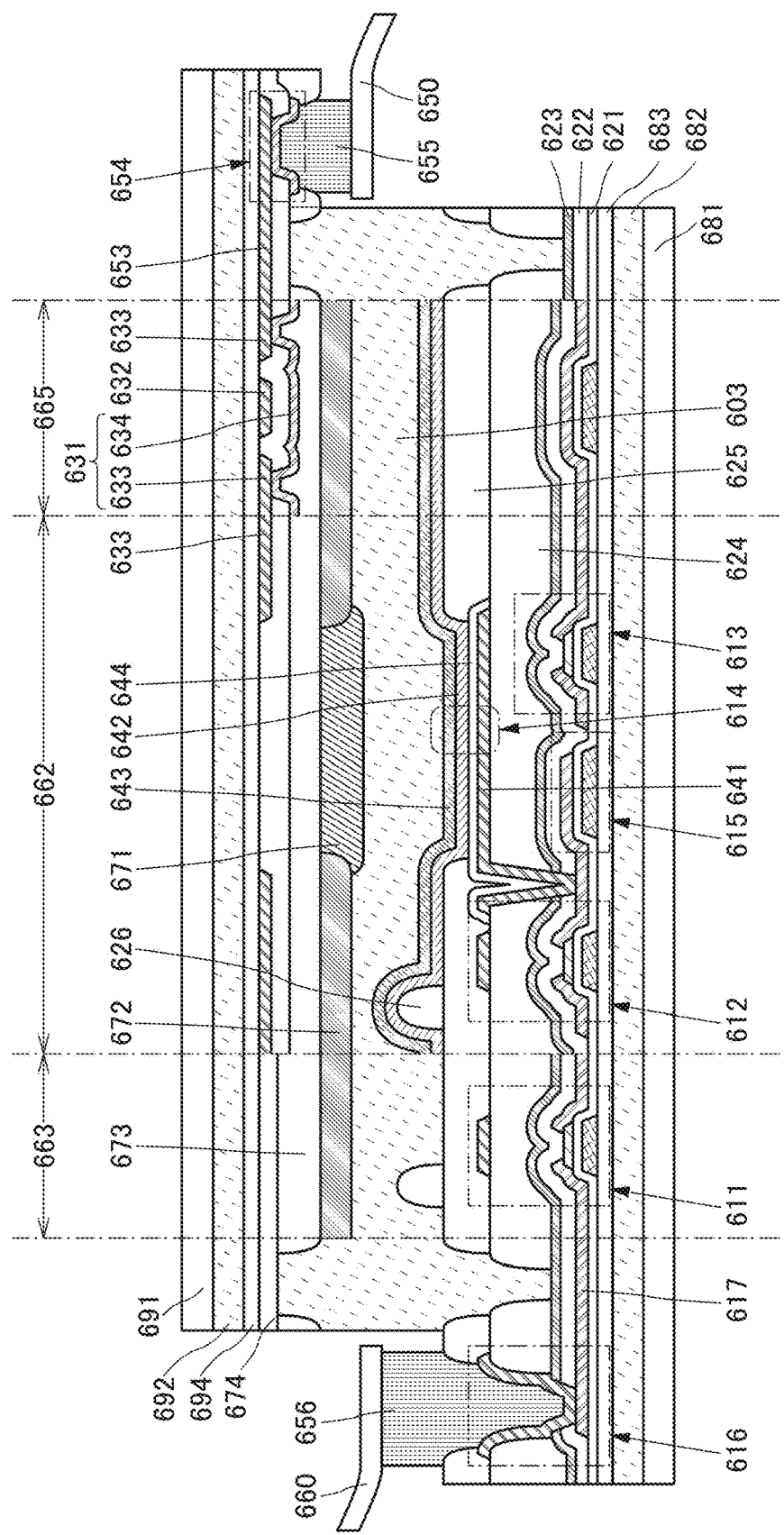
FIG. 39 illustrates an input/output device.

The touch panel in FIG. 39 has a stacked-layer structure including a substrate 681, an adhesive layer 682, and an insulating layer 683 in place of the substrate 601. The touch panel also has a stacked-layer structure including a substrate 691, an adhesive layer 692, and an insulating layer 694 in place of the substrate 602.

With the use of a material having flexibility for the substrates 681 and 691, a bendable touch panel can be achieved.

<5-4. Example of Manufacturing Method>

Here, a method for manufacturing a flexible touch panel will be described.

For convenience, a structure including a pixel and a circuit, a structure including an optical member such as a color filter, a structure including electrodes and wirings in a touch sensor, or the like is referred to as an element layer. An element layer includes a display element, for example, and may include a wiring electrically connected to the display element or an element such as a transistor used in a pixel or a circuit in addition to the display element.

Here, a support body (e.g., the substrate 681 or 691 in FIG. 39) with an insulating surface where an element layer is formed is referred to as a substrate.

As a method for forming an element layer over a flexible substrate provided with an insulating surface, there are a method in which an element layer is formed directly over a substrate, and a method in which an element layer is formed over a supporting base that is different from a substrate and then the element layer is separated from the supporting base and transferred to the substrate.

In the case where a material of the substrate can withstand heating temperature in a process for forming the element layer, it is preferable that the element layer be formed directly over the substrate, in which case a manufacturing process can be simplified. At this time, the element layer is preferably formed in a state where the substrate is fixed to the supporting base, in which case transfer thereof in an apparatus and between apparatuses can be easy.

In the case of employing the method in which the element layer is formed over the supporting base and then transferred to the substrate, first, a separation layer and an insulating layer are stacked over the supporting base, and then the element layer is formed over the insulating layer. Next, the element layer is separated from the supporting base and then transferred to the substrate. At this time, a material is selected such that separation at an interface between the supporting base and the separation layer, at an interface between the separation layer and the insulating layer, or in the separation layer occurs.

For example, it is preferable that a stacked layer of a layer including a high-melting-point metal material, such as tungsten, and a layer including an oxide of the metal material be used as the separation layer, and a stacked layer of a plurality of layers, such as a silicon nitride layer and a silicon oxynitride layer be used as the insulating layer over the separation layer. The use of the high-melting-point metal material is preferable because the degree of freedom of the process for forming the element layer can be increased.

The separation may be performed by application of mechanical power, by etching of the separation layer, by dripping of a liquid into part of the separation interface to penetrate the entire separation interface, or the like. Alternatively, separation may be performed by heating the separation interface by utilizing a difference in thermal expansion coefficient.

The separation layer is not necessarily provided in the case where separation can occur at an interface between the supporting base and the insulating layer. For example, glass is used as the supporting base and an organic resin such as polyimide is used for the insulating layer, in which case separation can be performed at an interface between the glass and the insulating layer by formation of a separation trigger by locally heating part of the organic resin by laser light or the like. Alternatively, a metal layer may be provided between the supporting base and the insulating layer formed of an organic resin, and separation may be performed at the interface between the metal layer and the insulating layer by heating the metal layer by feeding current to the metal layer. Alternatively, a layer of a light-absorbing material (e.g., a metal, a semiconductor, or an insulator) may be provided between the supporting base and the insulating layer formed of an organic resin and may be locally heated by being irradiated with laser light or the like to form a separation trigger. In these methods, the insulating layer formed of an organic resin can be used as a substrate.

Examples of materials of flexible substrates include polyester resins such as polyethylene terephthalate (PET) and polyethylene naphthalate (PEN), a polyacrylonitrile resin, a polyimide resin, a polymethyl methacrylate resin, a polycarbonate resin, a polyethersulfone (PES) resin, a polyamide resin, a cycloolefin resin, a polystyrene resin, a polyamide imide resin, and a polyvinyl chloride resin. In particular, it is preferable to use a material whose thermal expansion coefficient is low, and for example, a polyamide imide resin, a polyimide resin, or PET with a thermal expansion coefficient of $30 \times 10^{-6}$/K or less can be suitably used. A substrate in which a fibrous body is impregnated with a resin (also referred to as prepreg) or a substrate whose thermal expansion coefficient is reduced by mixing an inorganic filler with an organic resin can also be used.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven fabric or a nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Alternatively, glass, metal, or the like that is thin enough to have flexibility can be used as the substrate. Alternatively, a composite material where glass and a resin material are bonded to each other may be used.

In the structure shown in FIG. 39, for example, a first separation layer and the insulating layer 683 are formed in this order over a first supporting base, and then components over the first separation layer and the insulating layer 683 are formed. Separately, a second separation layer and the insulating layer 694 are formed in this order over a second supporting base, and then upper components are formed. Next, the first supporting base and the second supporting base are attached to each other with the adhesive layer 603. After that, separation at an interface between the second separation layer and the insulating layer 694 is performed so that the second supporting base and the second separation layer are removed, and then the substrate 691 is attached to the insulating layer 694 with the adhesive layer 692. Furthermore, separation at an interface between the first separation layer and the insulating layer 683 is performed so that the first supporting base and the first separation layer are removed, and then the substrate 681 is attached to the insulating layer 683 with the adhesive layer 682. Note that either side may be subjected to separation and attachment first.

The above is the description of a method for manufacturing a flexible touch panel.

The structure described in this embodiment can be combined as appropriate with any of the structures described in the other embodiments, examples, and a reference example.

Embodiment 6

In this embodiment, examples of an applicable circuit configuration of the transistor described in the above embodiment will be described with reference to FIGS. 40A to 40C, FIGS. 41A to 41C, FIGS. 42A and 42B, and FIGS. 43A and 43B.

Note that in this embodiment, the transistor including an oxide semiconductor described in the above embodiment is referred to as an OS transistor in the following description.

<6. Circuit Configuration Example of Inverter>

Figure 40A:
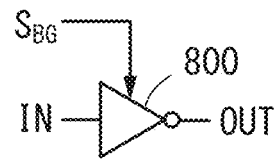
FIGS. 40A to 40C are circuit diagrams and a timing chart illustrating one embodiment of the present invention.

FIG. 40A is a circuit diagram of an inverter which can be used for a shift register, a buffer, or the like included in the driver circuit. An inverter 800 outputs a signal whose logic is inverted from the logic of a signal supplied to an input terminal IN to an output terminal OUT. The inverter 800 includes a plurality of OS transistors. A signal $S_{BG}$ can switch electrical characteristics of the OS transistors.

Figure 40B:
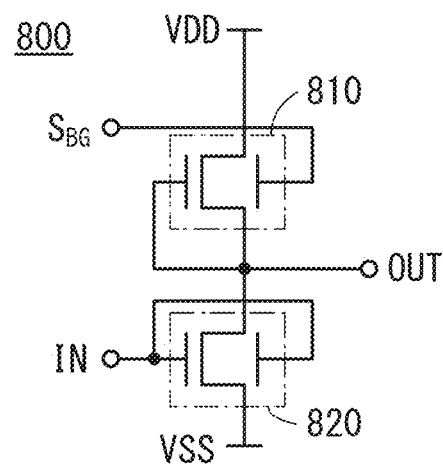

FIG. 40B is a circuit diagram showing an example of the inverter 800. The inverter 800 includes OS transistors 810 and 820. The inverter 800 can be formed using a circuit in which all the transistors have n-channel conductivity, that is, a circuit in which all the transistors have the same conductivity. Since the inverter 800 can be formed using a circuit in which all the transistors have n-channel conductivity, the inverter 800 can be formed at lower cost than in the case of using a complementary metal oxide semiconductor (CMOS) for an inverter (the inverter is referred to as a CMOS inverter).

Note that the inverter 800 including the OS transistors can be provided on a CMOS inverter including Si transistors. The inverter 800 can be provided so as to overlap with the CMOS inverter; therefore, no additional circuit area is required for the inverter 800.

Each of the OS transistors 810 and 820 includes a first gate functioning as a front gate, a second gate functioning as a back gate, a first terminal functioning as one of a source and a drain, and a second terminal functioning as the other of the source and the drain.

The first gate of the OS transistor 810 is connected to the second terminal of the OS transistor 810. The second gate of the OS transistor 810 is connected to a wiring which transmits the signal $S_{BG}$. The first terminal of the OS transistor 810 is connected to a wiring which supplies a voltage VDD. The second terminal of the OS transistor 810 is connected to the output terminal OUT.

The first gate of the OS transistor 820 is connected to the input terminal IN. The second gate of the OS transistor 820 is connected to the input terminal IN. The first terminal of the OS transistor 820 is connected to the output terminal OUT. The second terminal of the OS transistor 820 is connected to a wiring which supplies a voltage VSS.

Figure 40C:
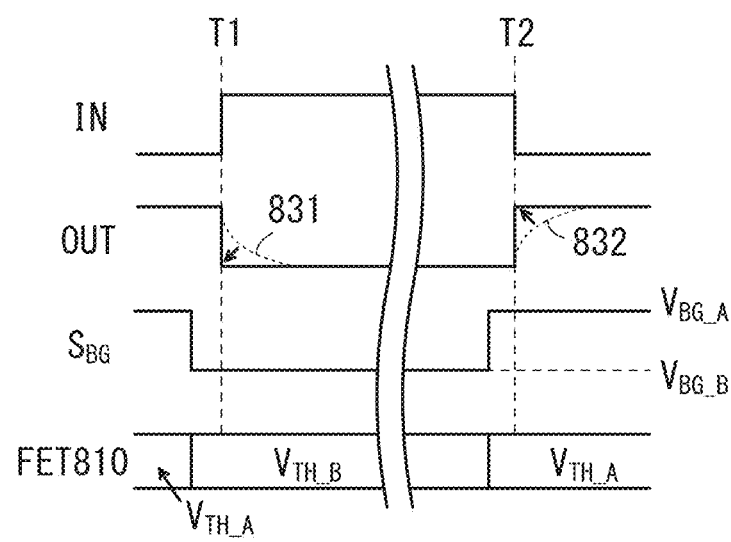

FIG. 40C is a timing chart illustrating operation of the inverter 800. The timing chart in FIG. 40C illustrates changes of a signal waveform of the input terminal IN, a signal waveform of the output terminal OUT, a signal waveform of the signal $S_{BG}$, and a threshold voltage of the OS transistor 810 (FET 810).

The signal $S_{BG}$ can control the threshold voltage of the OS transistor 810 by being supplied to the second gate of the OS transistor 810.

For example, the signal $S_{BG}$ include a voltage $V_{BG\_A}$ for shifting the threshold voltage of the OS transistor 810 in the negative direction and a voltage $V_{BG\_B}$ for shifting the threshold voltage of the OS transistor 810 in the positive direction. The threshold voltage of the OS transistor 810 is at $V_{TH\_A}$ when the voltage of the signal $S_{BG}$ is set to $V_{BG\_A}$. The threshold voltage of the OS transistor 810 is at $V_{TH\_B}$ when the voltage of the signal $S_{BG}$ is set to $V_{BG\_B}$.

Figure 41A:
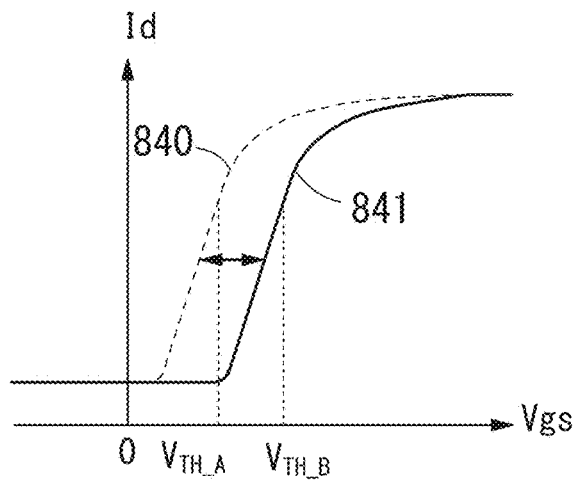
FIGS. 41A to 41C are a graph and circuit diagrams illustrating one embodiment of the present invention.

FIG. 41A is a conceptual diagram of $V_g$-$I_d$ curve showing electrical characteristics of the OS transistor 810 for describing the above concept.

As in FIG. 41A, a curve indicated by a dashed line 840 can be obtained when the voltage of the signal $S_{BG}$ is set to $V_{BG\_A}$ and the threshold voltage of the OS transistor 810 is set to $V_{TH\_A}$. A curve indicated by a solid line 841 can be obtained when the voltage of the signal $S_{BG}$ is set to $V_{BG\_B}$ and the threshold voltage of the OS transistor 810 is set to $V_{TH\_B}$. In other words, current cannot easily flow to the OS transistor 810 when the voltage of the signal $S_{BG}$ is set to $V_{BG\_B}$ and the threshold voltage of the OS transistor 810 is set to $V_{TH\_B}$. Current can easily flow to the OS transistor 810 when the voltage of the signal $S_{BG}$ is set to $V_{BG\_A}$ and the threshold voltage of the OS transistor 810 is set to $V_{TH\_A}$.

Figure 41B:
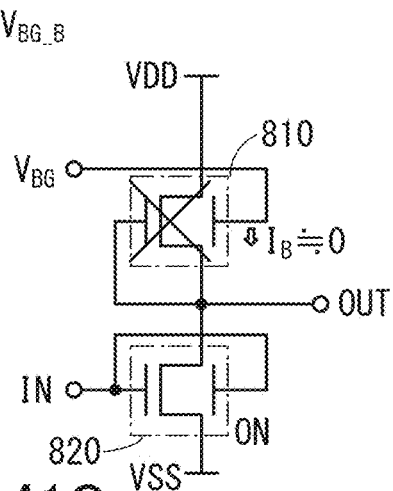
Figure 41C:
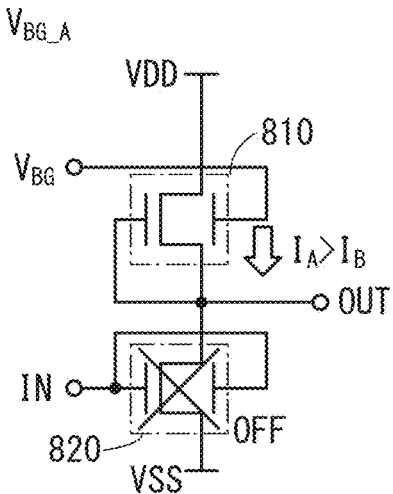

FIGS. 41B and 41C are circuit diagrams illustrating the above concept. FIG. 41B is the circuit diagram when the voltage of the signal $S_{BG}$ is set to $V_{BG\_B}$, and FIG. 41C is the circuit diagram when the voltage of the signal $S_{BG}$ is set to $V_{BG\_A}$.

As in FIG. 41B, a current $I_B$ flowing to the OS transistor 810 can be made extremely low; therefore, a drop in the voltage of the output terminal OUT can be made steep when the signal supplied to the input terminal IN is at a high level and the OS transistor 820 is in an on state. Therefore, a change of a signal waveform 831 of the output terminal OUT can be made steep in the timing chart in FIG. 40C. Moreover, the inverter 800 can operate with low power consumption because a shoot-through current that flows between the wiring which supplies the voltage VDD and the wiring which supplies the voltage VSS can be made low.

As in FIG. 41C, a current $I_A$ flowing to the OS transistor 810 is higher than the current $I_B$; therefore, a rise in the voltage of the output terminal OUT can be made steep when a signal supplied to the input terminal IN is at a low level and the OS transistor 820 is in an off state. Therefore, a change of a signal waveform 832 of the output terminal OUT can be made steep in the timing chart in FIG. 40C.

Note that the threshold voltage of the transistor 810 is preferably controlled by the signal $S_{BG}$ before the state of the OS transistor 820 is switched, i.e., before Time T1 or T2. For example, as in FIG. 40C, it is preferable that the threshold voltage of the OS transistor 810 be switched from $V_{TH\_A}$ to $V_{TH\_B}$ before Time T1 at which the level of the signal supplied to the input terminal IN is changed to a high level. Moreover, as in FIG. 40C, it is preferable that the threshold voltage of the OS transistor 810 be switched from $V_{TH\_B}$ to $V_{TH\_A}$ before Time T2 at which the level of the signal supplied to the input terminal IN is changed to a low level.

Although FIG. 40C illustrates the case where the level of the signal $S_{BG}$ is changed in accordance with the signal supplied to the input terminal IN, a different configuration in which voltage for controlling the threshold voltage is held in the second gate of the OS transistor 810 in a floating state may be employed, for example. This can be achieved with a circuit configuration in FIG. 42A which is illustrated as an example.

Figure 42A:
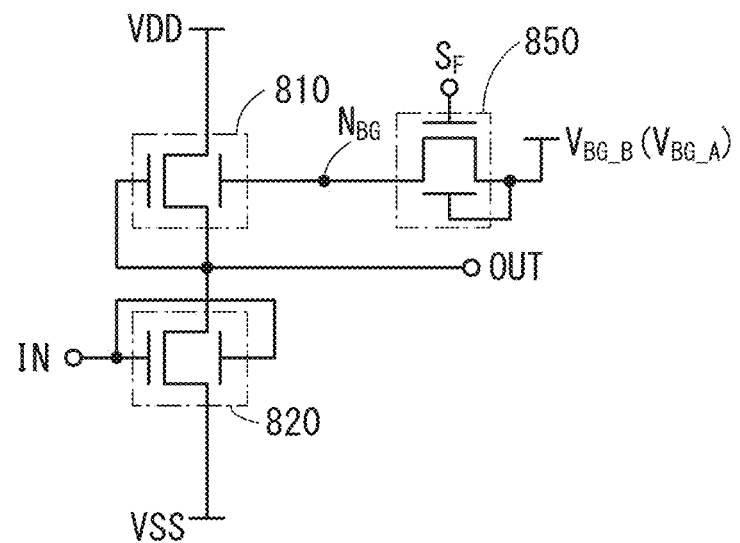
FIGS. 42A and 42B are a circuit diagram and a timing chart illustrating one embodiment of the present invention.

The circuit configuration in FIG. 42A is the same as that in FIG. 40B, except that an OS transistor 850 is added. A first terminal of the OS transistor 850 is connected to the second gate of the OS transistor 810. A second terminal of the OS transistor 850 is connected to a wiring which supplies the voltage $V_{BG\_B}$ (or the voltage $V_{BG\_A}$). A first gate of the OS transistor 850 is connected to a wiring which supplies a signal $S_F$. A second gate of the OS transistor 850 is connected to the wiring which supplies the voltage $V_{BG\_B}$ (or the voltage $V_{BG\_A}$).

Figure 42B:
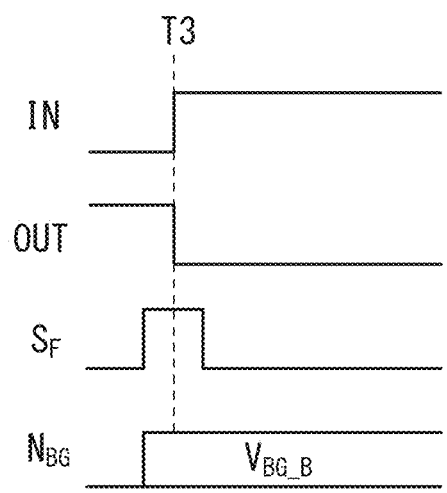

The operation with the circuit configuration in FIG. 42A is described with reference to the timing chart in FIG. 42B.

The voltage for controlling the threshold voltage of the OS transistor 810 is supplied to the second gate of the OS transistor 810 before Time T3 at which the level of the signal supplied to the input terminal IN is changed to a high level. The signal $S_F$ is set to a high level and the OS transistor 850 is turned on, so that the voltage $V_{BG\_B}$ for controlling the threshold voltage is supplied to a node $N_{BG}$.

The OS transistor 850 is turned off after the voltage of the node $N_{BG}$ becomes $V_{BG\_B}$. The off-state current of the OS transistor 850 is extremely low and thus, when the OS transistor 850 is kept in an off-state, the voltage $V_{BG\_B}$ which is temporarily held in the node $N_{BG}$ can be kept retained. Therefore, the number of times of operation of supplying the voltage $V_{BG\_B}$ to the second gate of the OS transistor 850 can be reduced and accordingly the power consumed to rewrite the voltage $V_{BG\_B}$ can be reduced.

Although FIGS. 40B and 42A illustrate the case where the voltage is supplied to the second gate of the OS transistor 810 by control from the outside, a different configuration in which voltage for controlling the threshold voltage is generated on the basis of the signal supplied to the input terminal IN and supplied to the second gate of the OS transistor 810 may be employed, for example. This can be achieved with a circuit configuration in FIG. 43A which is illustrated as an example.

Figure 43A:
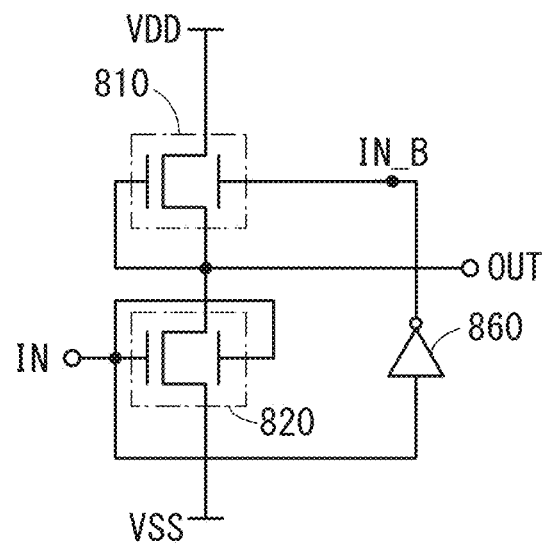
FIGS. 43A and 43B are a circuit diagram and a timing chart illustrating one embodiment of the present invention.

The circuit configuration in FIG. 43A is the same as that in FIG. 40B, except that a CMOS inverter 860 is provided between the input terminal IN and the second gate of the OS transistor 810. An input terminal of the CMOS inverter 860 is connected to the input terminal IN. An output terminal of the CMOS inverter 860 is connected to the second gate of the OS transistor 810.

The operation with the circuit configuration in FIG. 43A is described with reference to the timing chart in FIG. 43B. The timing chart in FIG. 43B illustrates changes of a signal waveform of the input terminal IN, a signal waveform of the output terminal OUT, an output waveform IN_B of the CMOS inverter 860, and a threshold voltage of the OS transistor 810 (FET 810).

The output waveform IN_B which corresponds to a signal whose logic is inverted from the logic of the signal supplied to the input terminal IN can be used as a signal that controls the threshold voltage of the OS transistor 810. Therefore, the threshold voltage of the OS transistor 810 can be controlled as described with reference to FIGS. 41A to 41C. For example, the signal supplied to the input terminal IN is at a high level and the OS transistor 820 is turned on at Time T4 in FIG. 43B. At this time, the output waveform IN_B is at a low level. Accordingly, current cannot easily flow to the OS transistor 810 and thus a drop in the voltage of the output terminal OUT can be made steep.

Figure 43B:
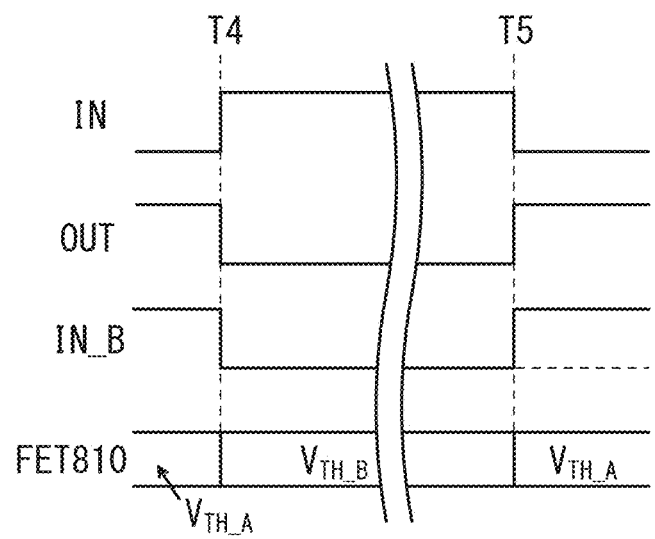

Moreover, the signal supplied to the input terminal IN is at a low level and the OS transistor 820 is turned off at Time T5 in FIG. 43B. At this time, the output waveform IN_B is at a high level. Accordingly, current can easily flow to the OS transistor 810 and thus a rise in the voltage of the output terminal OUT can be made steep.

As described above, with the configuration of the inverter including OS transistors in this embodiment, the voltage of the back gate is changed in accordance with the logic of the signal supplied to the input terminal IN. With such a configuration, the threshold voltage of the OS transistor can be controlled. A change in the voltage of the output terminal OUT can be made steep by controlling the threshold voltage of the OS transistor in accordance with the signal supplied to the input terminal IN. Moreover, a shoot-through current between the wirings which supply the power supply voltages can be reduced. Thus, a reduction in power consumption can be achieved.

The structure described in this embodiment can be combined as appropriate with any of the structures described in the other embodiments, examples, and a reference example.

Embodiment 7

In this embodiment, a display module, electronic devices, and a display device which include a semiconductor device of one embodiment of the present invention will be described with reference to FIG. 44 and FIGS. 45A to 45G.

<7-1. Display Module>

Figure 44:
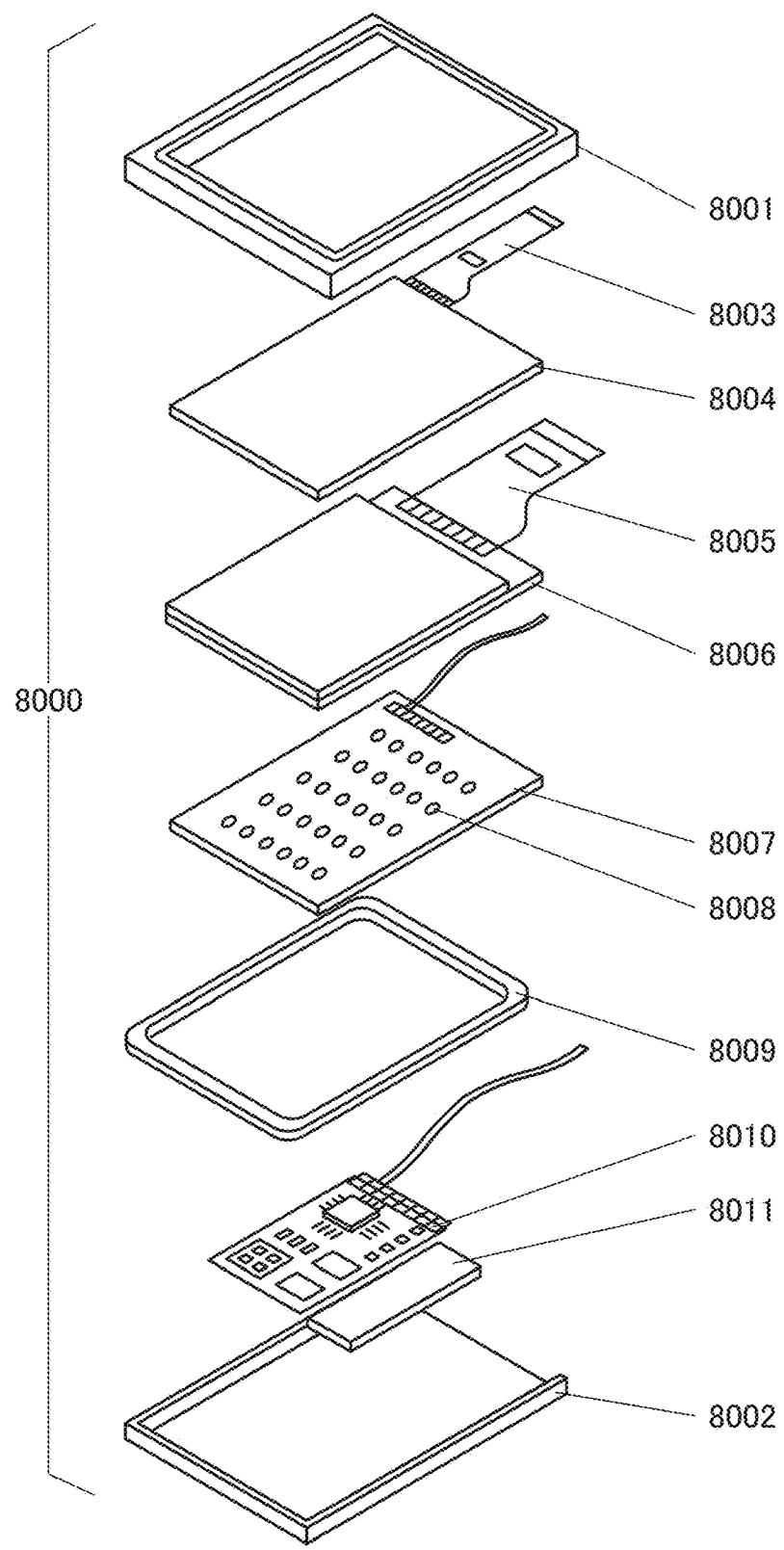
FIG. 44 illustrates a display module.

In a display module 8000 illustrated in FIG. 44, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel.

The backlight 8007 includes light sources 8008. Note that although a structure in which the light sources 8008 are provided over the backlight 8007 is illustrated in FIG. 44, one embodiment of the present invention is not limited to this structure. For example, a structure in which the light sources 8008 are provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

<7-2. Electronic Device>

FIGS. 45A to 45G illustrate electronic devices. These electronic devices can each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The electronic devices illustrated in FIGS. 45A to 45G can have a variety of functions, for example, a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a storage medium and displaying the program or data on the display portion, and the like. Note that functions of the electronic devices illustrated in FIGS. 45A to 45G are not limited thereto, and the electronic devices can have a variety of functions. Although not illustrated in FIGS. 45A to 45G, the electronic devices may each have a plurality of display portions. The electronic devices may each have a camera or the like and a function of taking a still image, a function of taking a moving image, a function of storing the taken image in a storage medium (an external storage medium or a storage medium incorporated in the camera), a function of displaying the taken image on the display portion, and the like.

The electronic devices illustrated in FIGS. 45A to 45G will be described in detail below.

Figure 45A:
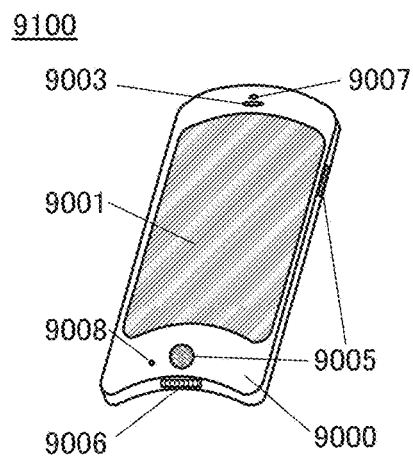
FIGS. 45A to 45G illustrate electronic devices.

FIG. 45A is a perspective view of a portable information terminal 9100. The display portion 9001 of the portable information terminal 9100 is flexible and thus can be incorporated along the curved surface of the housing 9000. Furthermore, the display portion 9001 includes a touch sensor, and operation can be performed by touching a screen with a finger, a stylus, or the like. For example, by touching an icon displayed on the display portion 9001, an application can be started.

Figure 45B:
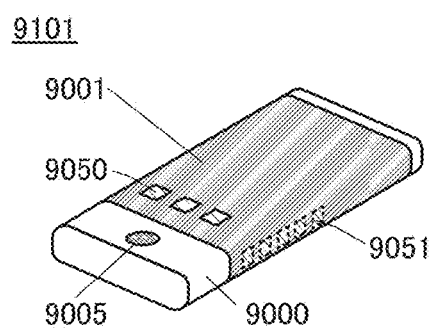

FIG. 45B is a perspective view of a portable information terminal 9101. The portable information terminal 9101 functions as, for example, one or more of a telephone set, a notebook, an information browsing system, and the like. Specifically, the portable information terminal 9101 can be used as a smartphone. Note that the speaker 9003, the connection terminal 9006, the sensor 9007, and the like in FIG. 45A, which are not illustrated in FIG. 45B, can be positioned in the portable information terminal 9101 as in the portable information terminal 9100 illustrated in FIG. 45A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming e-mail, social networking service (SNS) message, call, or the like; the title and sender of an e-mail, SNS message, or the like; the date; the time; remaining battery; the strength of an antenna; and the like. Instead of the information 9051, the operation buttons 9050 or the like may be displayed in the position where the information 9051 is displayed.

Figure 45C:
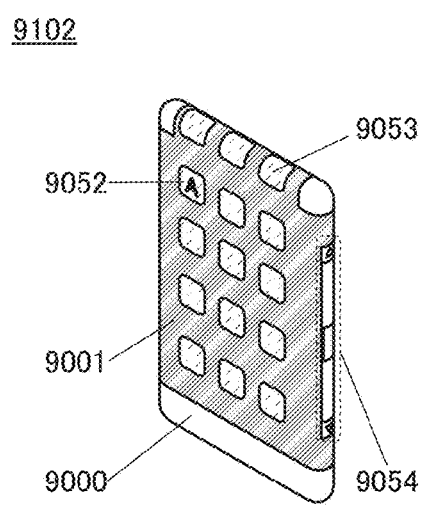

FIG. 45C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in the position that can be seen from above the portable information terminal 9102. Thus, the user can see the display without taking out the portable information terminal 9102 from the pocket and decide whether to answer the call.

Figure 45D:
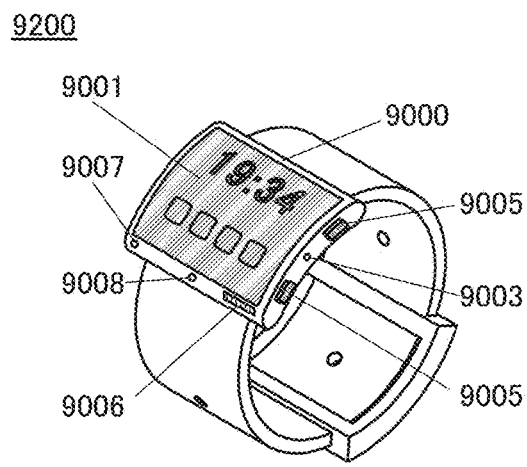

FIG. 45D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is curved, and display can be performed on the curved display surface. The portable information terminal 9200 can employ near field communication conformable to a communication standard. For example, hands-free calling can be achieved with mutual communication between the portable information terminal 9200 and a headset capable of wireless communication. Moreover, the portable information terminal 9200 includes the connection terminal 9006, and data can be directly transmitted to and received from another information terminal via a connector. Charging through the connection terminal 9006 is also possible. Note that the charging operation may be performed by wireless power feeding without using the connection terminal 9006.

Figure 45E:
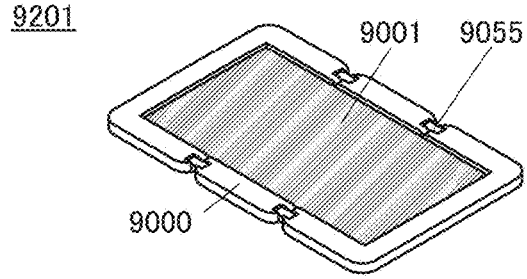
Figure 45F:
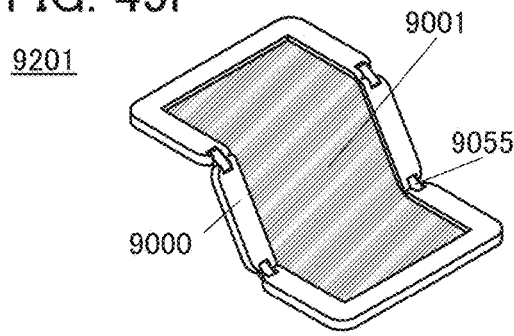
Figure 45G:
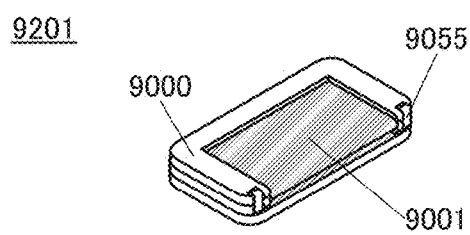

FIGS. 45E, 45F, and 45G are perspective views of a foldable portable information terminal 9201. FIG. 45E is a perspective view of the foldable portable information terminal 9201 that is opened. FIG. 45F is a perspective view of the foldable portable information terminal 9201 that is being opened or being folded. FIG. 45G is a perspective view of the foldable portable information terminal 9201 that is folded. The portable information terminal 9201 is highly portable when folded. When the portable information terminal 9201 is opened, a seamless large display region provides high browsability. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from the opened state to the folded state. For example, the portable information terminal 9201 can be bent with a radius of curvature of greater than or equal to 1 mm and less than or equal to 150 mm.

The structure described in this embodiment can be combined as appropriate with any of the structures described in the other embodiments, examples, and a reference example.

Example 1

In this example, two kinds of display devices (display devices A and B) were fabricated, and transistor characteristics, display examples, and power consumption of the display devices were evaluated.

First, the specifications of the display device A and the display device B fabricated in this example are shown in Table 1 and Table 2, respectively.

TABLE 1

Specifications

| | |
|---|---|
| Screen Diagonal | 13.3 inch (portrait) |
| Number of Pixels | 4320 × RGB (H) × 7680 (V) (8K UHD) |
| Pixel Size | 12.75 μm (H) × 38.25 μm (V) |
| Pixel Density | 664 ppi |
| Colorization | White OLED + Top emission + Color filter (WTC) |
| Pixel Configulation | RGB stripe |
| Pixel Circuit | 3 Tr + C/cell |
| Aperture Ratio | 30% |
| Frame Frequency | 120 Hz |
| Scan Driver | Integrated |
| Source Driver | COG |

TABLE 2

Specifications

| | |
|---|---|
| Screen Diagonal | 13.3 inch (portrait) |
| Number of Pixels | 4320 × RGB (H) × 7680 (V) (8K UHD) |
| Pixel Size | 12.75 μm (H) × 38.25 μm (V) |
| Pixel Density | 664 ppi |
| Colorization | White OLED + Top emission + Color filter (WTC) |
| Pixel Configulation | RGB stripe |
| Pixel Circuit | 2Tr + C/cell (3 wires in a pixel) |
| Aperture Ratio | 40% |
| Frame Frequency | 60 Hz |
| Scan Driver | Integrated |
| Source Driver | COG |

Note that in both of the display devices A and B, transistors, display elements, and the like were formed over a glass substrate with a size of 600 mm×720 mm, which is a mother glass. Note that in the display device A, the transistors, the display elements, and the like were directly formed over the glass substrate. In the display device B, the transistors, the display elements, and the like were separated from the glass substrate and transferred to a film to obtain what is called a flexible-type display device.

As each of the display elements of the display devices A and B, an organic EL element capable of emitting white light was used. The organic EL element had what is called a top-emission structure, and color filters were provided on a side where light is emitted from the EL element.

Transistors on the backplane sides of the display devices A and B had the same structure as the transistor 170 described in Embodiment 2. CAAC-IGZO was used for active layers of the transistors. Note that the display devices A and B were each provided with the monitor circuit 20 and the correction circuit 30 described in Embodiment 1.

<1-1. Characteristics of Transistor of Display Device>

First, characteristics of a transistor of the display device A is described with reference to FIGS. 46A and 46B.

Figure 46A:
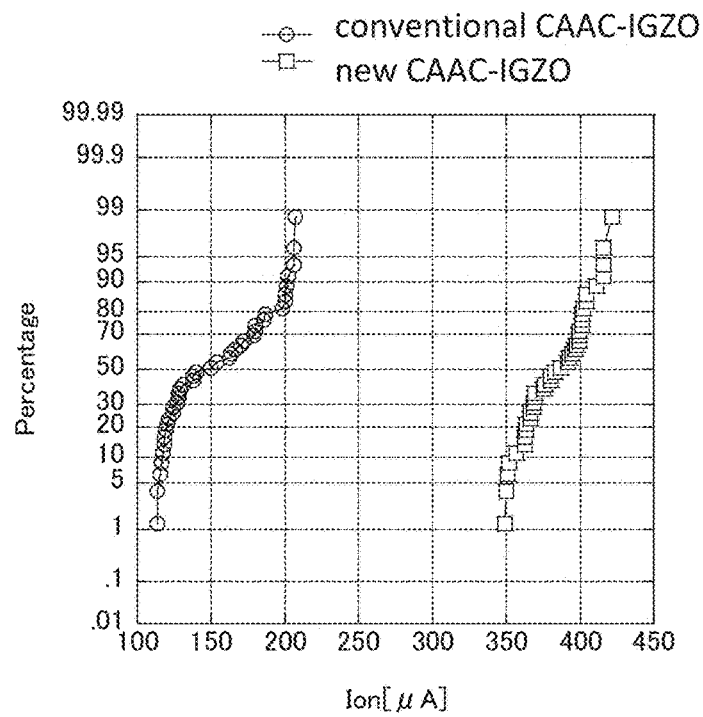
FIGS. 46A and 46B are graphs showing $I_{on}$ and $V_{th}$ of transistors in Example.
Figure 46B:
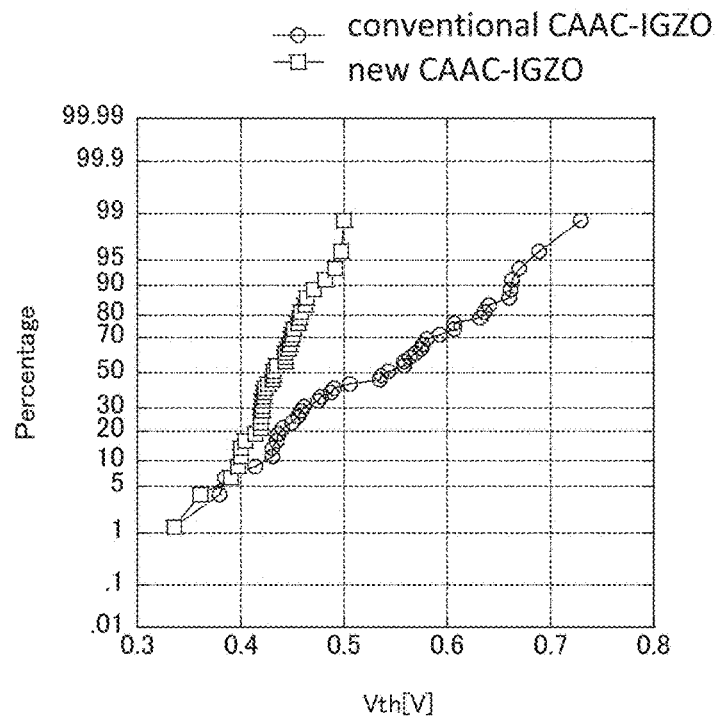

FIG. 46A shows the statistical probability of the on-state current ($I_{on}$) of transistors on the surface of the mother glass, and FIG. 46B shows the statistical probability of the threshold voltage ($V_{th}$) of the transistors on the surface of the mother glass. FIGS. 46A and 46B show measurement results of $I_{on}$ and $V_{th}$ of 40 transistors in total on the surface of the mother glass, and the size (L/W) of each transistor was 6 μm/50 μm.

In FIGS. 46A and 46B, "new CAAC-IGZO" means that an oxide semiconductor in a channel region has a stacked-layer structure, whereas "conventional CAAC-IGZO" means that an oxide semiconductor in a channel region has a single-layer structure. Note that the "new CAAC-IGZO" was used for the transistor of the display device A, and the "conventional CAAC-IGZO" was used for a display device for comparison.

Note that the above-described "new CAAC-IGZO" was also used for the transistor of the display device B.

As shown in FIGS. 46A and 46B, the transistors of the display devices A and B fabricated in this example had a high on-state current and a small in-plane variation of the on-state current and the threshold voltage.

<1-2. Display Example of Display Device>

Next, display examples of the display devices A and B are described with reference to FIG. 47 and FIGS. 48A and 48B.

Figure 47:
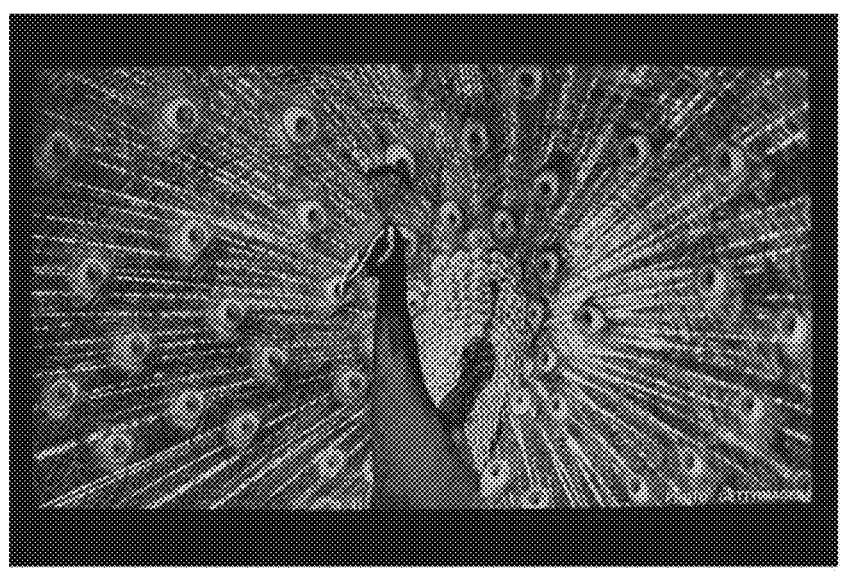
FIG. 47 shows a display example of a semiconductor device in Example.
Figure 48A:
FIGS. 48A and 48B show display examples of a semiconductor device in Example.
Figure 48B:

FIG. 47 is a display example of the display device A, and FIGS. 48A and 48B are display examples of the display device B. Note that FIG. 48A is the display example of the flexible display device which is opened, and FIG. 48B is the display example of the flexible display device which is folded in three.

As shown in FIG. 47 and FIGS. 48A and 48B, the display devices A and B fabricated in this example can provide excellent display without practical problems.

<1-3. Power Consumption of Display Device>

Next, power consumption of the display device A is described with reference to FIG. 49 and FIG. 50.

Power consumption of a scan driver mounted on the display device A was measured.

Figure 49:
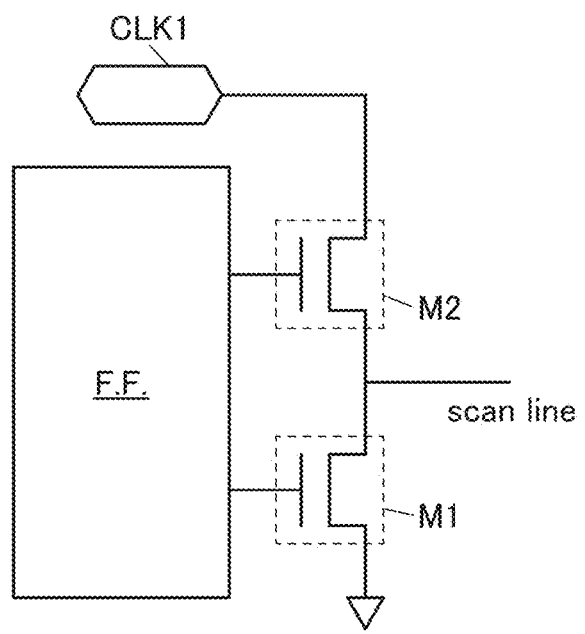
FIG. 49 illustrates a circuit diagram of a semiconductor device in Example.

FIG. 49 is a circuit diagram of the scan driver mounted on the display device A.

A scan driver 580 illustrated in FIG. 49 includes a flip-flop circuit F.F. and transistors M1 and M2.

A gate electrode of the transistor M2 is electrically connected to the flip-flop circuit F.F., one of source and drain electrodes of the transistor M2 is electrically connected to a terminal CLK1 to which a clock signal is input, and the other of the source and drain electrodes of the transistor M2 is electrically connected to the transistor M1. Note that a gate electrode of the transistor M1 is electrically connected to the flip-flop F.F. A scan line is electrically connected to the transistor M1 and the other of the source and drain electrodes of the transistor M2.

Figure 50:
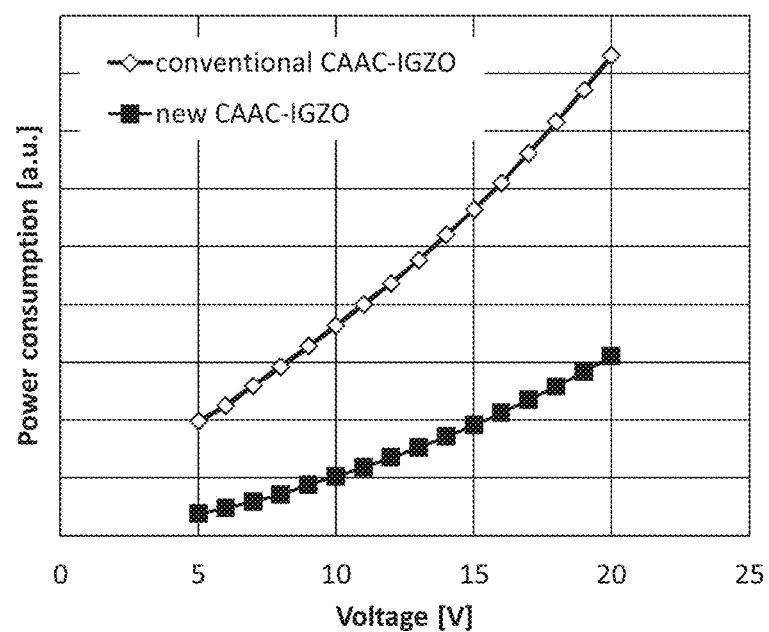
FIG. 50 shows power consumption of a semiconductor device in Example.

FIG. 50 shows evaluation results of the power consumption of the scan driver in FIG. 49.

Note that "new CAAC-IGZO" and "conventional CAAC-IGZO" shown in FIG. 50 means the same as those in FIGS. 46A and 46B.

As shown in FIG. 50, power consumption of the scan driver using the transistor including the "new CAAC-IGZO" can be reduced to approximately 35% of power consumption of the scan driver using a transistor including the "conventional CAAC-IGZO".

The structure described in this example can be combined as appropriate with any of the structures described in the embodiments, the other example, and a reference example.

Example 2

In this example, results of temperature correction performed on an actual panel using a circuit illustrated in FIG. 51 will be described.

Figure 51:
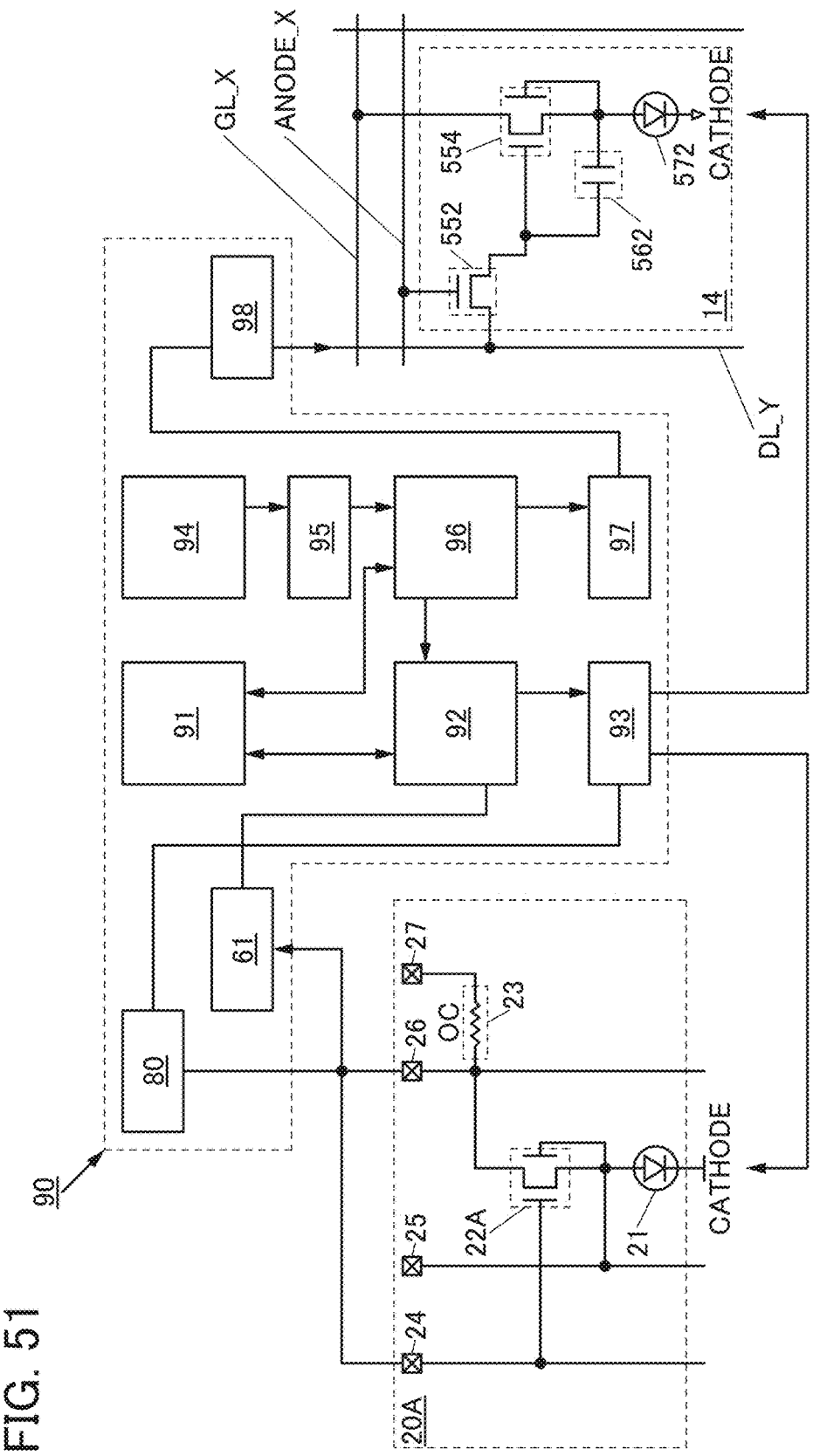
FIG. 51 illustrates a circuit configuration in Example.

The circuit illustrated in FIG. 51 includes the monitor circuit 20A, a correction circuit 90, and the pixel circuit 14.

Note that the monitor circuit 20A and the pixel circuit 14 have the same configurations as those described above; therefore, description thereof is omitted.

<2-1. Correction Circuit>

The correction circuit 90 in FIG. 51 includes a constant current circuit 80, the converter circuit 61, a PC 91, an FPGA 92, a buffer 93, a data signal transmitter 94, a DVI receiver 95, an FPGA 96, a buffer 97, and an IC 98.

The converter circuit 61 has the same configuration as that described above.

The PC 91 functions as an interface. For example, the PC 91 can calculate a cathode potential output to the monitor circuit 20A or the pixel circuit 14. Alternatively, the PC 91 can program or control a data signal output to the pixel circuit 14.

The FPGA 92 is a programmable logic device (PLD) and has a function of generating a signal in accordance with the content which is programmed by the PC 91 and assigning the signal to a desired terminal. The buffer 93 has a function of inverting the signal from the FPGA 92 or directly outputting the signal from the FPGA 92.

The data signal transmitter 94 can transmit video data of high resolution of 8K×4K, 4K×2K, or the like in a compressed state or an uncompressed state. The DVI receiver 95 has a function of receiving the data signal from the data signal transmitter 94. The FPGA 96 has a function of assigning the data signal from the DVI receiver 95 to a desired output terminal. The buffer 97 has a function of inverting the signal from the FPGA 96 or directly outputting the signal from the FPGA 96.

A source driver IC can be used as the IC 98. For example, the signal output from the buffer 97 is output to a data line (DL_Y) of the pixel circuit 14 through the IC 98.

In a method for driving the circuits in FIG. 51, for example, a predetermined current is fed to the constant current circuit 80 and then current flowing to the monitor light-emitting element 21 is monitored and cathode potentials of the monitor light-emitting element 21 and the light-emitting element 572 are adjusted.

<2-2. Luminance of Light-Emitting Element Depending on Potential Change of Cathode>

Here, the luminance of a light-emitting element which depends on a change of a cathode potential is described. A sample corresponding to the monitor circuit 20A in FIG. 51 was fabricated as will be described below. Note that in the sample corresponding to the monitor circuit 20A, the monitor light-emitting element 21 and the monitor transistor 22A were formed.

Luminance-voltage characteristics of the monitor light-emitting element 21 included in the above-described sample were measured. Note that the luminance-voltage characteristics of the monitor light-emitting element 21 were measured in a measurement environment at 70° C.

Figure 52:
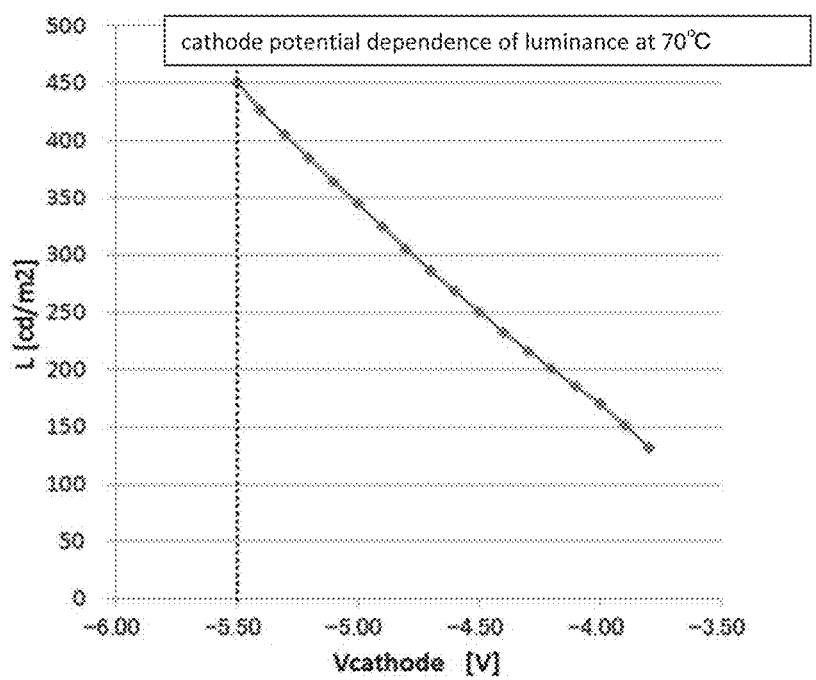
FIG. 52 shows luminance-voltage characteristics of a light-emitting element in Example.

FIG. 52 shows the measurement result. Note that in FIG. 52, the vertical axis represents luminance, and the horizontal axis represents a cathode potential.

As shown in FIG. 52, the luminance of the monitor light-emitting element 21 is changed linearly when the cathode voltage is changed, and the luminance change can be approximated by a straight line.

Note that suppressing a change in the luminance of the light-emitting element 572 by monitoring an anode potential flowing to the monitor light-emitting element 21 and changing an anode potential of the light-emitting element 572 of the pixel circuit 14 can be considered; however, in the case where the transistor 554 operates in a saturation region, there is no luminance change or an extremely small luminance change even when the anode potential of the light-emitting element 572 is changed. Therefore, the emission luminance of the light-emitting element 572 substantially depends on a difference between a potential of a data signal supplied to the data line (DL_Y) and the cathode potential of the light-emitting element 572.

<2-3. Temperature Correction Method>

Figure 53:
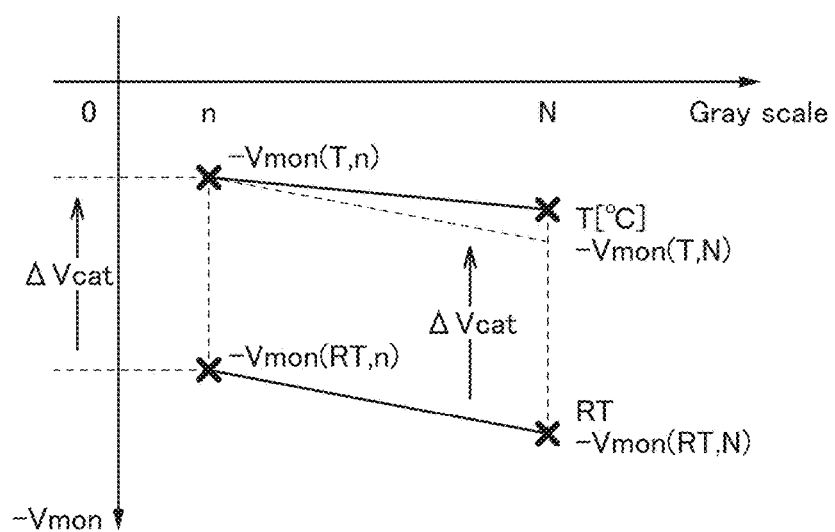
FIG. 53 illustrates a concept of a correction circuit in Example.

Next, a temperature correction method of the monitor light-emitting element 21 is described with reference to FIG. 53. FIG. 53 is a conceptual diagram illustrating the temperature correction method of the monitor light-emitting element 21.

In FIG. 53, the vertical axis represents the cathode potential of the monitor light-emitting element 21, and the horizontal axis represents a gray level of a display device. Note that in FIG. 53, the display device has 256 gray levels. The minimum gray level is 0 and the maximum gray level is 255, and n represents a low gray level side and N represents a high gray level side.

As shown in FIG. 53, the amount of change in the cathode potential of the monitor light-emitting element 21 might be different between the low gray level side (n) and the high gray level side (N). Thus, in the case where room temperature, a predetermined temperature, and a predetermined gray level are denoted by "temperature RT", "temperature T", and "gray level k", respectively, the following four monitor potentials can be obtained supposing that a monitor potential in the case where current at the temperature T and the gray level k is fed to the monitor light-emitting element 21 is Vmon(T,k):

low gray level side (n), Vmon(RT,n),
low gray level side (n), Vmon(T,n),
high gray level side (N), Vmon(RT,N), and
high gray level side (N), Vmon(T,N).

As shown in FIG. 53, the correction amount on the low gray level side is smaller than that on the high gray level side; therefore, the monitor potential on the low gray level side is used as a reference for the cathode potential of the monitor light-emitting element 21. Thus, the cathode potential of the monitor light-emitting element 21 is changed only by the amount represented by Formula 1. In Formula 1, α represents the correction coefficient.

[Formula 1]

$$\{Vmon(T,n) - Vmon(RT,n)\} \times \alpha \quad (1)$$

A monitor potential difference between the temperature T and the temperature RT gets larger as the gray level increases and therefore the data signal is corrected to take an increase in the monitor potential difference into account. The amount of change in the data signal is represented by Formula 2. In Formula 2, α and β each represent the correction coefficient.

[Formula 2]

$$\frac{n-k}{N-n}[\alpha \times \{Vmon(T, N) - Vmon(RT, N)\} - \beta \times \{Vmon(T, n) - Vmon(RT, n)\}] \quad (2)$$

According to the above, in the temperature correction method in the circuit configuration in FIG. 51, the cathode potentials of the monitor light-emitting element 21 and the light-emitting element 572 are corrected in accordance with the measurement environment. The emission luminance of the light-emitting element 572 can be adjusted in such a manner that the temperature correction of the monitor light-emitting element 21 that is not sufficient by correction of the cathode potential of the light-emitting element 572 can be achieved by correction of the data signal.

Note that one embodiment of the present invention is not limited to the case described in this example, in which the cathode potential of the light-emitting element and the potential of the data signal are corrected; for example, a configuration in which only the cathode potential of the light-emitting element is corrected or a configuration in which only an anode potential of the light-emitting element is corrected may be employed. However, as described in this example, it is preferable to correct both the cathode potential and the potential of the data signal.

<2-4. Results of Luminance-Gray Level Characteristics of Light-Emitting Elements>

Next, luminance-gray level characteristics of light-emitting elements obtained by the above-described temperature correction method are described.

Figure 54:
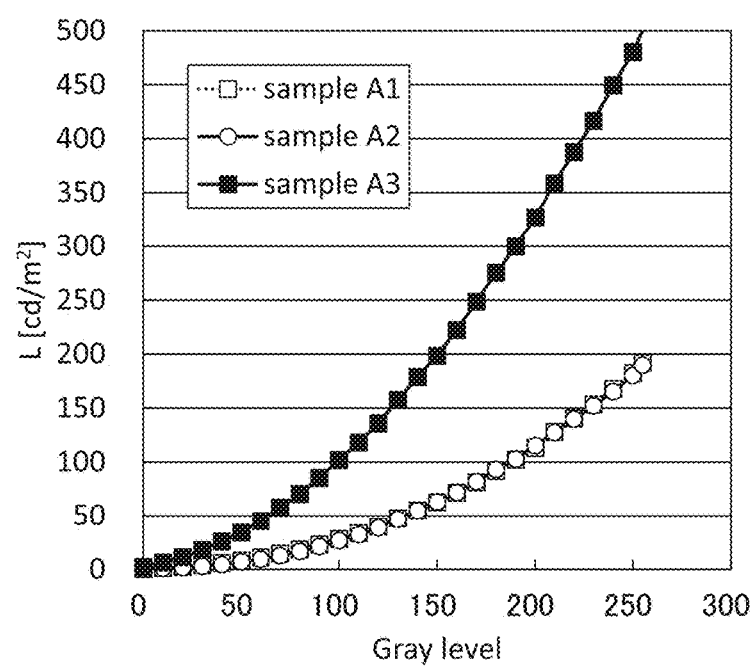
FIG. 54 is a graph showing luminance-gray level characteristics of light-emitting elements in Example.

Here, three samples (Samples A1 to A3) were fabricated and luminance-gray level characteristics of the samples were measured. FIG. 54 shows the results of the luminance-gray level characteristics of Samples A1 to A3.

Note that Sample A1 was not subjected to temperature correction and was measured at room temperature, Sample A2 was subjected to temperature correction and was measured at 60° C., and Sample A3 was not subjected to temperature correction and was measured at 60° C.

As shown in FIG. 54, the luminance of the light-emitting element in Sample A2 fabricated in this example was found to be substantially the same as the luminance of a light-emitting element in Sample A1 used as a reference.

The structure described in this example can be combined as appropriate with any of the structures described in the embodiments, the other example, and a reference example.

Reference Example

In this reference example, results of measuring temperature dependence of the monitor light-emitting element 21 and the monitor transistor 22A of the monitor circuit 20A and performing temperature correction on an actual panel using a circuit illustrated in FIG. 55 will be described.

<3-1. Temperature Correction Circuit>

Figure 55:
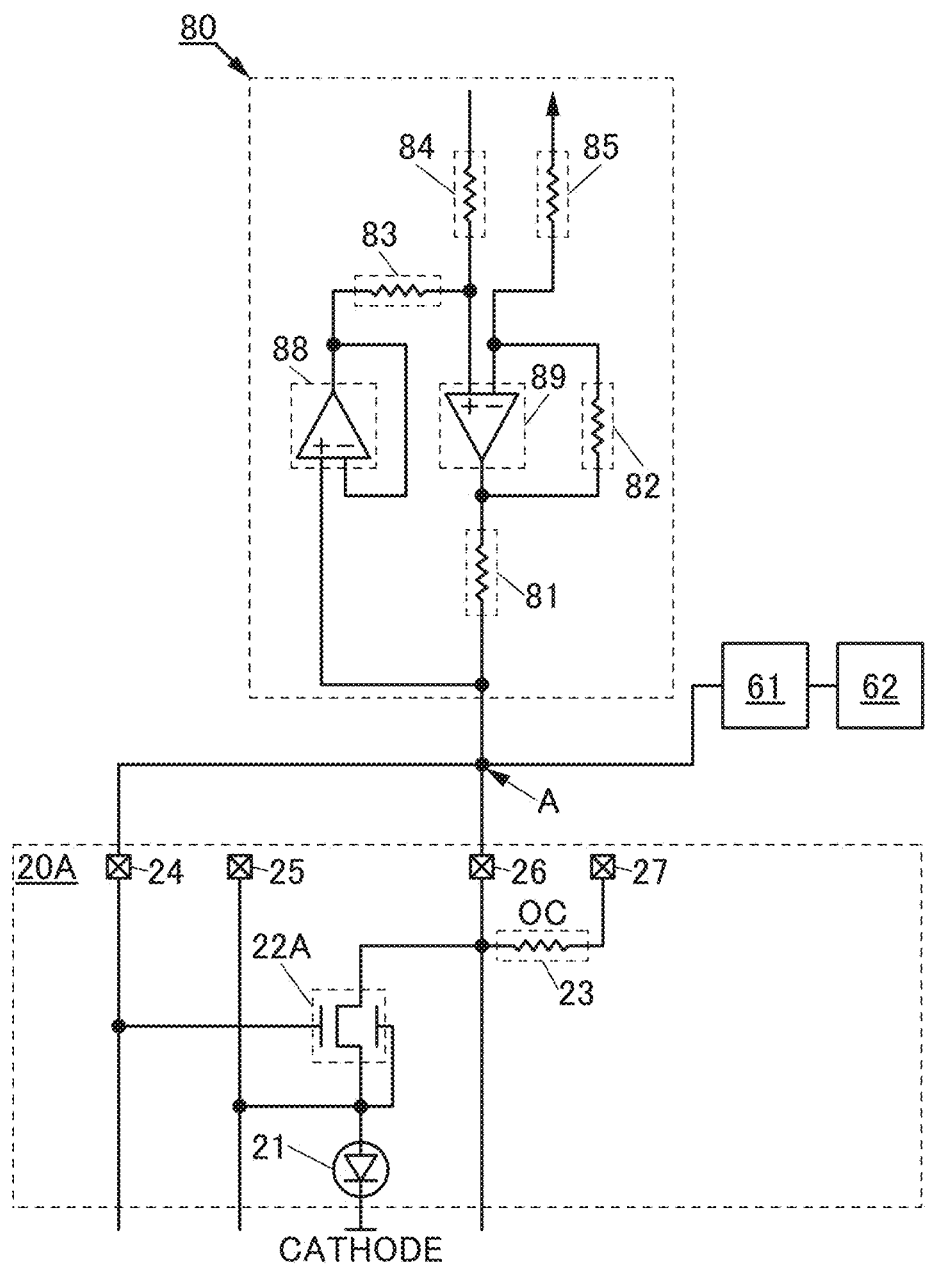
FIG. 55 illustrates a circuit diagram of a semiconductor device in Example.

FIG. 55 is a circuit diagram illustrating a configuration used in this reference example. The circuit illustrated in FIG. 55 includes the constant current circuit 80 and the monitor circuit 20A.

The constant current circuit 80 includes resistors 81 to 85 and amplifier circuits 88 and 89.

One of a pair of electrodes of the resistor 81 is electrically connected to a first input terminal of the amplifier circuit 88, and the other of the pair of electrodes of the resistor 81 is electrically connected to an output terminal of the amplifier circuit 89. One of a pair of electrodes of the resistor 82 is electrically connected to the other of the pair of electrodes of the resistor 81 and the output terminal of the amplifier circuit 89, and the other of the pair of electrodes of the resistor 82 is electrically connected to a second input terminal of the amplifier circuit 89. One of a pair of electrodes of the resistor 83 is electrically connected to an output terminal of the amplifier circuit 88, and the other of the pair of electrodes of the resistor 83 is electrically connected to a first input terminal of the amplifier circuit 89. A second input terminal of the amplifier circuit 88 is electrically connected to the output terminal of the amplifier circuit 88. The resistor 84 is electrically connected to the other of the pair of electrodes of the resistor 83 and the first input terminal of the amplifier circuit 89, and the resistor 85 is electrically connected to the other of the pair of electrodes of the resistor 82 and the second input terminal of the amplifier circuit 89.

Note that the monitor circuit 20A has the same configuration as the monitor circuit 20A described above in Embodiment 1.

The one of the pair of electrodes of the resistor 81 and the terminal 26 of the monitor circuit 20A are electrically connected to each other, and voltage generated in the constant current circuit 80 is supplied to the monitor transistor 22A and the monitor light-emitting element 21 through the terminal 26.

The converter circuit 61 is connected to the terminal 24 of the monitor circuit 20A, and the memory circuit 62 is connected to the terminal 24 through the converter circuit 61.

<3-2. Concept of Temperature Correction Circuit>

Next, voltage generated when a constant current is fed to the monitor transistor 22A and the monitor light-emitting element 21 of the circuit in FIG. 55 is described with reference to FIG. 56.

Figure 56:
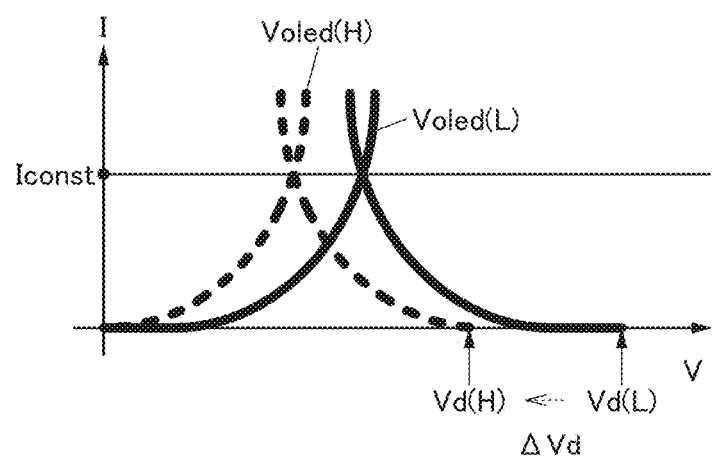
FIG. 56 shows a concept of current-voltage characteristics of a light-emitting element and a transistor.

FIG. 56 shows a concept of current-voltage (I-V) characteristics of the monitor transistor 22A and the monitor light-emitting element 21.

In FIG. 56, the vertical axis represents current (I), and the horizontal axis represents voltage (V).

Note that FIG. 56 corresponds to a conceptual diagram showing current-voltage (I-V) characteristics of a node A illustrated in FIG. 55, mainly showing characteristics of a voltage ($V_{total}$) of the node A. The voltage ($V_{total}$) of the node A is the sum of a voltage ($V_d$) generated when a constant current is supplied to the monitor transistor 22A and a voltage ($V_{oled}$) generated when a constant current is supplied to the monitor light-emitting element 21. That is, $V_{total}=V_d+V_{oled}$ is satisfied. In FIG. 56, the voltage ($V_{total}$) is measured at two different temperatures (a low temperature and a high temperature), and solid lines represent $V_d(L)$ and $V_{oled}(L)$ measured at a low temperature and dashed lines represent $V_d(H)$ and $V_{oled}(H)$ measured at a high temperature. Moreover, in FIG. 56, $I_{const}$ represents a given reference current.

As shown in FIG. 56, at a low temperature, threshold voltages of both the monitor transistor 22A and the monitor light-emitting element 21 are high and $V_{total}$ in the case of feeding $I_{const}$ is high. Moreover, as shown in FIG. 56, $V_d$ gets high at a low temperature and low at a high temperature. That is, the cathode potential of the monitor light-emitting element 21 is changed only by the amount of change ($\Delta V_d$) from $V_d(L)$ to $V_d(H)$.

<3-3. Evaluation of Temperature Dependence>

Next, Samples B1 and B2 were fabricated and temperature dependence of Samples B1 and B2 was measured. Note that Samples B1 and B2 were fabricated with the same specifications as the display device B shown above in Example 1. However, in this reference example, the measured samples were fabricated over glass substrates. Note that Sample B1 was used for comparison and was not subjected to temperature correction, whereas Sample B2 was subjected to temperature correction.

Note that in each of Samples B1 and B2, a circuit corresponding to the pixel circuit 14 illustrated in FIG. 9 in Embodiment 1 was formed. Thus, the following description is made with the reference numerals in FIG. 9.

In each of Samples B1 and B2, the threshold voltage ($V_{th}$) of the light-emitting element 572 is shifted in the negative direction and a potential supplied to the source electrode of the transistor 554 is reduced as the temperature gets higher, whereby a potential ($V_{gs}$) between the gate electrode and the drain electrode of the transistor 554 gets higher. Moreover, the threshold voltage ($V_{th}$) of the transistor 554 is shifted in the negative direction, and current flowing to the transistor 554 gets higher.

Thus, temperature dependence of $V_{total}$ of the monitor light-emitting element 21 and the monitor transistor 22A was measured using the monitor circuit 20A illustrated in FIG. 55, and feedback of the measurement results to the transistor 554 and the light-emitting element 572 was performed. For the feedback, specifically, a voltage ($V_{gs}$) supplied to the transistor 554 was corrected so as to be reduced by raising the cathode potential of the light-emitting element 572 by the reduced amount of $V_{total}$ measured using the monitor circuit 20A.

Figure 57:
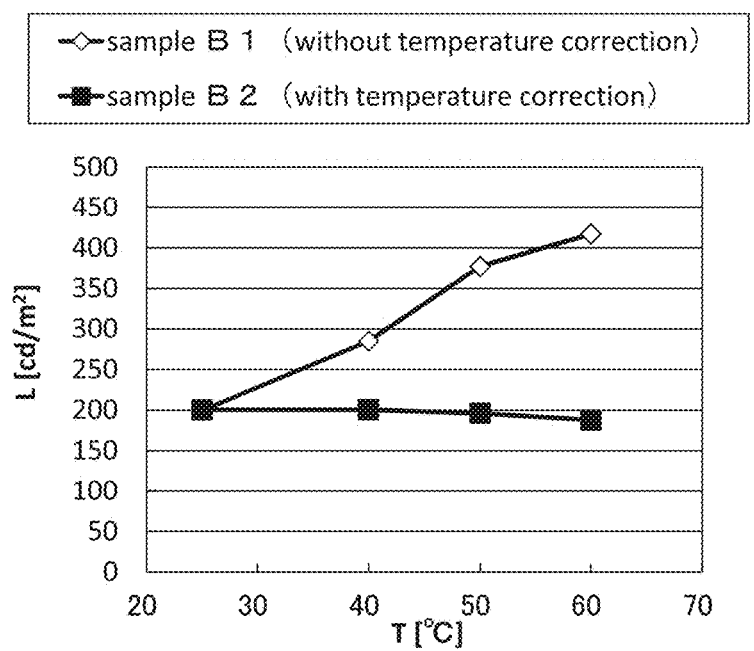
FIG. 57 shows temperature characteristics of luminance in Samples B1 and B2.

FIG. 57 shows the measurement results of Samples B1 and B2. In FIG. 57, the vertical axis represents luminance (L), and the horizontal axis represents temperature (° C.).

As shown in FIG. 57, temperature dependence of luminance was smaller in Sample B2 subjected to the temperature correction than in Sample B1 not subjected to the temperature correction.

The structure described in this reference example can be combined as appropriate with any of the structures described in the embodiments and the examples.

This application is based on Japanese Patent Application serial no. 2015-110423 filed with Japan Patent Office on May 29, 2015, the entire contents of which are hereby incorporated by reference.

What is claimed is:

1. A semiconductor device comprising:
   a pixel circuit comprising:
      a selection transistor;
      a driving transistor; and
      a light-emitting element;
   a monitor circuit comprising:
      a monitor light-emitting element; and
      a monitor transistor;
   a correction circuit comprising;
      an amplifier circuit; and
      a switching element;
   a first electrode;
   a second electrode; and
   a third electrode,
   wherein one of a pair of electrodes of the monitor light-emitting element is electrically connected to the first electrode,
   wherein the other of the pair of electrodes of the monitor light-emitting element is electrically connected to one of source and drain electrodes of the monitor transistor,
   wherein the other of the source and drain electrodes of the monitor transistor is electrically connected to a first input terminal of the amplifier circuit,
   wherein a gate electrode of the monitor transistor is electrically connected to an output terminal of the amplifier circuit,
   wherein the second electrode is electrically connected to a second input terminal of the amplifier circuit,
   wherein the third electrode is electrically connected to the other of the source and drain electrodes of the monitor transistor through the switching element,
   wherein a resistor is connected between the third electrode and the other of the source and drain electrodes of the monitor transistor,
   wherein the resistor includes an oxide conductor, and
   wherein current flowing to the light-emitting element is controlled by the correction circuit.

2. The semiconductor device according claim 1, wherein the resistor is provided outside a wiring through which the other of the source and drain electrodes of the monitor transistor and the first input terminal of the amplifier circuit are connected to each other.

3. The semiconductor device according to claim 1, wherein the selection transistor, the driving transistor, and the monitor transistor each include an oxide semiconductor in a channel region.

4. The semiconductor device according to claim 3, wherein the oxide conductor and the oxide semiconductor contain at least one common metal element.

5. The semiconductor device according to claim 3, wherein one or both of the oxide conductor and the oxide semiconductor contain In, Zn, and M (M is Ti, Ga, Y, Zr, La, Ce, Nd, Sn, or Hf).

6. The semiconductor device according to claim 3,
   wherein one or both of the oxide conductor and the oxide semiconductor include a crystal part, and
   wherein the crystal part has c-axis alignment.

7. A display device comprising:
   the semiconductor device according to claim 1; and
   a color filter.

8. A display module comprising:
   the display device according to claim 7; and
   a touch sensor.

9. An electronic device comprising:
   the semiconductor device according to claim 1; and
   an operation key or a battery.

10. A display device comprising:
    a pixel circuit comprising:
       a first transistor;
       a second transistor;
       a capacitor; and
       a first light-emitting element;
    a second light-emitting element;
    an amplifier circuit;
    a resistor;
    a third transistor; and
    a correction circuit,
    wherein each of the first transistor, the second transistor and the third transistor comprises an oxide semiconductor film comprising a channel region,
    wherein the resistor comprises an oxide conductor,
    wherein one of a source and a drain of the first transistor is electrically connected to an anode of the first light-emitting element,
    wherein one of a source and a drain of the second transistor is electrically connected to a gate of the first transistor,
    wherein the other of the source and the drain of the second transistor is electrically connected to a data line,
    wherein a first electrode of the capacitor is electrically connected to the gate of the first transistor,
    wherein a second electrode of the capacitor is electrically connected to the one of the source and the drain of the first transistor,
    wherein one of a source and a drain of the third transistor is electrically connected to an anode of the second light-emitting element,
    wherein the other of the source and the drain of the third transistor is electrically connected to the resistor,
    wherein an output terminal of the amplifier circuit is electrically connected to a gate of the third transistor,
    wherein a first input terminal of the amplifier circuit is electrically connected to the other of the source and the drain of the third transistor,
    wherein a potential is supplied to a second input terminal of the amplifier circuit, and wherein the correction circuit is configured to correct a potential to be supplied to a cathode electrode of the first light-emitting element on the basis of a potential of the gate of the third transistor.

11. The display device according to claim 10, wherein the correction circuit is configured to correct a potential of a data signal to be supplied to the data line.

* * * * *